(12) United States Patent
Takimiya et al.

(10) Patent No.: US 8,921,836 B2
(45) Date of Patent: Dec. 30, 2014

(54) POLYMER COMPOUND, AND THIN FILM AND INK COMPOSITION EACH CONTAINING SAME

(75) Inventors: Kazuo Takimiya, Higashihiroshima (JP); Itaru Osaka, Higashihiroshima (JP); Kenji Kohiro, Tsukuba (JP); Kenichiro Ohya, Tsukuba (JP); Kunihito Miyake, Tsukuba (JP)

(73) Assignees: Sumitomo Chemical Company, Limited, Tokyo (JP); National University of Corporation Hiroshima University, Hiroshima (JP)

( * ) Notice: Subject to any disclaimer, the term of this patent is extended or adjusted under 35 U.S.C. 154(b) by 268 days.

(21) Appl. No.: 13/518,671
(22) PCT Filed: Dec. 22, 2010
(86) PCT No.: PCT/JP2010/073187
§ 371 (c)(1),
(2), (4) Date: Aug. 16, 2012
(87) PCT Pub. No.: WO2011/078248
PCT Pub. Date: Jun. 30, 2011

(65) Prior Publication Data
US 2012/0305899 A1     Dec. 6, 2012

(30) Foreign Application Priority Data

Dec. 25, 2009    (JP) ................................ 2009-295362
Nov. 30, 2010    (JP) ................................ 2010-267707

(51) Int. Cl.
*H01L 35/24*     (2006.01)
*H01L 51/00*     (2006.01)
*C08G 61/12*     (2006.01)
*H01L 51/05*     (2006.01)

(52) U.S. Cl.
CPC ...... *H01L 51/0036* (2013.01); *C08G 2261/414* (2013.01); *C08G 2261/51* (2013.01); *C08G*
(Continued)

(58) Field of Classification Search
USPC ............................................ 257/40, E51.001
See application file for complete search history.

(56) References Cited

U.S. PATENT DOCUMENTS
2004/0004215 A1    1/2004   Iechi et al.
(Continued)

FOREIGN PATENT DOCUMENTS
CN    101087009 A    12/2007
(Continued)

OTHER PUBLICATIONS
First Office Action issued Aug. 19, 2013 in counterpart Chinese Patent Application No. 201080059154.8 with English translation.
(Continued)

*Primary Examiner* — Anthony Ho
(74) *Attorney, Agent, or Firm* — Sughrue Mion, PLLC

(57) ABSTRACT

An object of the present invention is to provide a polymer compound providing high charge mobility. The polymer compound of the present invention has a repeating unit represented by the formula (1):

[Chemical Formula 1]

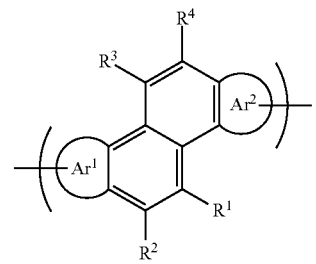

(1)

wherein $Ar^1$ and $Ar^2$ are each an aromatic hydrocarbon ring, a heterocycle, or a fused ring of an aromatic hydrocarbon ring and a heterocycle; and $R^1$, $R^2$, $R^3$ and $R^4$ each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group, a cyano group or a fluorine atom.

18 Claims, 10 Drawing Sheets

(52) U.S. Cl.
CPC .. 2261/3223 (2013.01); *Y02E 10/52* (2013.01); *H01L 51/0545* (2013.01); *Y02E 10/549* (2013.01); *C08G 61/126* (2013.01); *C08G 2261/3243* (2013.01); *H01L 51/0558* (2013.01); *C08G 2261/411* (2013.01); *H01L 51/0043* (2013.01); *H01L 51/0541* (2013.01)
USPC .................................... 257/40; 257/E51.001

(56) References Cited

U.S. PATENT DOCUMENTS

| | | |
|---|---|---|
| 2007/0287220 A1 | 12/2007 | Jeong et al. |
| 2008/0233429 A1 | 9/2008 | Oguma et al. |
| 2011/0040069 A1 | 2/2011 | Miura et al. |

FOREIGN PATENT DOCUMENTS

| | | |
|---|---|---|
| EP | 2145936 A2 | 1/2010 |
| EP | 2248840 A1 | 11/2010 |
| JP | 5-110069 A | 4/1993 |
| JP | 2004-6476 A | 1/2004 |
| JP | 2006-216814 A | 8/2006 |
| JP | 2007-217312 A | 8/2007 |
| JP | 2009-215546 A | 9/2009 |
| JP | 2009-267134 A | 11/2009 |
| JP | 2009-302463 A | 12/2009 |
| JP | 2010-177633 A | 8/2010 |
| WO | 2009/102031 A1 | 8/2009 |
| WO | 2010/058692 A1 | 5/2010 |

OTHER PUBLICATIONS

Henrik G.O. Sandberg, et al., "Insulators and Device Geometry in Polymer Feild Effect Transistors", Organic Electronics, 2005, pp. 142-146, vol. 6.
Shizuo Tokito et al., "Control of Surfaces and Interfaces in Organic Thin-Film Transistors", Surface Science, 2007, pp. 242-248, vol. 28, No. 5.
Veaceslav Coropceanu et al., "Vibronic Coupling in Organic Semiconductors: The Case of Fused Polycyclic Benzene-Thiophene Structures", Chemistry—A Eurpoean Journal, 2006, pp. 2073-2080, vol. 12.
H.S. Desai et al., "Thiophenes & Thiapyrans: Part XXV—Condensed Thiophenes & Thiapyrans from I,5-, I,4- & I,3-Dimercaptonaphthalenes", J. Sci Industr. Res., Jan. 1961, pp. 22-30, vol. 20B.
B.D. Tilak, "A New Synthesis of Thiophenes and Thiapyrans", pp. 71-77 Jan. 1951.
Uwe Thub et al., "Identification and Quantification of Thiaarenes in the Flue Gas of Lignite-Fired Domestic Heating", Journal of High Resolution Chromatography, Jul./Aug. 2000, pp. 457-473, vol. 23.
International Preliminary Report on Patentability and Written Opinion issued on Aug. 23, 2012 in International Application No. PCT/JP2010/07317.
Office Action issued by the Japanese Patent Office in counterpart Japanese Patent Application No. P2010-286622 dated Apr. 30, 2014.
International Search Report for PCT/JP2010/073187 dated Mar. 24, 2011.
International Preliminary Report on Patentability and Written Opinion issued Aug. 23, 2012 in related PCT Application No. PCT/JP2010/073181.
Office Action issued Sep. 23, 2014 in counterpart Taiwanese Patent Application No. 099145723 with English translation.

POLYMER COMPOUND, AND THIN FILM AND INK COMPOSITION EACH CONTAINING SAME

CROSS REFERENCE TO RELATED APPLICATIONS

This application is a National Stage of International Application No. PCT/JP2010/073187 filed on Dec. 22, 2010, which claims priority from Japanese Patent Application No. 2009-295362, filed on Dec. 25, 2009 and 2010-267707 filed Nov. 30, 2010, the contents of all of which are incorporated herein by reference in their entirety.

TECHNICAL FIELD

The present invention relates to a polymer compound, a thin film and an ink composition each comprising the same, an organic transistor comprising the thin film, and a planar light source and a display each comprising the organic transistor.

BACKGROUND ART

Organic transistors are preferable for applications such as electronic paper and flexible displays and have attracted attention in recent years, because they are inexpensive and have properties such as flexibility and bendability.

Organic transistors include layers composed of organic materials and having charge (meaning hole and electron; hereinafter the same) transport properties, and organic semiconductor materials are mainly used as such organic materials. Polymer compounds which can form layers (i.e., organic semiconductor layers, also generally called active layers) in the state of solutions in solvents by coating have been studied, for example, polymer compounds having only the thiophene backbone have been proposed, as such organic semiconductor materials (Non Patent Literature 1).

CITATION LIST

Patent Literature

Non Patent Literature 1: Organic Electronics 6 (2005) p. 142-146

SUMMARY OF INVENTION

Technical Problem

Properties of organic transistors mainly depend on charge mobility in organic semiconductor layers, and as the charge mobility is higher, field effect mobility of the organic transistors is higher and their properties are better. In recent years, applications of organic transistors have become more diverse, and there is a need to provide charge mobility even higher than in conventional ones. However, it tends to be difficult to sufficiently provide high mobility as needed in recent years when the above-described conventional polymer compounds are used.

Thus, the present invention has been achieved in view of such circumstances. An object of the present invention is to provide a polymer compound providing high charge mobility. Another object of the present invention is to provide a thin film and an ink composition each comprising the polymer compound, an organic transistor comprising the thin film, and a planar light source and a display each comprising the organic transistor.

Solution to Problem

To achieve the above objects, the present invention provides a polymer compound having a repeating unit represented by the formula (1):

[Chemical Formula 1]

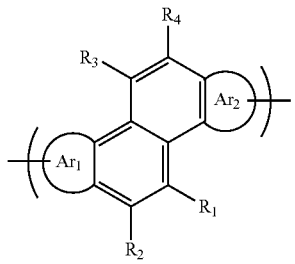

(1)

wherein $Ar^1$ and $Ar^2$ are identical or different and are each an aromatic hydrocarbon ring which may have a substituent, a heterocycle which may have a substituent, or a fused ring of an aromatic hydrocarbon ring which may have a substituent and a heterocycle which may have a substituent; and $R^1$, $R^2$, $R^3$ and $R^4$ are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

The above polymer compound of the present invention has a repeating unit represented by the formula (1), so that it can exhibit high charge mobility when applied as an organic semiconductor layer. Although the reason is not necessarily clear, this is presumably due to good conjugation properties resulting from the fact that a plurality of rings having aromaticity are fused to each other and the symmetry of the fused structure is high, and that the main chains of the polymer compound easily overlap (are easily packed) each other. Because the polymer compound of the present invention has the above specific repeating unit, the polymer compound tends to be highly soluble in solvents and forms an organic semiconductor layer in the state of a solution by coating relatively easily.

In the above polymer compound of the present invention, at least one of $Ar^1$ and $Ar^2$ in the formula (1) is preferably a five-membered heterocycle. This makes it possible to exhibit high charge mobility when the polymer compound of the present invention is used in an organic semiconductor layer. In particular, even higher charge mobility tends to be provided when both ends of the repeating unit, i.e., the moieties involved in the carbon-carbon bond between the repeating units, are heterocycles.

The repeating unit represented by the formula (1) is preferably at least one repeating unit selected from the group consisting of a repeating unit represented by the formula (2), a repeating unit represented by the formula (3) and a repeating unit represented by the formula (4). Still higher charge mobility can be provided by having each of these repeating units as the repeating unit represented by the formula (1).

[Chemical Formula 2]

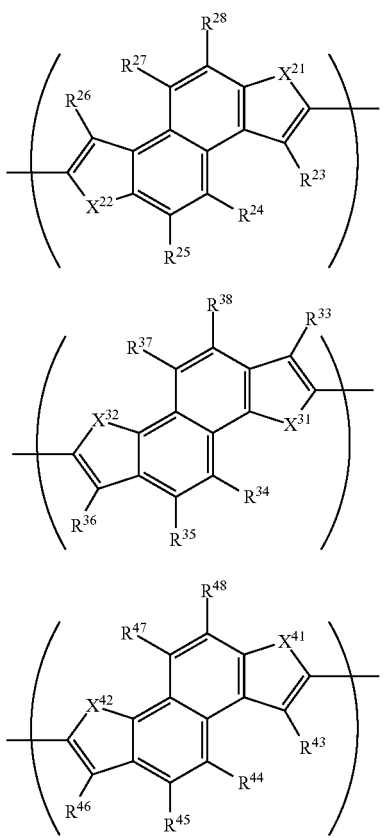

$X^{21}$ and $X^{22}$ in the formula (2), $X^{31}$ and $X^{32}$ in the formula (3) and $X^{41}$ and $X^{42}$ in the formula (4) are identical or different and each represent a chalcogen atom; and $R^{23}$, $R^{24}$, $R^{25}$, $R^{26}$, $R^{27}$ and $R^{28}$ in the formula (2), $R^{33}$, $R^{34}$, $R^{35}$, $R^{36}$, $R^{45}$, $R^{46}$, $R^{37}$ and $R^{38}$ in the formula (3) and $R^{43}$, $R^{44}$, $R^{47}$ and $R^{48}$ in the formula (4) are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

In the repeating units represented by the formulas (2) to (4), $X^{21}$ and $X^{22}$, $X^{31}$ and $X^{32}$, and $X^{41}$ and $X^{42}$ in the formula (4) are each preferably a sulfur atom, a selenium atom or an oxygen atom, more preferably a sulfur atom or an oxygen atom, particularly preferably a sulfur atom. The polymer compound having such a structure can provide higher charge mobility.

Preferably, each of the combination of $R^{23}$ and $R^{26}$, the combination of $R^{24}$ and $R^{27}$ and the combination of $R^{25}$ and $R^{28}$ in the formula (2) is a combination of the same groups, each of the combination of $R^{33}$ and $R^{36}$, the combination of $R^{34}$ and $R^{37}$ and the combination of $R^{35}$ and $R^{38}$ in the formula (3) is a combination of the same groups, and each of the combination of $R^{44}$ and $R^{47}$ and the combination of $R^{45}$ and $R^{48}$ in the formula (4) is a combination of the same groups. By making specific groups identical in this manner, the polymer compound has a more symmetrical repeating unit and allows easy packing, and therefore can provide even higher charge mobility.

More preferred structures include structures wherein $R^{23}$, $R^{24}$, $R^{25}$, $R^{26}$, $R^{27}$ and $R^{28}$ in the formula (2), $R^{33}$, $R^{34}$, $R^{35}$, $R^{36}$, $R^{37}$ and $R^{38}$ in the above formula (3) and $R^{43}$, $R^{44}$, $R^{45}$, $R^{46}$, $R^{47}$ and $R^{48}$ in the above formula (4) are hydrogen atoms. This makes it possible to provide even higher charge mobility.

Preferably, the polymer compound of the present invention further has, in addition to the repeating unit represented by the formula (1), a repeating unit represented by the formula (5). Still higher charge mobility can be provided by further having such a repeating unit.

[Chemical Formula 3]

Y represents an arylene group, a divalent heterocyclic group, a divalent group having a metal complex structure, or an ethynylene group, each of which may have a substituent. If a plurality of Ys are present, they may be identical or different.

Y in the repeating unit represented by the formula (5) is preferably a five-membered divalent heterocyclic group having 4 to 12 carbon atoms, an aromatic hydrocarbon group having 6 to 18 carbon atoms, or a polycyclic divalent heterocyclic group. This makes it possible to provide even higher charge mobility.

Because high charge mobility is provided, Y in the repeating unit represented by the formula (5) is also preferably a group represented by the formula (6):

[Chemical Formula 4]

wherein T represents a divalent heterocyclic group which may have a substituent, n represents an integer of 2 to 8, and a plurality of Ts present may be identical or different.

Because similarly high charge mobility is provided, Y in the repeating unit represented by the formula (5) is also preferably a group represented by the formula (7):

[Chemical Formula 5]

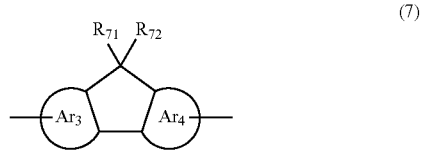

wherein $Ar^3$ and $Ar^4$ are identical or different and are each an aromatic hydrocarbon ring which may have a substituent, a heterocycle which may have a substituent, or a fused ring of an aromatic hydrocarbon ring which may have a substituent and a heterocycle which may have a substituent; and $R^{71}$ and $R^{72}$ are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

The repeating unit represented by the formula (5) preferably contains at least one aromatic group having electron accepting properties (hereinafter called "electron accepting group"). The polymer compound contains such an electron accepting group in combination with an electron donating group contained in the formula (1), and therefore can easily provide even higher charge mobility.

In this case, particularly high charge mobility tends to be provided if the difference between the lowest value among highest occupied molecular orbital energy level values that the repeating unit represented by the formula (1) has and the highest value among lowest unoccupied molecular orbital energy level values that the above electron accepting group has is 4.4 eV or less.

The present invention also provides a thin film comprising the above polymer compound of the present invention. The present invention also provides an organic transistor comprising an organic semiconductor layer composed of such a thin film. The thin film of the present invention comprises the above polymer compound of the present invention, and therefore can exhibit high charge mobility.

Accordingly, the organic transistor of the present invention comprising an organic semiconductor layer composed of such a thin film provides high field effect mobility, because charge mobility in the organic semiconductor layer is high.

The present invention also provides an ink composition comprising the polymer compound of the present invention and a solvent. Such an ink composition has the polymer compound uniformly dispersed or dissolved in the solvent, and is therefore effective for forming an organic semiconductor layer or the like by coating.

The present invention further provides a planar light source comprising the above organic transistor of the present invention and a display comprising the above organic transistor of the present invention. The planar light source and the display each comprise the organic transistor of the present invention providing high field effect mobility, and therefore can exhibit excellent properties.

The present invention also provides a photoelectric conversion device comprising an anode; a cathode; and an organic semiconductor layer provided between the anode and the cathode, the organic semiconductor layer including an electron donating compound and an electron accepting compound, at least one of the electron donating compound and the electron accepting compound being the above polymer compound of the present invention, and a solar cell module and an image sensor each comprising such a photoelectric conversion device. They also can exhibit excellent properties, because the organic semiconductor layer has high charge mobility.

Advantageous Effects of Invention

The above-described polymer compounds of the present invention having a specific structure can provide high charge mobility when used in organic semiconductor layers, and easily form such organic semiconductor layers. The present invention can provide ink compositions that comprise such polymer compounds and are beneficial for forming thin films, as well as thin films that are appropriately obtained from such ink compositions and have high charge mobility.

Also, the present invention can provide organic transistors that comprise organic semiconductor layers composed of thin films comprising the polymer compounds of the present invention and are capable of providing high field effect mobility, as well as planar light sources and displays each comprising the organic transistors and having superior properties.

Specifically, such organic transistors of the present invention are also useful for drive circuits for liquid crystal displays and electronic paper; switch circuits for curved or planar light sources for illumination; and drive circuits for segment-type display devices, dot matrix flat panel displays and the like.

Further, the polymer compounds of the present invention can also be used as materials for organic semiconductor layers of photoelectric conversion devices, and photoelectric conversion devices comprising such organic semiconductor layers are useful as solar cell modules and image sensors.

DESCRIPTION OF EMBODIMENTS

Figure 1:
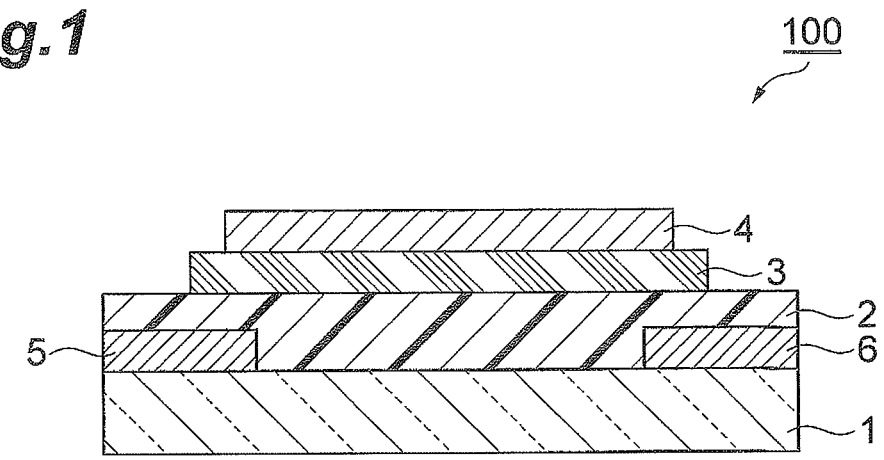
FIG. 1 is a schematic cross-sectional view of an organic transistor according to a first embodiment.

Preferred embodiments of the present invention will be described in detail below.

First, in the present specification, the "repeating unit" refers to a monomer unit forming the backbone of the polymer compound and is a structural unit, at least one of which is present in the polymer compound. The "n-valent heterocyclic group" (where n is 1 or 2) refers to a group which is prepared by eliminating n hydrogen atom(s) from a heterocyclic compound (in particular, a heterocyclic compound having aromaticity) and in which those moieties form bonds with other atoms. The "heterocyclic compound" refers to an organic compound having a cyclic structure, which contains in the ring not only carbon atoms but also a heteroatom such as an oxygen atom, a sulfur atom, a nitrogen atom, a phosphorus atom or a boron atom as ring-forming elements.

[Polymer Compound]

The polymer compound of the present invention has a repeating unit represented by the above formula (1).

In the polymer compound, at least one of $Ar^1$ and $Ar^2$ in the formula (1) is preferably a heterocycle, in particular, a five-membered heterocycle. In particular, high charge mobility is provided if the polymer compound has five-membered heterocycles in the moieties on both ends of the repeating unit represented by the formula (1), i.e., the moieties of the repeating unit represented by the formula (1) which are involved in the carbon-carbon bonds with other repeating units.

Preferably, the polymer compound of the present invention has, as the repeating unit represented by the formula (1), at least one repeating unit selected from the group consisting of repeating units represented by the above formulas (2), (3) and (4). In this case, the polymer compound may be a simple polymer having only one of the formulas (2) to (4) as a repeating unit (i.e., a homopolymer), or may be a copolymer having a combination of two or more of the formulas (2) to (4) or a combination of one of the formulas (2) to (4) and a repeating unit(s) other than them as repeating units.

Preferred groups and atoms that these formulas (2) to (4) have are as follows.

First, $X^{21}$ and $X^{22}$ in the formula (2), $X^{31}$ and $X^{32}$ in the formula (3) and $X^{41}$ and $X^{42}$ in the formula (4) are identical or different and are each a chalcogen atom.

Chalcogen atoms are elements belonging to Group 16 in the periodic table and include an oxygen atom, a sulfur atom, a selenium atom, a tellurium atom and a polonium atom. Chalcogen atoms are preferably a sulfur atom, a selenium atom, and an oxygen atom because high charge mobility is provided, and they are more preferably a sulfur atom and an oxygen atom, particularly preferably a sulfur atom taking environmental burdens into consideration.

$R^{23}$, $R^{24}$, $R^{25}$, $R^{26}$, $R^{27}$ and $R^{28}$ in the formula (2) (hereinafter similar substituents are described like "$R^{23}$ to $R^{28}$"), $R^{33}$ to $R^{38}$ in the formula (3) and $R^{43}$ to $R^{48}$ in the formula (4) are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

Among the above-described groups, the alkyl group may be linear, branched or cyclic and has preferably 1 to 36, more preferably 6 to 30, still more preferably 8 to 24, carbon atoms. Examples of the alkyl group include a methyl group, an ethyl group, a propyl group, an isopropyl group, a butyl group, an isobutyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, an undecyl group, a dodecyl group, a tetradecyl group, a hexadodecyl group, an octadodecyl group, a trifluoromethyl group, a pentafluoroethyl group, a perfluorobutyl group, a perfluorohexyl group and a perfluorooctyl group.

In particular, a methyl group, an ethyl group, a propyl group, an isopropyl group, a butyl group, an isobutyl group, a tert-butyl group, a pentyl group, an isoamyl group, a hexyl group, an octyl group, a 2-ethylhexyl group, a decyl group, a 3,7-dimethyloctyl group, an undecyl group, a dodecyl group, a tetradecyl group, a hexadodecyl group and an octadodecyl group are preferred, because the balance between solubility in organic solvents and heat resistance of the polymer compound is improved.

The alkoxy group may be linear, branched or cyclic and has preferably 1 to 36, more preferably 6 to 30, carbon atoms. Examples of the alkoxy group include a methoxy group, an ethoxy group, a propyloxy group, an isopropyloxy group, a butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, an undecyloxy group, a dodecyloxy group, a tetradecyloxy group, a hexadecyloxy group, an octadecyloxy group, a trifluoromethoxy group, a pentafluoroethoxy group, a perfluorobutoxy group, a perfluorohexyl group, a perfluorooctyl group, a methoxymethyloxy group, a 2-methoxyethyloxy group and a 2-ethoxyethyloxy group.

In particular, a hexyloxy group, an octyloxy group, a 2-ethylhexyloxy group, a decyloxy group, a 3,7-dimethyloctyloxy group, an undecyloxy group, a dodecyloxy group, a tetradecyloxy group, a hexadecyloxy group and an octadecyloxy group are preferred, because the balance between solubility in organic solvents and heat resistance of the polymer compound is improved.

The alkylthio group may be linear, branched or cyclic and has preferably 1 to 36, more preferably 6 to 30, carbon atoms. Examples of the alkylthio group include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, an undecylthio group, a dodecylthio group, a tetradecylthio group, a hexadecylthio group, an octadecylthio group and a trifluoromethylthio group.

In particular, a hexylthio group, an octylthio group, a 2-ethylhexylthio group, a decylthio group, a 3,7-dimethyloctylthio group, an undecylthio group, a dodecylthio group, a tetradecylthio group, a hexadecylthio group and an octadecylthio group are preferred, because the balance between solubility in organic solvents and heat resistance of the polymer compound is improved.

The aryl group is an atomic group in which one hydrogen atom is eliminated from an aromatic hydrocarbon, and examples thereof include those having a fused ring, and those in which two or more independent benzene rings or fused rings are bonded to each other directly or through a vinylene group or the like. The aryl group has preferably 6 to 60, more preferably 6 to 48, still more preferably 6 to 20, particularly preferably 6 to 10, carbon atoms. This number of carbon atoms does not include the number of carbon atoms in the substituent(s).

Examples of the aryl group include a phenyl group, a 1-naphthyl group, a 2-naphthyl group, a 1-anthracenyl group, a 2-anthracenyl group, a 9-anthracenyl group, a 1-tetracenyl group, a 2-tetracenyl group, a 5-tetracenyl group, a 1-pyrenyl group, a 2-pyrenyl group, a 4-pyrenyl group, a 2-perylenyl group, a 3-perylenyl group, a 2-fluorenyl group, a 3-fluorenyl group, a 4-fluorenyl group, a 1-biphenylenyl group, a 2-biphenylenyl group, a 2-phenanthrenyl group, a 9-phenanthrenyl group, a 6-chrysenyl group, a 1-coronenyl group, a 2-phenylphenyl group, a 3-phenylphenyl group, a 4-phenylphenyl group, a 4-(anthran-9-yl)phenyl group, a [1,1']binaphthalen-4-yl group, a 10-phenylanthracen-9-yl group and a [9,9']bianthracen-10-yl group. Hydrogen atoms in these groups may be further replaced with an alkyl group, an alkoxy group, an alkyloxycarbonyl group, an acyl group, a N,N-dialkylamino group, a N,N-diarylamino group, a cyano group, a nitro group, a chlorine atom, a fluorine atom or the like.

The aryloxy group has preferably 6 to 60, more preferably 7 to 48, carbon atoms. Examples of the aryloxy group include a phenoxy group, a $C_1$-$C_{18}$ alkoxyphenoxy group ("$C_1$-$C_{18}$ alkoxy" means that the alkoxy moiety has 1 to 18 carbon atoms; hereinafter the same), a $C_1$-$C_{18}$ alkylphenoxy group ("$C_1$-$C_{18}$ alkyl" means that the alkyl moiety has 1 to 18 carbon atoms; hereinafter the same), a 1-naphthyloxy group, a 2-naphthyloxy group and a pentafluorophenyloxy group. In particular, a $C_1$-$C_{18}$ alkoxyphenoxy group and a $C_1$-$C_{18}$ alkylphenoxy group are preferred, because the balance between solubility in organic solvents and heat resistance of the polymer compound is improved.

Specific examples of the $C_1$-$C_{18}$ alkoxyphenoxy group include a methoxyphenoxy group, an ethoxyphenoxy group, a propyloxyphenoxy group, an isopropyloxyphenoxy group, a butoxyphenoxy group, an isobutoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, an undecyloxyphenoxy group, a dodecyloxyphenoxy group, a tetradecyloxyphenoxy group, a hexadecyloxyphenoxy group and an octadecyloxyphenoxy group.

Specific examples of the $C_1$-$C_{18}$ alkylphenoxy group include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, an undecylphenoxy group, a dodecylphenoxy group, a tetradecylphenoxy group, a hexadecylphenoxy group and an octadecylphenoxy group.

The arylthio group has preferably 3 to 60 carbon atoms. Specific examples of the arylthio group include a phenylthio group, a $C_1$-$C_{18}$ alkoxyphenylthio group, a $C_1$-$C_{18}$ alkylphenylthio group, a 1-naphthylthio group, a 2-naphthylthio group and a pentafluorophenylthio group. In particular, a $C_1$-$C_{18}$ alkoxyphenylthio group and a $C_1$-$C_{18}$ alkylphenylthio group are preferred, because the balance between solubility in organic solvents and heat resistance of the polymer compound is improved.

The arylalkyl group has preferably 7 to 60, more preferably 7 to 48, carbon atoms. Examples of the arylalkyl group include a phenyl-$C_1$-$C_{18}$ alkyl group, a $C_1$-$C_{18}$ alkoxyphenyl-$C_1$-$C_{18}$ alkyl group, a $C_1$-$C_{18}$ alkylphenyl-$C_1$-$C_{18}$ alkyl group, a 1-naphthyl-$C_1$-$C_{18}$ alkyl group and a 2-naphthyl-$C_1$-$C_{18}$ alkyl group. In particular, a $C_1$-$C_{18}$ alkoxyphenyl-$C_1$-$C_{18}$ alkyl group and a $C_1$-$C_{18}$ alkylphenyl-$C_1$-$C_{18}$ alkyl group are preferred, because the balance between solubility in organic solvents and heat resistance of the polymer compound is improved.

The arylalkoxy group has preferably 7 to 60, more preferably 7 to 48, carbon atoms. Examples of the arylalkoxy group include phenyl-$C_1$-$C_{18}$ alkoxy groups such as a phenylmethoxy group, a phenylethoxy group, a phenylbutoxy group, a phenylpentyloxy group, a phenylhexyloxy group, a phenylheptyloxy group and a phenyloctyloxy group; $C_1$-$C_{18}$ alkoxyphenyl-$C_1$-$C_{18}$ alkoxy group, a $C_1$-$C_{18}$ alkylphenyl-$C_1$-$C_{18}$ alkoxy group, a 1-naphthyl-$C_1$-$C_{18}$ alkoxy group and a 2-naphthyl-$C_1$-$C_{18}$ alkoxy group. In particular, a $C_1$-$C_{18}$ alkoxyphenyl-$C_1$-$C_{18}$ alkoxy group and a $C_1$-$C_{18}$ alkylphenyl-$C_1$-$C_{18}$ alkoxy group are preferred, because the balance between solubility in organic solvents and heat resistance of the polymer compound is improved.

The arylalkylthio group has preferably 7 to 60, more preferably 7 to 48, carbon atoms. Examples of the arylalkylthio group include a phenyl-$C_1$-$C_{18}$ alkylthio group, a $C_1$-$C_{18}$ alkoxyphenyl-$C_1$-$C_{18}$ alkylthio group, a $C_1$-$C_{18}$ alkylphenyl-$C_1$-$C_{18}$ alkylthio group, a 1-naphthyl-$C_1$-$C_{18}$ alkylthio group and a 2-naphthyl-$C_1$-$C_{18}$ alkylthio group. In particular, a $C_1$-$C_{18}$ alkoxyphenyl-$C_1$-$C_{18}$ alkylthio group and a $C_1$-$C_{18}$ alkylphenyl-$C_1$-$C_{18}$ alkylthio group are preferred, because the balance between solubility in organic solvents and heat resistance of the polymer compound is improved.

Examples of the substituted silyl group include silyl groups each substituted with one, two or three groups selected from alkyl, aryl, arylalkyl and monovalent heterocyclic groups. The substituted silyl group has preferably 1 to 60, more preferably 3 to 48, carbon atoms. The alkyl, aryl, arylalkyl and monovalent heterocyclic group may have a substituent.

Examples of the substituted silyl group include a trimethylsilyl group, a triethylsilyl group, a tripropylsilyl group, a triisopropylsilyl group, a dimethylisopropylsilyl group, a diethylisopropylsilyl group, a tert-butylsilyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyldimethylsilyl group, an undecyldimethylsilyl group, a dodecyldimethylsilyl group, a tetradecyldimethylsilyl group, a hexadecyldimethylsilyl group, an octadecyldimethylsilyl group, a phenyl-$C_1$-$C_{18}$ alkylsilyl group, a $C_1$-$C_{18}$ alkoxyphenyl-$C_1$-$C_{18}$ alkylsilyl group, a $C_1$-$C_{18}$ alkylphenyl-$C_1$-$C_{18}$ alkylsilyl group, a 1-naphthyl-$C_1$-$C_{18}$ alkylsilyl group, a 2-naphthyl-$C_1$-$C_{18}$ alkylsilyl group, a phenyl-$C_1$-$C_{18}$ alkyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

The substituted carboxyl group includes a carboxyl group substituted with an alkyl, aryl, arylalkyl or monovalent heterocyclic group and has preferably 2 to 60, more preferably 2 to 48, carbon atoms. Examples of the substituted carboxyl group include a methoxycarbonyl group, an ethoxycarbonyl group, a propoxycarbonyl group, an isopropoxycarbonyl group, a butoxycarbonyl group, an isobutoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, an undecyloxycarbonyl group, a dodecyloxycarbonyl group, a tetradecyloxycarbonyl group, a hexadecyloxycarbonyl group, an octadecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group and a pyridyloxycarbonyl group. The alkyl, aryl, arylalkyl and monovalent heterocyclic group may have a substituent. The number of carbon atoms in the substituted carboxyl group does not include the number of carbon atoms in the substituent(s).

The monovalent heterocyclic group has preferably 4 to 60, more preferably 4 to 20, carbon atoms. The number of carbon atoms in the monovalent heterocyclic group does not include the number of carbon atoms in the substituent(s). Examples of the monovalent heterocyclic group include a thienyl group, a pyrrolyl group, a furyl group, a pyridyl group, a piperidyl group, a quinolyl group, an isoquinolyl group, a pyrimidyl group and a triazinyl group. In particular, a thienyl group, a pyridyl group, a quinolyl group, an isoquinolyl group, a pyrimidyl group and a triazinyl group are preferred, and a thienyl group, a pyridyl group, a pyrimidyl group and a triazinyl group are more preferred. The monovalent heterocyclic group may have a substituent such as an alkyl group or an alkoxy group.

Fused structures in the formulas (1) to (4) preferably have substituents so that each repeating unit has a structure line-symmetric with respect to any one axis or point-symmetric with respect to the center of gravity, because this improves packing of the main chains in the polymer compound and provides higher charge mobility.

From this viewpoint, preferably, each of the combination of $R^{23}$ and $R^{26}$, the combination of $R^{24}$ and $R^{27}$ and the combination of $R^{25}$ and $R^{28}$ in the formula (2) is a combination of the same groups, each of the combination of $R^{33}$ and $R^{36}$, the combination of $R^{34}$ and $R^{37}$ and the combination of $R^{35}$ and $R^{38}$ in the formula (3) is a combination of the same groups, and each of the combination of $R^{44}$ and $R^{47}$ and the combination of $R^{45}$ and $R^{48}$ in the formula (4) is a combination of the same groups. Here, the "combination of the same groups" refers to a combination of the same type of groups such as a combination of alkyl groups or a combination of alkoxy groups. Further, combinations of the same groups are preferred if the structures of substituents such as chain length and branching are identical, because packing in the polymer compound is improved.

Further, preferably all of $R^{23}$ to $R^{28}$ in the formula (2), $R^{33}$ to $R^{38}$ in the formula (3) and $R^{43}$ to $R^{48}$ in the formula (4) are hydrogen atoms, because packing of the main chains in the polymer compound is further improved and thus planarity in the main chains is improved.

From these viewpoints, the repeating units represented by the formulas (2), (3) and (4) are preferably repeating units represented by the formulas (2a), (3a) and (4a), respectively. $X^{21}$, $X^{22}$, $X^{31}$, $X^{32}$, $X^{41}$ and $X^{42}$ in the formulas (1a), (2a) and (4a) have the same meanings as in the groups represented by the same symbols in the above formulas (2), (3) and (4).

[Chemical Formula 6]

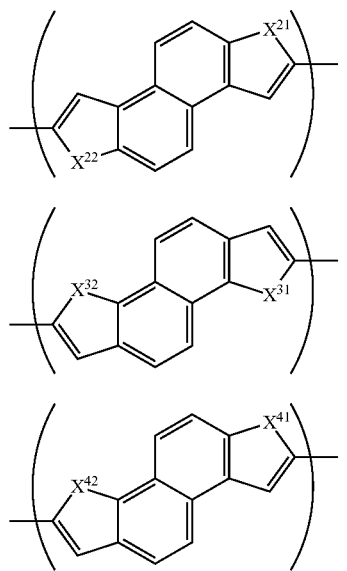

(2a)

(3a)

(4a)

When the polymer compound is a copolymer, preferred repeating units combined with the repeating unit represented by the formula (1) (preferably at least one repeating unit among the formulas (2) to (4)) include a repeating unit represented by the formula (5). Higher charge mobility tends to be easily provided by further having such a repeating unit.

[Chemical Formula 7]

(5)

In the formula (5), Y represents an arylene group, a divalent heterocyclic group, a divalent group having a metal complex structure, or an ethynylene group (a group represented by —C≡C—), each of which may have a substituent.

Y is preferably a group selected so that a π-conjugated system is formed in which multiple bonds and single bonds are alternately repeated in series by bonds between carbon atoms or bonds between carbon and heteroatoms in the backbone that is the main chain of the polymer compound when the repeating unit represented by the formula (5) (a constituent chain composed of a plurality of Y if a plurality of such repeating units are present) forms a copolymer with the repeating unit represented by the formula (1). Examples of such a π-conjugated system include structures indicated within the dotted line in the following illustrated formula (E1).

[Chemical Formula 8]

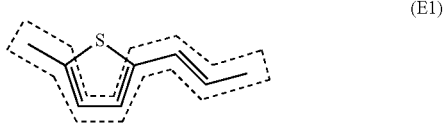

(E1)

Among groups represented by Y, the arylene group is an atomic group prepared by eliminating two hydrogen atoms from an aromatic hydrocarbon, and includes one having an independent benzene ring or fused ring. The arylene group has preferably 6 to 60, more preferably 6 to 48, still more preferably 6 to 30, particularly preferably 6 to 18, carbon atoms.

Examples of the arylene group include unsubstituted or substituted phenylene groups such as a 1,4-phenylene group, a 1,3-phenylene group and a 1,2-phenylene group; unsubstituted or substituted naphthalenediyl groups such as a 1,4-naphthalenediyl group, a 1,5-naphthalenediyl group and a 2,6-naphthalenediyl group; unsubstituted or substituted anthracenediyl groups such as a 1,4-anthracenediyl group, a 1,5-anthracenediyl group, a 2,6-anthracenediyl group and a 9,10-anthracenediyl group; unsubstituted or substituted phenanthrenediyl groups such as a 2,7-phenanthrenediyl group; unsubstituted or substituted naphthacenediyl groups such as a 1,7-naphthacenediyl group, a 2,8-naphthacenediyl group and a 5,12-naphthacenediyl group; unsubstituted or substituted fluorenediyl groups such as a 2,7-fluorenediyl group and a 3,6-fluorenediyl group; unsubstituted or substituted pyrenediyl groups such as a 1,6-pyrenediyl group, a 1,8-pyrenediyl group, a 2,7-pyrenediyl group and a 4,9-pyrenediyl group; and unsubstituted or substituted perylenediyl groups such as a 3,9-perylenediyl group and a 3,10-perylenediyl group.

Among the above-described arylene groups, unsubstituted or substituted phenylene groups and unsubstituted or substituted fluorenediyl groups are preferred, unsubstituted or substituted fluorenediyl groups are more preferred, and substituted fluorenediyl groups are particularly preferred. As the arylene group is more preferred, higher charge mobility is provided.

Examples of such an arylene group include groups represented by the formulas (9a) to (9f).

[Chemical Formula 9]

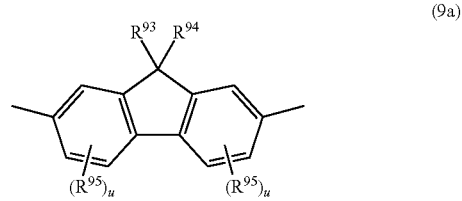

(9a)

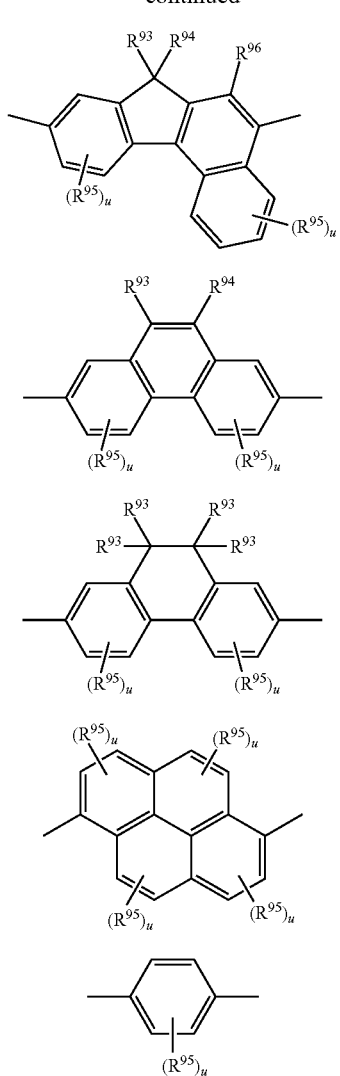

In the formulas (9a) to (9f), $R^{93}$, $R^{94}$ and $R^{96}$ are identical or different and are each a hydrogen atom, a halogen atom or a monovalent group, and $R^{95}$ is a halogen atom or a monovalent group. u is an integer of 0 or more. Examples of the monovalent group include the same monovalent groups as illustrated for $R^{23}$ to $R^{28}$ in the formula (2). When a plurality of $R^{93}$s, $R^{94}$s or $R^{95}$s are contained in each of the structures represented by the above formulas, the groups represented by the same symbol may be identical or different. When two of $R^{93}$, $R^{94}$, $R^{95}$ and $R^{96}$, or the groups represented by the same symbol, are bonded to the same carbon atom or adjacent carbon atoms, the groups in this relationship may be partially bonded to each other to form a ring. The ring formed in this case may be a single ring or a fused ring, and may be a hydrocarbon ring or a heterocycle. These rings may have a substituent. The formed ring is preferably a monocyclic hydrocarbon ring, or a monocyclic heterocycle containing an oxygen atom or a sulfur atom as a heteroatom.

The divalent heterocyclic group has usually 4 to 60, preferably 4 to 48, more preferably 4 to 30, still more preferably 4 to 22, particularly preferably 4 to 12, especially preferably 4, carbon atoms. This number of carbon atoms does not include the number of carbon atoms in the substituent(s).

Examples of the divalent heterocyclic group include unsubstituted or substituted thiophenediyl groups such as a 2,5-thiophenediyl group; unsubstituted or substituted furandiyl groups such as a 2,5-furandiyl group; unsubstituted or substituted pyridinediyl groups such as a 2,5-pyridinediyl group and a 2,6-pyridinediyl group; unsubstituted or substituted quinolinediyl groups such as a 2,6-quinolinediyl group; unsubstituted or substituted isoquinolinediyl groups such as a 1,4-isoquinolinediyl group and a 1,5-isoquinolinediyl group; unsubstituted or substituted quinoxalinediyl groups such as a 5,8-quinoxalinediyl group; unsubstituted or substituted benzo[1,2,5]thiadiazolediyl groups such as a 4,7-benzo[1,2,5]thiadiazolediyl group; unsubstituted or substituted benzothiazolediyl groups such as a 4,7-benzothiazolediyl group; unsubstituted or substituted carbazolediyl groups such as a 2,7-carbazolediyl group and a 3,6-carbazolediyl group; unsubstituted or substituted phenoxazinediyl groups such as a 3,7-phenoxazinediyl group; unsubstituted or substituted phenothiazinediyl groups such as a 3,7-phenothiazinediyl group; and unsubstituted or substituted dibenzosilolediyl groups such as a 2,7-dibenzosilolediyl group.

In particular, the divalent heterocyclic groups are preferably unsubstituted or substituted thiophenediyl groups such as a 2,5-thiophenediyl group; unsubstituted or substituted furandiyl groups such as a 2,5-furandiyl group; unsubstituted or substituted pyridinediyl groups such as a 2,5-pyridinediyl group and a 2,6-pyridinediyl group; unsubstituted or substituted quinolinediyl groups such as a 2,6-quinolinediyl group; and a 1,4-isoquinolinediyl group, more preferably unsubstituted or substituted thiophenediyl groups such as a 2,5-thiophenediyl group.

Examples of such a divalent heterocyclic group include groups represented by the formulas (11a) to (11p).

[Chemical Formula 10]

(11a)

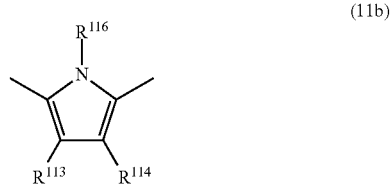
(11b)

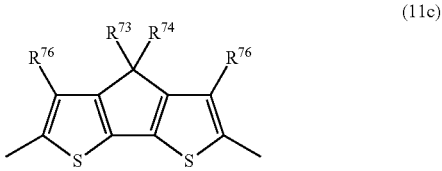
(11c)

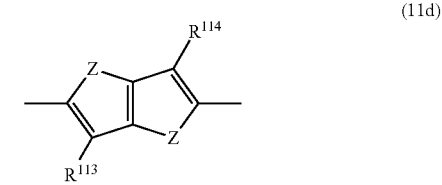
(11d)

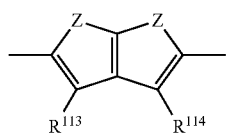 (11e)

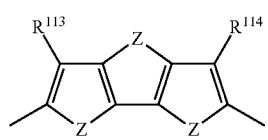 (11f)

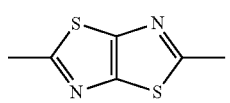 (11g)

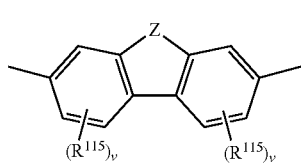 (11h)

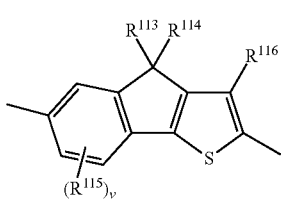 (11i)

[Chemical Formula 11]

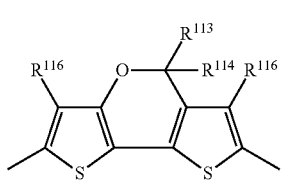 (11j)

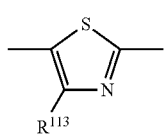 (11k)

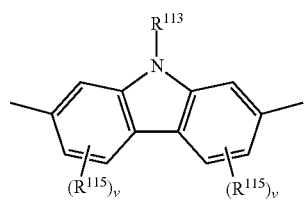 (11l)

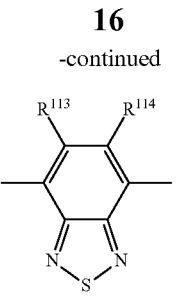 (11m)

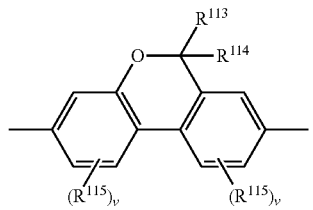 (11n)

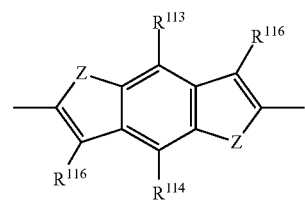 (11o)

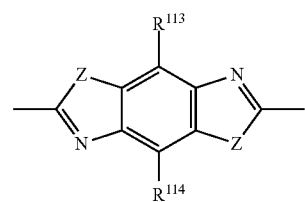 (11p)

In the formulas (11a) to (11p), $R^{115}$, $R^{116}$, $R^{117}$, $R^{118}$ and v have the same meanings as in $R^{93}$, $R^{94}$, $R^{95}$, $R^{96}$ and u in the above formulas (9a) to (9f), respectively. Z is a heteroatom such as an oxygen atom, a sulfur atom, a nitrogen atom, a phosphorus atom, a boron atom or a silicon atom.

The divalent group having a metal complex structure is a group composed of a remaining atomic group prepared by eliminating two hydrogen atoms from an organic ligand of a metal complex having the organic ligand and a central metal. Examples of the metal complex include metal complexes known as low-molecular-weight fluorescent materials or phosphorescent materials, and triplet luminescent complexes. Examples of the central metal of the metal complex include aluminum, zinc, beryllium, iridium, platinum, gold, europium and terbium.

The organic ligand has preferably 4 to 60 carbon atoms. Examples of the organic ligand include 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, and porphyrin and derivatives thereof.

Examples of the divalent group having such a metal complex structure include groups represented by the formulas (100) to (106).

[Chemical Formula 12]
(100)
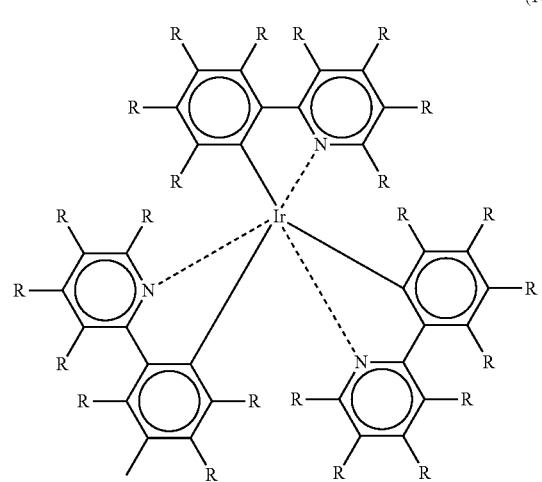
(101)
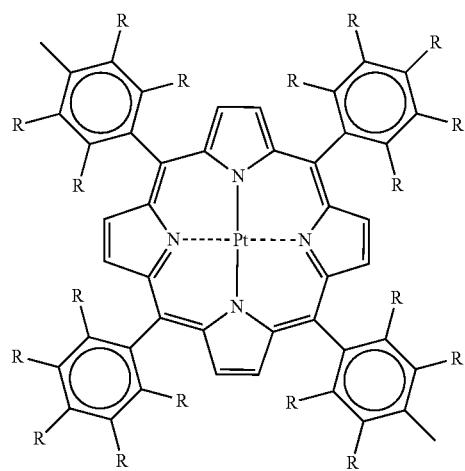
(102)
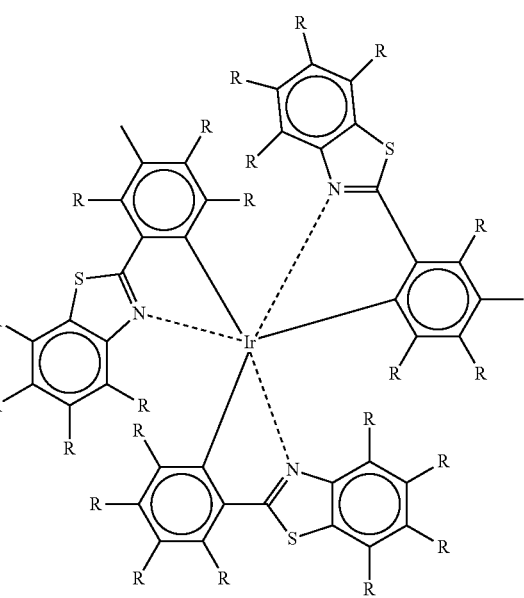
(103)
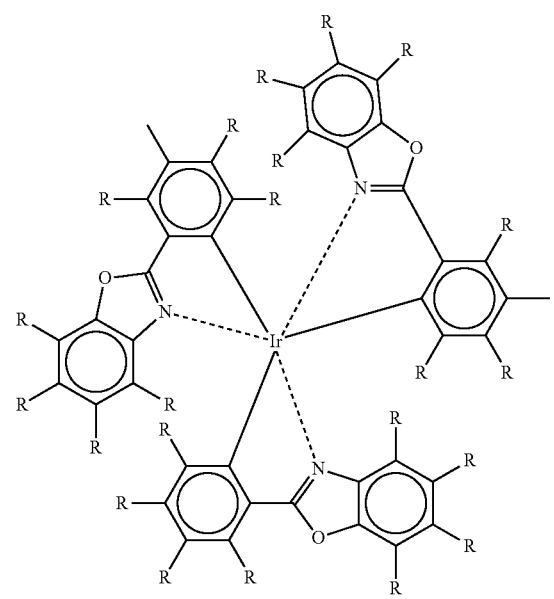
[Chemical Formula 13]
(104)
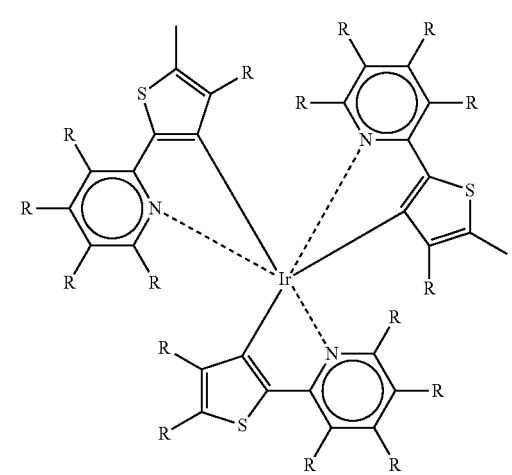
(105)
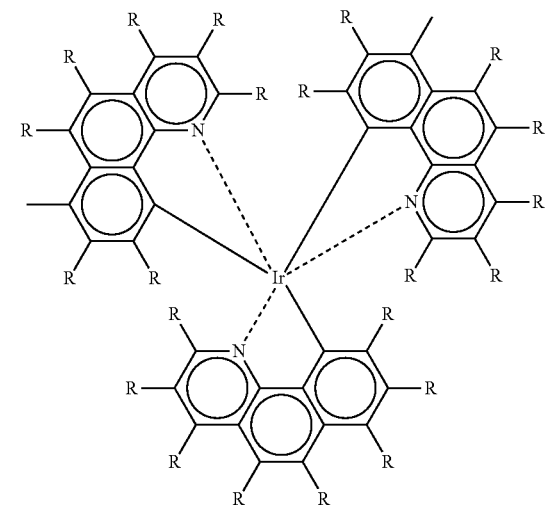

-continued (106)

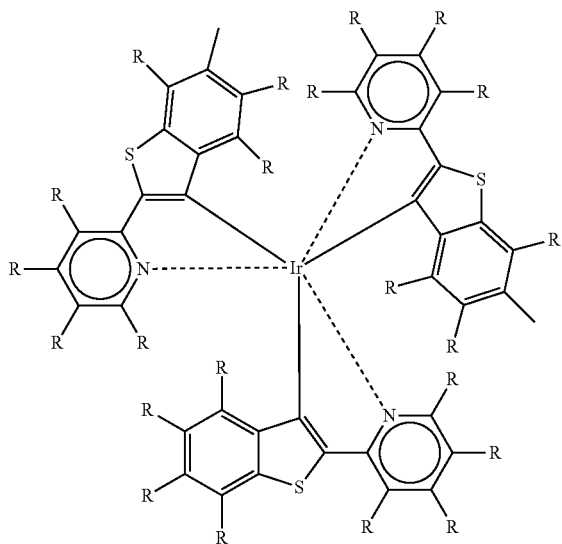

R in the formulas (100) to (106) represents a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, an unsubstituted or substituted carboxyl group, or a cyano group. Carbon atoms that these groups have may be replaced with nitrogen, oxygen or sulfur atoms, and hydrogen atoms may be replaced with fluorine atoms. A plurality of Rs present may be identical or different.

In particular, Y in the repeating unit represented by the formula (5) is especially preferably a group represented by the formula (6). The polymer compound can exhibit higher charge mobility by having such a repeating unit.

[Chemical Formula 14]

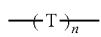
(6)

In the formula, T represents a divalent heterocyclic group which may have a substituent, n represents an integer of 2 to 8, and a plurality of Ts present may be identical or different.

The repeating unit represented by the formula (6) is still more preferably a repeating unit represented by the formula (6a). The polymer compound can exhibit still higher charge mobility by having such a repeating unit.

[Chemical Formula 15]

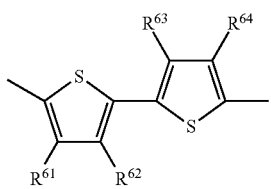
(6a)

In the formula, $R^{61}$, $R^{62}$, $R^{63}$ and $R^{64}$ are identical or different and each represent a hydrogen atom, an alkyl group, an alkoxy group, an alkylthio group, an aryl group, an aryloxy group, an arylalkyl group, an arylalkoxy group, a substituted silyl group, an unsubstituted or substituted carboxyl group, a monovalent heterocyclic group, a cyano group or a fluorine atom.

In the formula (6a), the groups represented by $R^{61}$ to $R^{64}$ are the same as the above-described groups represented by $R^{23}$ to $R^{28}$, but are preferably alkyl groups.

Because solubility of the polymer compound is improved, Y in the formula (5) is also preferably a group represented by the formula (7):

[Chemical Formula 16]

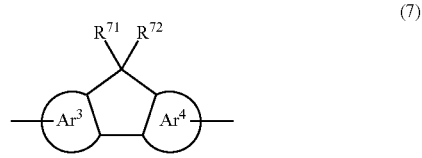
(7)

wherein $Ar^3$ and $Ar^4$ are identical or different and are each an aromatic hydrocarbon ring which may have a substituent, a heterocycle which may have a substituent, or a fused ring of an aromatic hydrocarbon ring which may have a substituent and a heterocycle which may have a substituent; and $R^{71}$ and $R^{72}$ are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

The group represented by the formula (7) is still more preferably a group represented by the formula (7a):

[Chemical Formula 17]

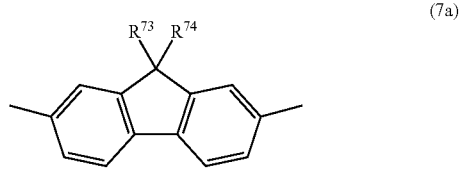
(7a)

wherein $R^{73}$ and $R^{74}$ are identical or different and each represent a hydrogen atom, an alkyl group, an alkoxy group, an alkylthio group, an aryl group, an aryloxy group, an arylalkyl group, an arylalkoxy group, a substituted silyl group, an unsubstituted or substituted carboxyl group, a monovalent heterocyclic group, a cyano group or a fluorine atom.

In the formulas (7) and (7a), the groups represented by $R^{71}$ to $R^{74}$ are the same as the above-described groups represented by $R^{23}$ to $R^{28}$. $Ar^3$ and $Ar^4$ are each preferably a benzene ring which may have a substituent.

The polymer compound may have a plurality of repeating units represented by the formula (5), wherein the groups represented by Y are different from each other. For example, the polymer compound may have an unsubstituted or substituted bithiophenediyl group (a group represented by the formula (6)) and a group represented by the formula (7) in combination as repeating units represented by the formula (5), because both high charge mobility and high solubility are provided.

As described above, the polymer compound of the present invention has a repeating unit represented by the formula (1) (preferably formulas (2) to (4)). The copolymer has a repeating unit represented by the formula (5) as a repeating unit combined with the repeating unit represented by the formula (1) if preferred.

Because charge mobility is improved, it is preferable that the repeating unit represented by the formula (5) contain at least one electron accepting group, and it is more preferable that at least one Y be an electron accepting group. Here, electron accepting properties in a predetermined group are estimated by lowest unoccupied molecular orbital (LUMO), and the LUMO energy level value is calculated by quantum chemical calculation Gaussian. In the present specification, the term "electron accepting" refers to a case where LUMO is −1.4 eV or less as calculated using density functional theory as the calculation method with B3LYP as the density functional, 3-21G* as the basis function and Gaussian 09 Rev.A02 as the program.

In the polymer compound, the difference between the highest occupied molecular orbital (HOMO) energy level value of the repeating unit represented by the formula (1), which is calculated by quantum chemical calculation Gaussian, and the LUMO energy level value of the electron accepting group in the formula (5) is preferably 4.4 eV or less. When the polymer compound contains a plurality of repeating units represented by the formula (1) and a plurality of electron accepting groups, the lowest value among HOMO energy level values calculated above and the highest value among LUMO energy level values is preferably 4.4 eV or less.

Examples of such an electron accepting group include groups represented by the formulas (12a) to (12j). In the formulas (12a) to (12j), $R^{123}$, $R^{124}$ and $R^{126}$ have the same meanings as in $R^{93}$, $R^{94}$ and $R^{96}$ in the above formulas (9a) to (9f), respectively.

[Chemical Formula 18]

(12a)

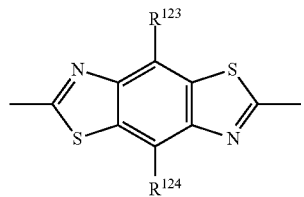

(12b)

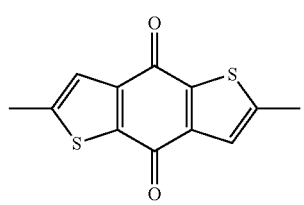

(12c)

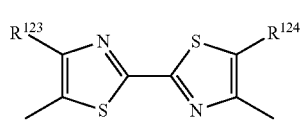

-continued (12d)

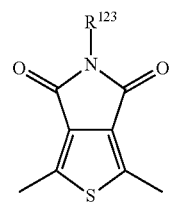

(12e)

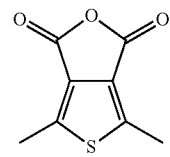

(12f)

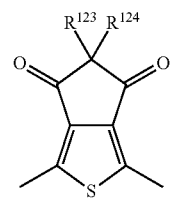

(12g)

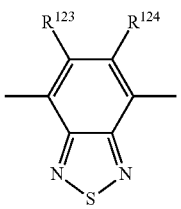

(12h)

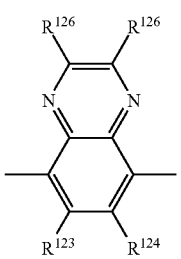

(12i)

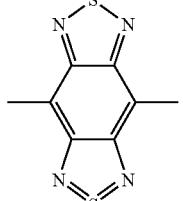

(12j)

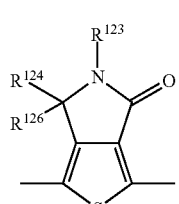

In particular, at least one Y in the repeating unit represented by the formula (5) is preferably an electron accepting group represented by the formula (8), because mobility is improved.

[Chemical Formula 19]

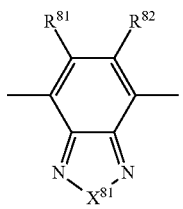

(8)

In the formula (8), $X^{81}$ represents a chalcogen atom, $-N(R^{83})-$ or $-CR^{84}=CR^{85}-$. $R^{81}$ and $R^{82}$ are identical or different and each represent a hydrogen atom or a substituent. $R^{81}$ and $R^{82}$ are each preferably a group having 1 to 30 carbon atoms when they are substituents. Examples of such a substituent include alkyl groups such as a methyl group, an ethyl group, a butyl group, a hexyl group, an octyl group and a dodecyl group, alkoxy groups such as a methoxy group, an ethoxy group, a butoxy group, a hexyloxy group, an octyloxy group and a dodecyloxy group, and aryl groups such as phenyl and naphthyl.

$R^{81}$ and $R^{82}$ may be linked to each other to form a cyclic structure. Examples of the repeating unit represented by the formula (8) in which $R^{81}$ and $R^{82}$ are linked to each other to form a cyclic structure include the following repeating units.

[Chemical Formula 20]

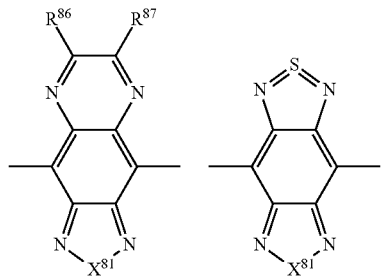

In the formulas, $R^{86}$ and $R^{87}$ are identical or different and each represent a hydrogen atom or a substituent. Substituents represented by $R^{86}$ and $R^{87}$ include the same groups as the above-described substituents represented by $R^{81}$ and $R^{82}$. $X^{81}$ is preferably a sulfur atom.

The repeating unit represented by the formula (8) is particularly preferably a repeating unit represented by the formula (8a). In this case, the LUMO energy level value calculated by the above quantum chemical calculation Gaussian in such a repeating unit is −2.32 eV.

[Chemical Formula 21]

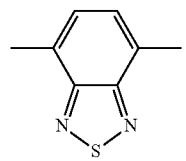

(8a)

Examples of preferred polymer compounds are represented by structural formulas below. n in the formulas (130) to (175) represents the number of repeating units (degree of polymerization) and is preferably 4 to 3000, more preferably 6 to 850. The later-described polymer compounds P1, P2, P3 and P9 where n=4 to 3000 (preferably 6 to 850) are also preferred polymer compounds.

[Chemical Formula 22]

(130)

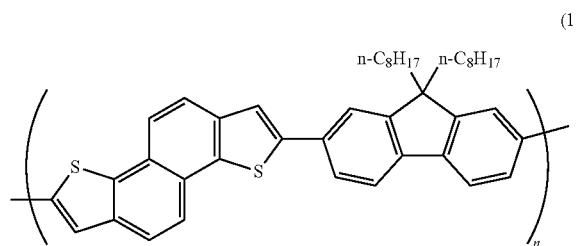

(131)

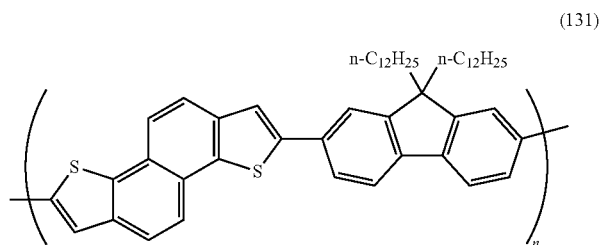

(132)

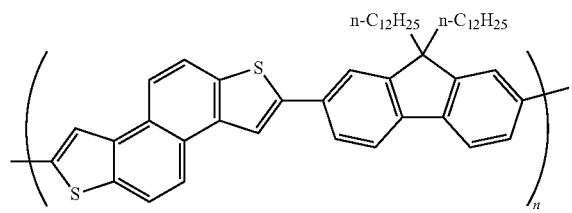

(133)

-continued
(134) 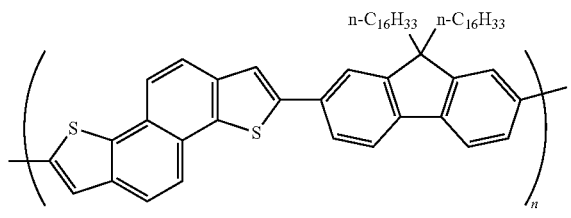
(135) 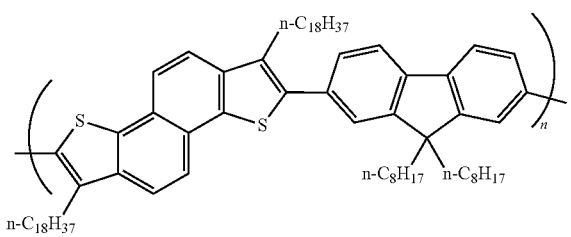
[Chemical Formula 23]
(136) 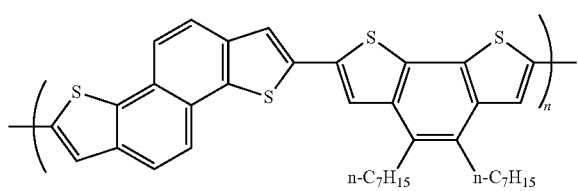
(137) 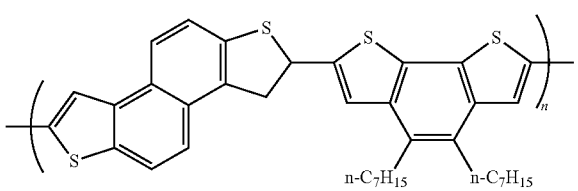
(138) 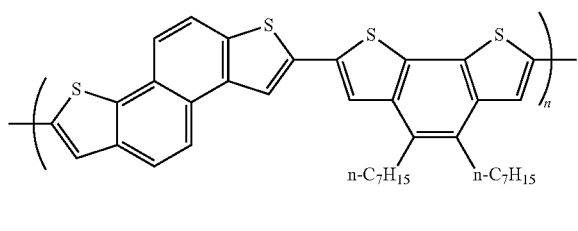
(139) 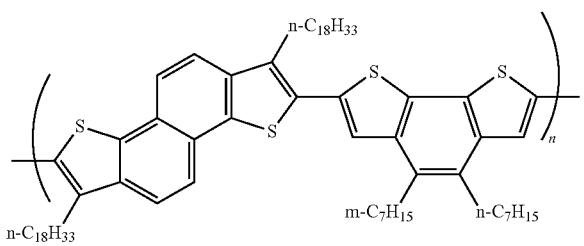
[Chemical Formula 24]
(140) 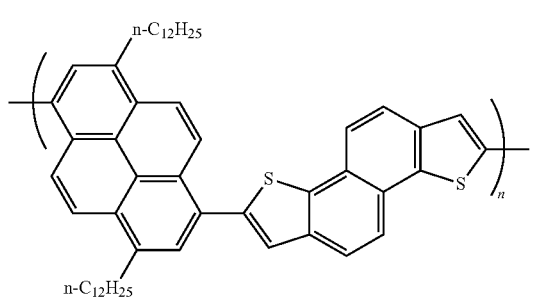
(141) 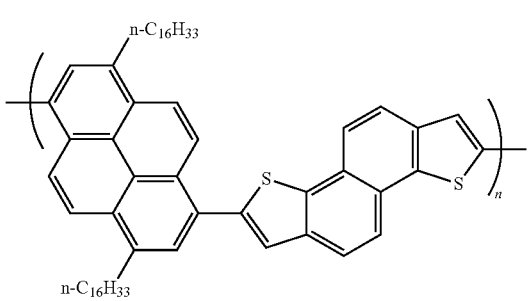
(142) 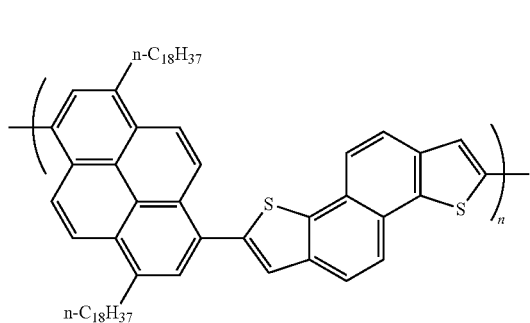
(143) 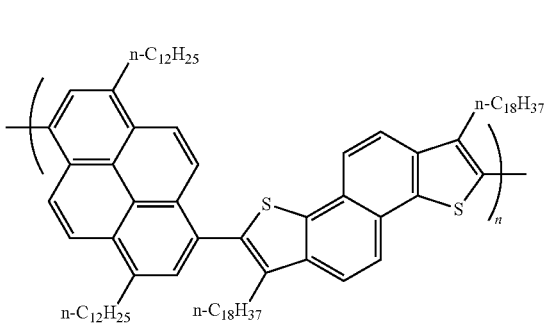

(144)
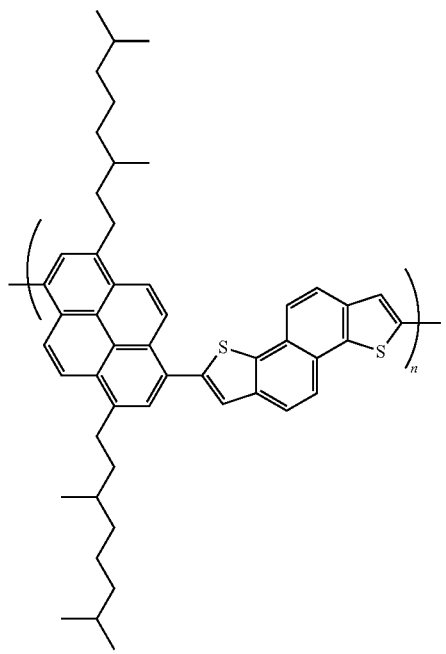
[Chemical Formula 25]
(145)
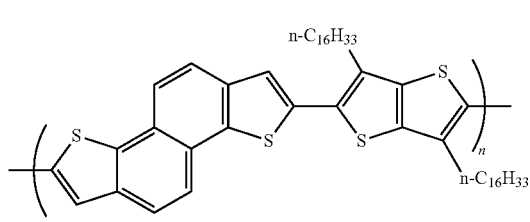
(146)
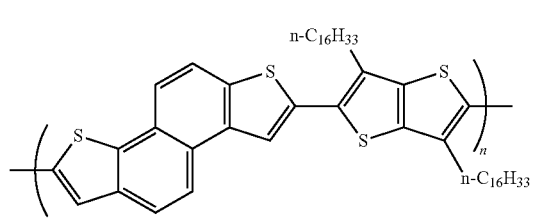
(147)
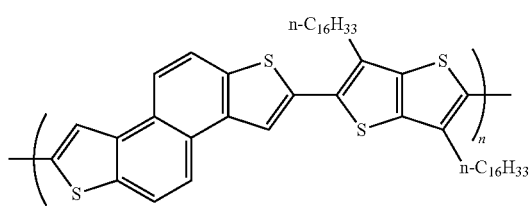
(148)
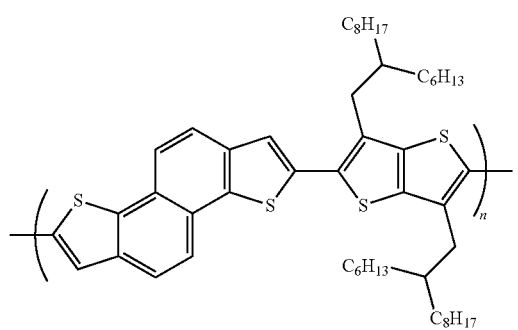
(149)
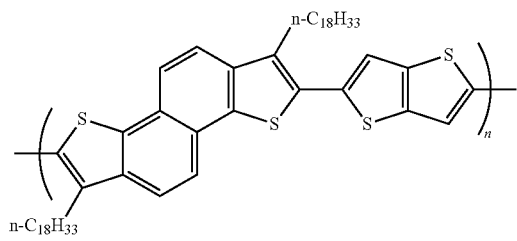
(150)
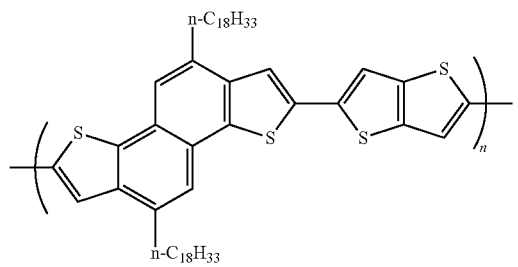

[Chemical Formula 26]
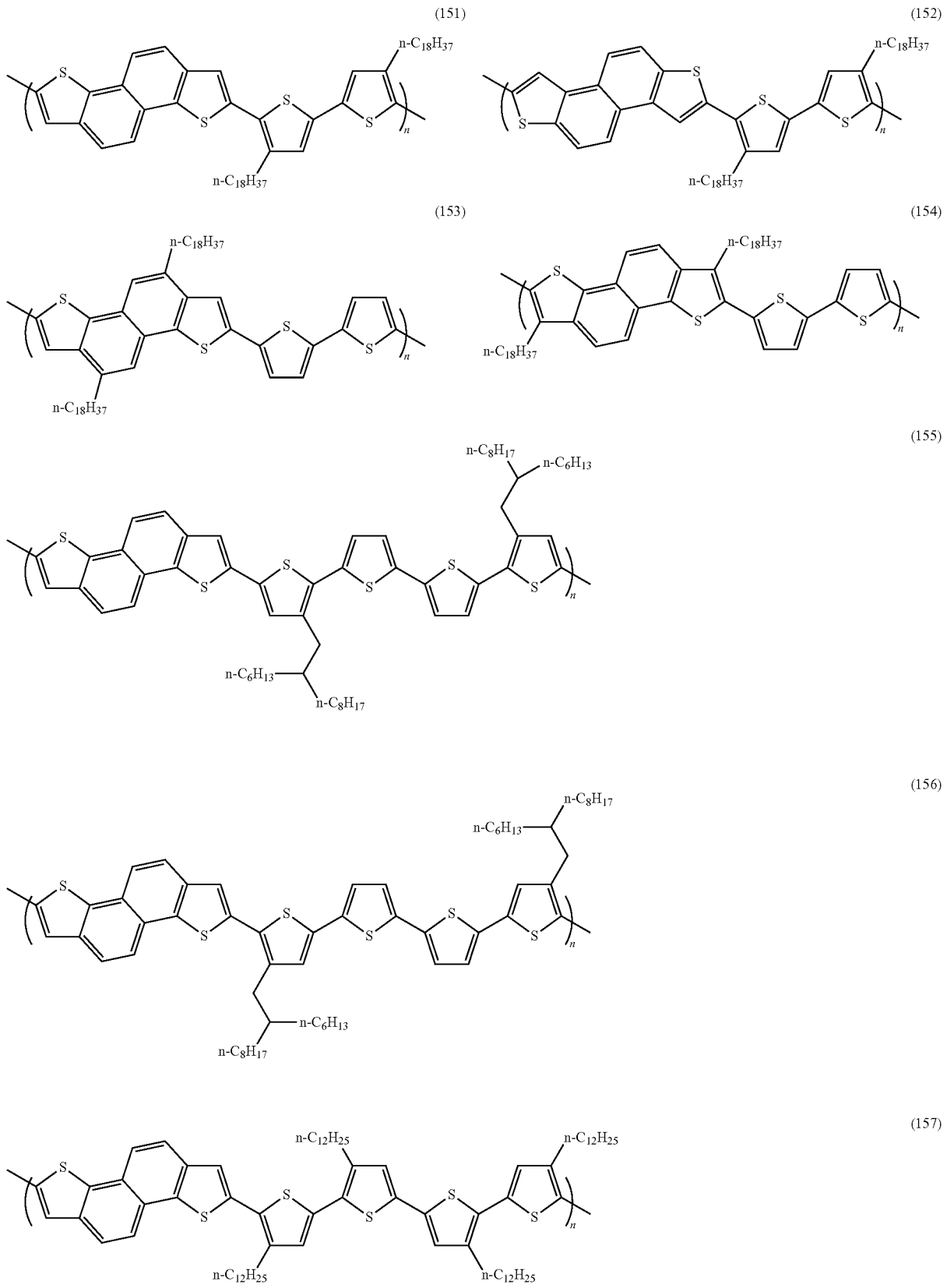

[Chemical Formula 27]
(158)
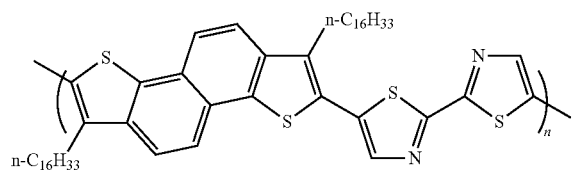
(159)
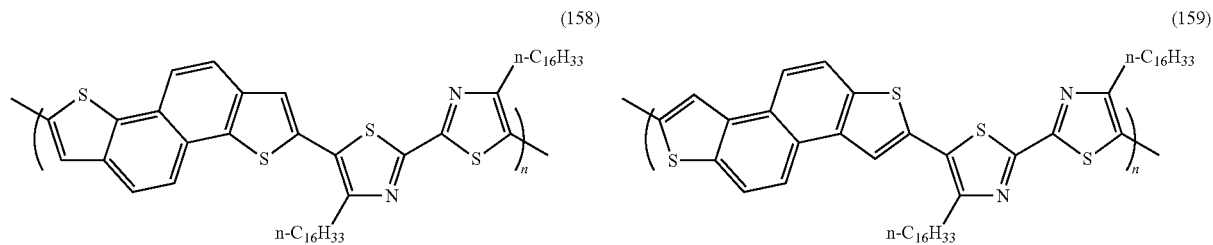
(160)
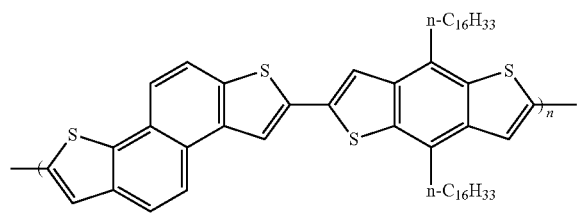
(161)
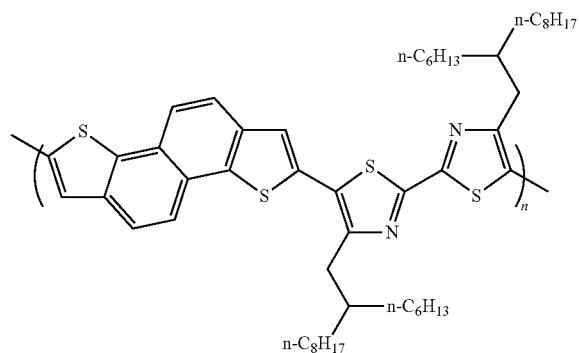
[Chemical Formula 28]
(162)
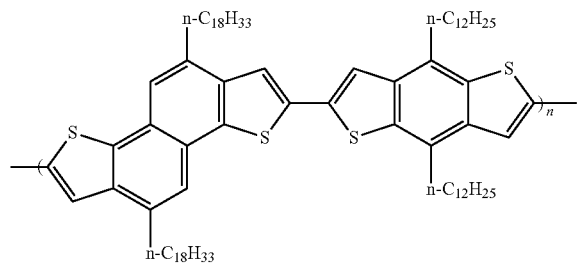
(163)
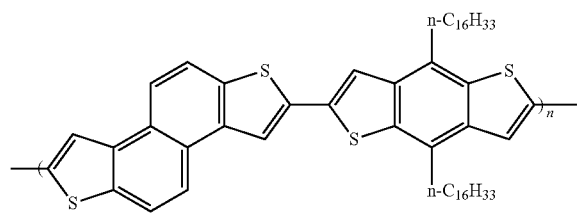
(164)
(165)
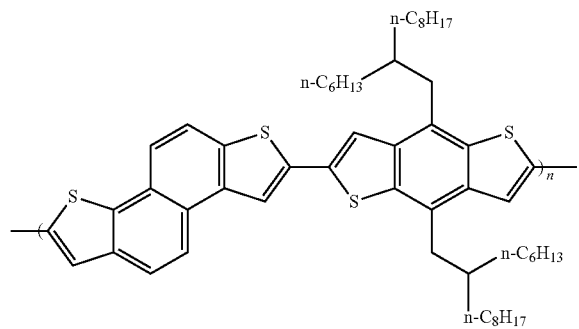

[Chemical Formula 29]
(166)
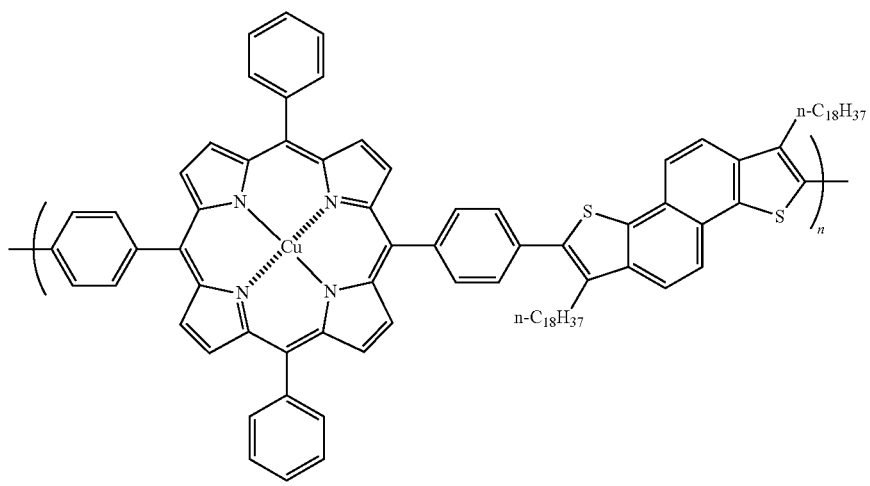
(167)
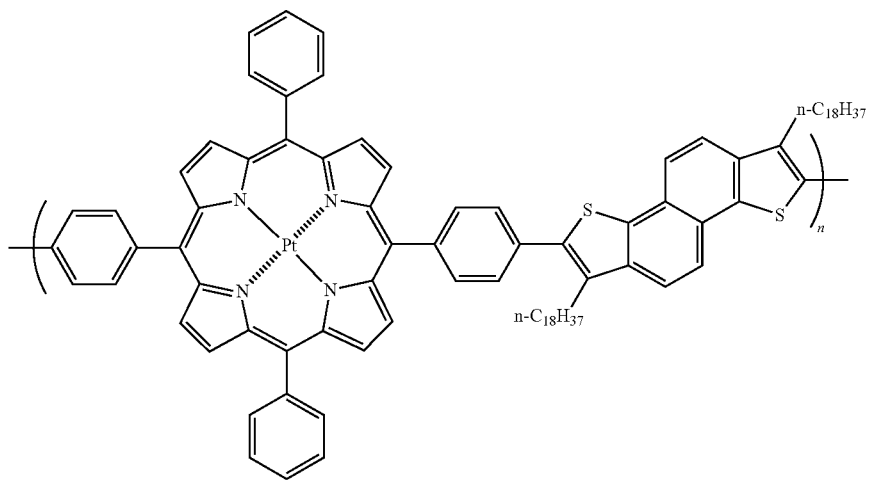
(168)
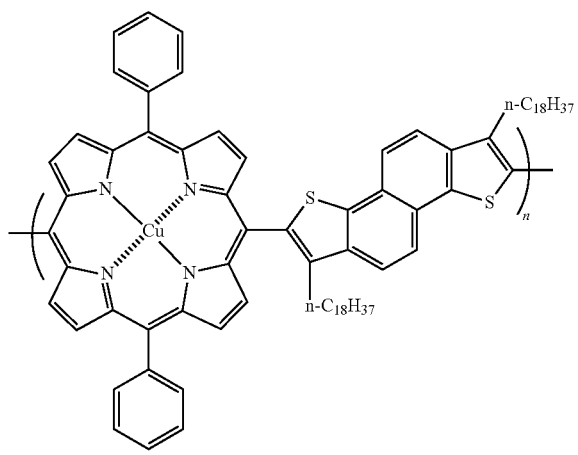
(169)
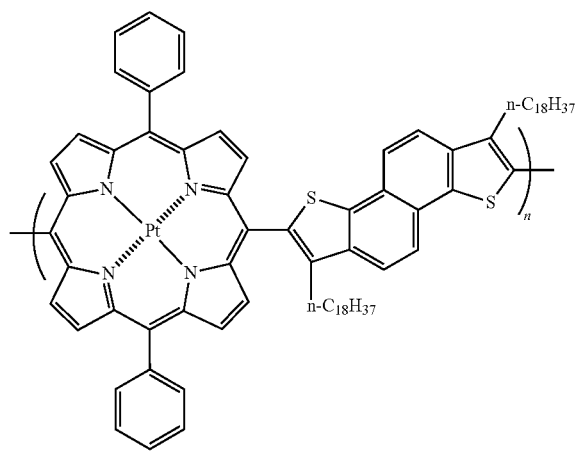

[Chemical Formula 30]

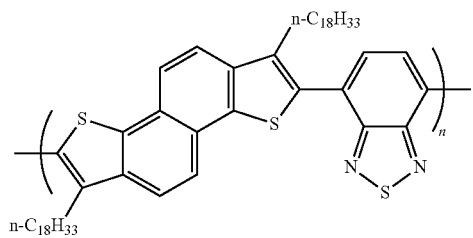
(170)

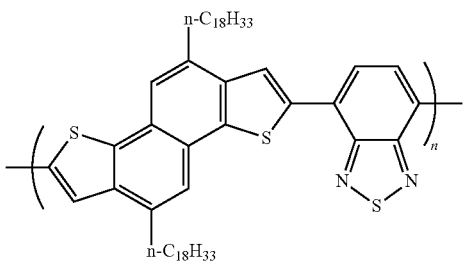
(171)

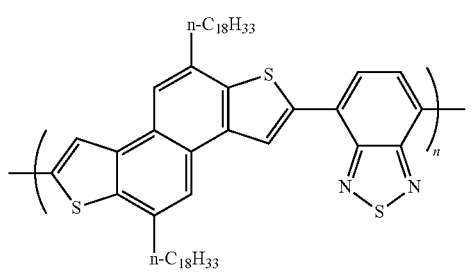
(172)

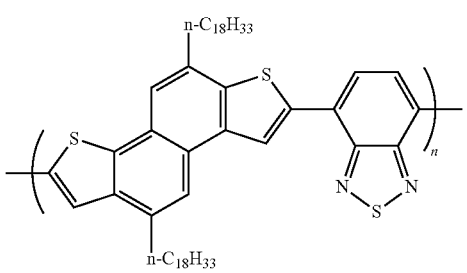
(173)

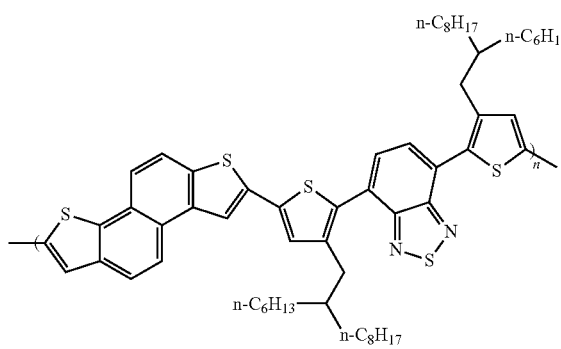
(174)

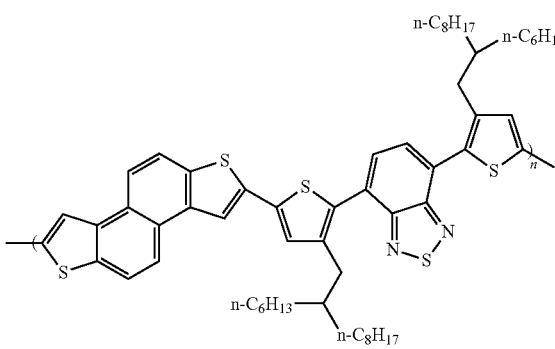
(175)

When the polymer compound is a copolymer, the total number of moles of the repeating units represented by the formula (1) (preferably the formulas (2) to (4)) is preferably 20 to 80%, more preferably 30 to 70%, still more preferably 40 to 60%, based on the total number of moles of all repeating units, because good charge injection properties and solubility are provided.

In the polymer compound, the total number of moles of the repeating units other than the repeating units represented by the formula (1) (preferably the formulas (2) to (4)) is preferably 10% or less, more preferably 5% or less, still more preferably 1% or less, particularly preferably 0.05% or less, based on the total number of moles of the repeating units represented by the formula (1), because good main chain orientation is provided. If main chain orientation is good, excellent packing is possible and therefore higher charge mobility is provided.

Further, when the polymer compound is a copolymer, the copolymer may be any copolymer, for example, any of block copolymers, random copolymers, alternating copolymers, graft copolymers or the like. However, the structure of the polymer compound preferably contains a structure in which repeating units represented by the formula (1) (preferably formulas (2) to (4)) and repeating units represented by the formula (5) are alternately bonded to each other, because good charge injection properties, charge transfer properties, main chain packing and solubility are provided.

In particular, because the above-described properties are provided still better, the polymer compound is preferably a structure in which repeating units represented by the formula (1) (preferably repeating units represented by any one of the formulas (2) to (4)) and repeating units represented by the formula (5) are alternately bonded to each other, more preferably a structure in which repeating units represented by any one of the formulas (2) and (3) and repeating units represented by the formula (5) are alternately bonded to each other.

To sufficiently provide excellent effects by the "structure with alternate bonding" in this manner, the percentage of the total repeating units forming this "structure with alternate bonding" is preferably 90% or more, more preferably 99% or more, still more preferably 99.5% or more, particularly preferably 99.9% or more, based on all repeating units of the polymer compound on a molar basis.

The polymer compound has a plurality of repeating units, at least one of which is a repeating unit represented by the formula (1) (preferably any one of the formulas (2) to (4)). The polystyrene-reduced number average molecular weight (Mn) by gel permeation chromatography (hereinafter called "GPC") of this polymer compound is preferably $1\times10^3$ to $1\times10^8$, more preferably $1\times10^4$ to $1\times10^6$. The polystyrene-reduced weight average molecular weight (Mw) by GPC of this polymer compound is preferably $1\times10^3$ to $1\times10^8$. This weight average molecular weight is more preferably $1\times10^4$ to $5 \times 10^6$, still more preferably $1 \times 10^4$ to $5 \times 10^5$, even more preferably $1 \times 10^4$ to $5 \times 10^5$, because particularly good film-forming properties are provided, and high mobility is provided when the polymer compound is used for device fabrication.

If a polymerization active group used for the production of the polymer compound as described later remains as is in a terminal group of the polymer compound, charge mobility and device life may be decreased when the polymer compound is used for organic transistors. Therefore, the terminal group is preferably a stable group.

Such a terminal group is preferably one covalently bonded to the main chain, and examples thereof include a structure bonded to an aryl group or a heterocyclic group via a carbon-carbon bond. Specific examples of the terminal group include a substituent described in Chemical Formula 10 of Japanese Patent Application Laid-Open No. 09-45478.

Such polymer compounds are useful as luminescent materials, hole transport materials or electron transport materials even alone, but may be used in combination with other high-molecular-weight compounds, for example, may be used as compositions described later.

[Method for Producing Polymer Compound]

Next, preferred embodiments of the method for producing the above-described polymer compound will be described.

For example, the polymer compound can be produced by subjecting to condensation polymerization a raw material compound corresponding to the repeating unit represented by the formula (1) such as a compound represented by the formula (21). When the repeating unit represented by the formula (1) is a repeating unit represented by the formula (2), (3) or (4), it is possible to use raw material compounds corresponding to those repeating units, respectively, such as a compound represented by the formula (22), a compound represented by the formula (23) and a compound represented by the formula (24). The polymer compound can be formed as a copolymer by combining these compounds with a raw material compound corresponding to the repeating unit to be combined and subjecting them to condensation polymerization. For example, a raw material compound represented by the formula (25) is preferably used in combination when the repeating unit represented by the formula (5) is introduced.

[Chemical Formula 31]

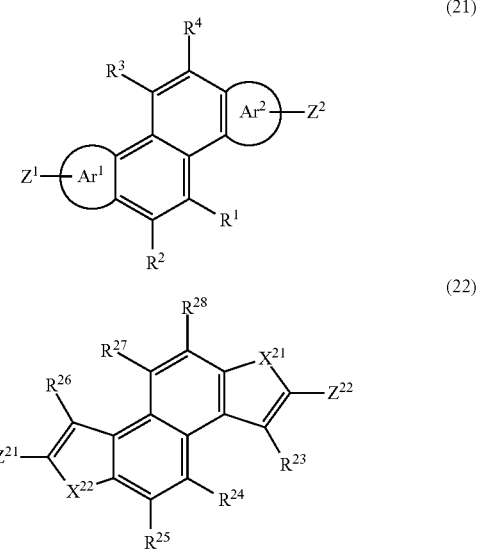

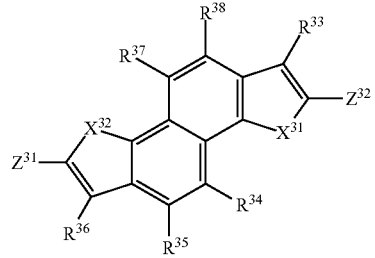

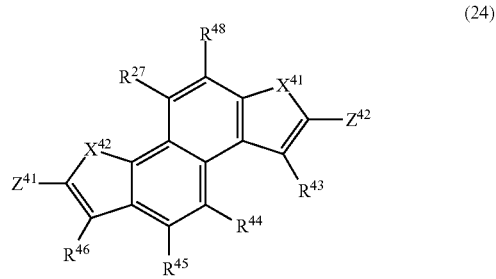

In these formulas, $Ar^1$, $Ar^2$, $R^1$, $R^2$, $R^3$, $R^4$, $X^{21}$, $X^{22}$, $X^{31}$, $X^{32}$, $X^{41}$, $X^{42}$, $R^{23}$ to $R^{28}$, $R^{33}$ to $R^{38}$, $R^{43}$ to $R^{48}$ and n are the same as described above.

$Z^1$, $Z^2$, $Z^{21}$, $Z^{22}$, $Z^{31}$, $Z^{32}$, $Z^{41}$, $Z^{42}$, $Z^{51}$ and $Z^{52}$ are identical or different and are each a polymerization active group. Examples of such a polymerization active group include a halogen atom, a sulfonate group represented by the formula (a-1), a methoxy group, a borate residue, a boric acid residue (a group represented by $-B(OH)_2$), a group represented by the formula (a-2), a group represented by the formula (a-3) and a group represented by the formula (a-4). When a plurality of these groups are present in the molecule, the groups represented by the same symbol may be identical or different.

[Chemical Formula 32]

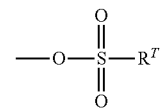

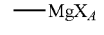

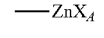

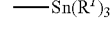

In the formulas (a-1) to (a-4), $R^T$ represents an alkyl group which may have a substituent or an aryl group which may have a substituent, and $X_A$ represents a halogen atom. A plurality of $R^T$s present in the formula (1-4) may be identical or different. Examples of the alkyl group and the aryl group represented by $R^T$ include the same groups as illustrated for $R^{23}$ to $R^{28}$ in the formula (2) described above. Examples of the halogen atom represented by $X_A$ include a chlorine atom, a bromine atom and an iodine atom.

Among polymerization active groups, a chlorine atom, a bromine atom and an iodine atom are preferred as halogen atoms. Examples of the sulfonate group represented by the formula (a-1) include a methanesulfonate group, a trifluoromethanesulfonate group, a phenylsulfonate group and a 4-methylphenylsulfonate group.

Examples of the borate residue include groups represented by the formula (a-5), (a-6), (a-7), (a-8), (a-9) or (a-10).

[Chemical Formula 33]

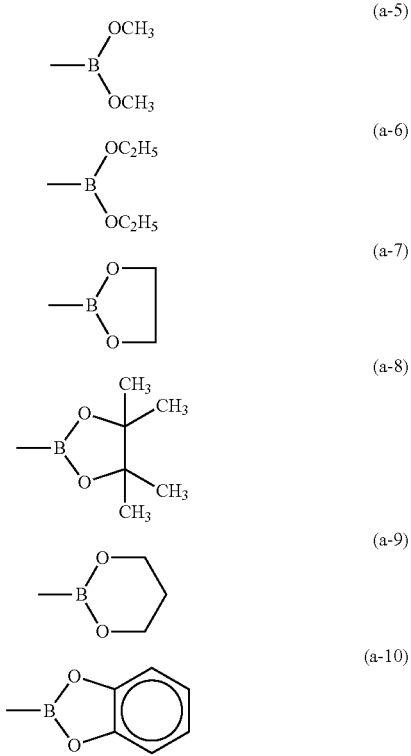

Further, examples of the group represented by the formula (a-4) include a trimethylstannanyl group, a triethylstannanyl group and a tributylstannanyl group.

In the formulas (21) to (25), the polymerization active group is preferably a halogen atom, a borate residue or boric acid residue, because raw material compounds represented by these formulas are easily synthesized and are easy to handle. As raw material compounds represented by the formulas (21) to (25), those previously synthesized and isolated may be used, or those prepared in the reaction system may be directly used.

Examples of the method of subjecting raw material compounds to condensation polymerization include methods of reacting raw material compounds using an appropriate catalyst or an appropriate base as necessary. Examples of the catalyst include transition metal complexes such as palladium complexes such as palladium[tetrakis(triphenylphosphine)], [tris(dibenzylideneacetone)]dipalladium and palladium acetate, and nickel complexes such as nickel[tetrakis(triphenylphosphine)], [1,3-bis(diphenylphosphino)propane]dichloronickel and [bis(1,4-cyclooctadiene)]nickel. Where necessary, these transition metal complexes may be further combined with ligands such as triphenylphosphine, tri(tert-butylphosphine), tricyclohexylphosphine, diphenylphosphinopropane and bipyridyl to prepare catalysts. As catalysts, those previously synthesized may be used, or those prepared in the reaction system may be directly used. The catalysts may be used singly or in a combination of two or more.

The amount of the catalyst(s), if used, is preferably 0.00001 to 3 molar equivalents, more preferably 0.00005 to 0.5 molar equivalents, still more preferably 0.0001 to 0.2 molar equivalents, based on the total number of moles of the raw material compound(s).

Examples of the base promoting the condensation reaction include inorganic bases such as sodium carbonate, potassium carbonate, cesium carbonate, potassium fluoride, cesium fluoride and tripotassium phosphate, and organic bases such as tetrabutylammonium fluoride, tetrabutylammonium chloride, tetrabutylammonium bromide and tetrabutylammonium hydroxide. The amount of the base, if used, is preferably 0.5 to 20 molar equivalents, more preferably 1 to 10 molar equivalents, based on the total number of moles of the raw material compound(s).

The condensation polymerization may be performed in the absence of a solvent or in the presence of a solvent, but is preferably performed in the presence of an organic solvent.

The organic solvent varies according to the type of the raw material compound and the reaction, and toluene, xylene, mesitylene, tetrahydrofuran, 1,4-dioxane, dimethoxyethane, N,N-dimethylacetamide and N,N-dimethylformamide may be used, for example. It is desirable to use those subjected to deoxidation treatment as organic solvents, because side reaction can be suppressed. These organic solvents may be used singly or in a combination of two or more.

The amount of the organic solvent(s), if used, is preferably such an amount that the total concentration of the raw material compound(s) is 0.1 to 90 wt %, more preferably such an amount that the total concentration is 1 to 50 wt %, still more preferably such an amount that the total concentration is 2 to 30 wt %.

The reaction temperature in the condensation polymerization is preferably −100° C. to 200° C., more preferably −80° C. to 150° C., still more preferably 0° C. to 120° C. The reaction time is preferably one hour or more, more preferably 2 to 500 hours, depending on the conditions such as reaction temperature. Further, the condensation reaction may be desirably performed under dehydration conditions. For example, it is preferably performed under dehydration conditions when the polymerization active group in the formulas (21) to (25) is a group represented by the formula (a-2).

Examples of the condensation polymerization include a method of polymerizing using Suzuki reaction (Chem. Rev., vol. 95, p. 2457 (1995)), a method of polymerizing using Grignard reaction (Kyoritsu Shuppan Co., Ltd., Polymer Functional Material Series vol. 2, Synthesis and reaction of polymers (2), p. 432-433) and a method of polymerizing using Yamamoto polymerization (Prog. Polym. Sci., vol. 17, p. 1153-1205, 1992).

Known post-treatment can be performed after the condensation polymerization. Examples of the post-treatment include a method of adding a reaction solution resulting from the condensation polymerization to lower alcohols such as methanol, and filtering and drying the precipitate. The polymer compound of the present invention is obtained by such post-treatment, and may be purified by conventional methods such as recrystallization, continuous extraction by Soxhlet extractors, and column chromatography when the purity of the polymer compound is low.

In the production of the polymer compound, where the raw material compound represented by the formula (21) (preferably any one of the raw material compounds represented by the formulas (22) to (24)) is copolymerized with the raw material compound represented by the formula (25), the following reaction is preferably performed, because the polymer compound preferably has repeating units composed of the former raw material compound and repeating units composed of the latter raw material compound alternately.

Specifically, it is preferable to use a method of polymerizing using Suzuki polymerization a combination of the compound of the formula (21) (preferably the formulas (22) to (24)) where the polymerization active group is a halogen atom and the compound of the formula (25) where the polymerization active group is a boric acid residue or a borate residue, or a combination of the compound of the formula (21) (preferably the formulas (22) to (24)) where the polymerization active group is a boric acid residue or a borate residue and the compound of the formula (25) where the polymerization active group is a halogen atom.

[Composition]

The above-described polymer compound of the present invention can also be used as a luminescent material or charge transport material in a composition containing the compound in combination with other components. Examples of such a composition include those containing the polymer compound and at least one material selected from the group consisting of hole transport materials, electron transport materials and luminescent materials. Preferred hole transport materials and electron transport materials as illustrated later in the description of the thin film may be used.

The content ratio of the polymer compound to at least one material selected from the group consisting of hole transport materials, electron transport materials and luminescent materials may be determined according to the application of the composition; for luminescent material applications, the content of the polymer compound is preferably 20 to 99 parts by weight, more preferably 40 to 95 parts by weight, based on 100 parts by weight of the total composition.

The polystyrene-reduced number average molecular weight (Mn) by GPC of the composition containing the polymer compound is preferably $1 \times 10^3$ to $1 \times 10^8$, more preferably $5 \times 10^3$ to $1 \times 10^6$. The polystyrene-reduced weight average molecular weight (Mw) is preferably $1 \times 10^3$ to $1 \times 10^8$, and it is more preferably $1 \times 10^4$ to $5 \times 10^6$, because good film-forming properties are provided, and high efficiency is provided when the composition is used for device fabrication. Here, the average molecular weight of the composition containing the polymer compound refers to a value determined by analyzing this composition by GPC.

As described below, the composition of the present embodiment can also be formulated into a solution containing a solvent such as an organic solvent (hereinafter called "ink composition"). Preferred embodiments of the ink composition will be described below.

(Ink Composition)

The ink composition comprising the polymer compound of the present invention comprises the polymer compound and a solvent. The ink composition may also be one comprising the above-described composition comprising the polymer compound, and a solvent. This ink composition is mainly in a solution state and is useful for forming a thin film by printing or the like. Components contained in the ink composition other than the polymer compound and the solvent include hole transport materials, electron transport materials, luminescent materials, stabilizers, thickeners (high-molecular-weight compounds and poor solvents to increase viscosity), low-molecular-weight compounds to decrease viscosity, surfactants (to decrease surface tension) and antioxidants.

The ink composition may comprise only one polymer compound of the present invention, or may comprise two or more such polymer compounds in combination. The ink composition may comprise high-molecular-weight compounds other than the polymer compound of the present invention so that properties are not compromised when used for device fabrication.

The proportion of the polymer compound(s) of the present invention in the ink composition is usually 1 to 99.9 parts by weight, preferably 60 to 99.5 parts by weight, still more preferably 80 to 99.0 parts by weight, based on 100 parts by weight of the total ink composition. Because the ink composition comprises the polymer compound(s) in such a proportion, coating can be performed well and a thin film or the like that can exhibit excellent properties of the polymer compound(s) well is easily formed.

The viscosity of the ink composition may be adjusted according to the type of printing used, and is preferably in the range of 1 to 20 mPa·s at 25° C. in order to prevent clogging and curved flight during discharge when the ink composition is applied to a method in which the ink composition is discharged through a discharge device such as inkjet printing, for example.

The solvent used in the ink composition is preferably one that can dissolve or uniformly disperse solid components in the ink composition. Examples of the solvent include chlorine solvents such as chloroform, methylene chloride, 1,2-dichloroethane, 1,1,2-trichloroethane, chlorobenzene and o-dichlorobenzene, ether solvents such as tetrahydrofuran, dioxane and anisole, aromatic hydrocarbon solvents such as toluene and xylene, aliphatic hydrocarbon solvents such as cyclohexane, methylcyclohexane, n-pentane, n-hexane, n-heptane, n-octane, n-nonane and n-decane, ketone solvents such as acetone, methyl ethyl ketone, cyclohexanone, benzophenone and acetophenone, ester solvents such as ethyl acetate, butyl acetate, ethyl cellosolve acetate, methyl benzoate and phenyl acetate, polyhydric alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerol and 1,2-hexanediol, alcohol solvents such as methanol, ethanol, propanol, isopropanol and cyclohexanol, sulfoxide solvents such as dimethyl sulfoxide, and amide solvents such as N-methyl-2-pyrolidone and N,N-dimethylformamide. These solvents may be used singly or in a combination of two or more.

Among these, aromatic hydrocarbon solvents, ether solvents, aliphatic hydrocarbon solvents, ester solvents and ketone solvents are preferred, because this provides good solubility, viscosity characteristics, and uniformity during film formation of the polymer compound or the like. Specifically, toluene, xylene, ethylbenzene, diethylbenzene, trimethylbenzene, n-propylbenzene, isopropylbenzene, n-butylbenzene, isobutylbenzene, sec-butylbenzene, n-hexylbenzene, cyclohexylbenzene, 1-methylnaphthalene, tetralin, anisole, ethoxybenzene, cyclohexane, bicyclohexyl, cyclohexenylcyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone and benzophenone are preferred.

Two or more solvents are preferably used in combination, two or three solvents are more preferably used in combination, and two solvents are particularly preferably used in combination, because film-forming properties and device characteristics are improved.

When two solvents are combined, one of the solvents may be in a solid state at 25° C. At least one solvent has a boiling point of preferably 180° C. or higher, more preferably 200° C. or higher, because good film-forming properties are provided. Both of the two solvents preferably dissolve 1 wt % or more of an aromatic polymer at 60° C., and in particular, one of the two solvents preferably dissolves 1 wt % or more of an aromatic polymer at 25° C., because good viscosity is provided.

Further, when two or more solvents are combined, the percentage of the solvent having the highest boiling point among the combined solvents is preferably 40 to 90 wt %, more preferably 50 to 90 wt %, still more preferably 65 to 85%, based on the total weight of the solvents, because good viscosity and film-forming properties are provided.

If the ink composition contains a high-molecular-weight compound as a thickener, this compound is preferably one that is soluble in the same solvents as for the polymer compound of the present invention and that does not interfere with luminescence and charge transfer when devices are formed. Examples of such a thickener include high-molecular-weight polystyrenes and high-molecular-weight polymethyl methacrylates. These high-molecular-weight compounds have a polystyrene-reduced weight average molecular weight of preferably 500,000 or more, more preferably 1,000,000 or more.

Poor solvents for solids in the ink composition components may also be used as thickeners. Viscosity can be moderately increased by adding a small amount of such a poor solvent. When the poor solvent is added for this purpose, the type and amount of the solvent may be selected so that the solids in the ink composition are not precipitated. Taking stability during storage of the ink composition into consideration, the amount of the poor solvent is preferably 50 parts by weight or less, more preferably 30 parts by weight or less, based on 100 parts by weight of the total ink composition.

Antioxidants are used for improving storage stability of the ink composition. Antioxidants are acceptable if they are soluble in the same solvents as for the polymer compound of the present invention, and do not interfere with luminescence and charge transfer when devices are formed, and examples thereof include phenol antioxidants and phosphorus antioxidants.

Further, the ink composition may contain water or a metal or its salt in the range of 1 to 1000 ppm on a weight basis. Specific examples of the metal include lithium, sodium, calcium, potassium, iron, copper, nickel, aluminum, zinc, chromium, manganese, cobalt, platinum and iridium. In addition, the ink composition may contain silicon, phosphorus, fluorine, chlorine, bromine or the like in the range of 1 to 1000 ppm on a weight basis.

[Thin Film]

Thin films comprising the polymer compound of the present invention can be used as luminescent thin films, conductive thin films and organic semiconductor thin films, for example.

When the thin films are luminescent thin films, the luminescence quantum yield is preferably 30% or more, more preferably 50% or more, still more preferably 60% or more, particularly preferably 70% or more, because high luminance and light-emitting voltage are provided.

When the thin films are conductive thin films, the surface resistance is preferably 1 kΩ/square or less, more preferably 100 Ω/square or less, still more preferably 10 Ω/square or less. Conductive thin films provide higher electric conductivity by being doped with Lewis acids, ionic compounds or the like.

When the thin films are organic semiconductor thin films, the higher one of the electron mobility and the hole mobility is preferably $10^{-5}$ cm$^2$/Vs or more, more preferably $10^{-3}$ cm$^2$/Vs or more, still more preferably $10^{-1}$ cm$^2$/Vs or more. Organic transistors as described later can be formed using such organic semiconductor thin films.

The thickness of the organic semiconductor thin film is preferably 1 nm to 100 μm, more preferably 2 nm to 1000 nm, still more preferably 3 nm to 500 nm, particularly preferably 5 nm to 200 nm.

The organic semiconductor thin film may comprise one polymer compound of the present invention singly, or may comprise two or more such polymer compounds in combination. Low-molecular-weight or polymer compounds having electron transport properties or hole transport properties other than the polymer compound may be mixed in order to improve electron transport properties or hole transport properties of the organic semiconductor thin film.

Known materials can be used as hole transport materials, and examples thereof include pyrazoline derivatives, arylamine derivatives, stilbene derivatives, triaryldiamine derivatives, oligothiophene and derivatives thereof, polyvinylcarbazole and derivatives thereof, polysilane and derivatives thereof, polysiloxane derivatives having aromatic amines in the side chains or main chains, polyaniline and derivatives thereof, polythiophene and derivatives thereof, polypyrrole and derivatives thereof, polyarylenevinylene and derivatives thereof, and polythienylenevinylene and derivatives thereof.

Known materials can be used as electron transport materials, and examples thereof include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, and fullerenes such as $C_{60}$ fullerene, and derivatives thereof.

The thin films of the present embodiment may comprise charge generating materials to generate charges by light absorbed by the thin films according to the applications. Known materials can be used as charge generating materials, and examples thereof include azo compounds and derivatives thereof, diazo compounds and derivatives thereof, non-metallic phthalocyanine compounds and derivatives thereof, metallic phthalocyanine compounds and derivatives thereof, perylenes compounds and derivatives thereof, polycyclic quinone compounds and derivatives thereof, squarylium compounds and derivatives thereof, azulenium compounds and derivatives thereof, thiapyrylium compounds and derivatives thereof, and fullerenes such as $C_{60}$ fullerene, and derivatives thereof.

Further, the thin films of the present embodiment may comprise other materials necessary for exhibiting various functions. Examples of such materials include sensitizers for sensitizing functions to generate charges by absorbed light, stabilizers for increasing stability, and UV absorbers for absorbing UV light.

The thin films may comprise polymer compounds other than the polymer compound of the present invention as polymer binders, because mechanical properties are improved. As polymer binders, those that do not extremely interfere with charge transport properties or hole transport properties are preferred, and those that do not strongly absorb visible light are also preferably used.

Examples of such polymer binders include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride and polysiloxane.

Examples of the method for producing the thin film of the present embodiment include a method using the above polymer compound of the present invention as is and a method of forming the film using the above-described composition (e.g. the ink composition). For example, the method is a method of forming the film using a solution in which an electron transport material, a hole transport material, a polymer binder or the like is added to the polymer compound as necessary. The thin film may also be formed by vacuum deposition when the polymer compound is an oligomer or the like.

Examples of the method of forming the thin film include spin coating, casting, microgravure coating, gravure coating, bar coating, roll coating, wire bar coating, dip coating, spray coating, screen printing, flexographic printing, offset printing, inkjet printing, capillary coating, nozzle coating and dispenser printing, with screen printing, flexographic printing, offset printing, inkjet printing and dispenser printing being preferred, and flexographic printing, inkjet printing and dispenser printing being more preferred.

When the film is formed using a solution (e.g., the ink composition) or the like, the solvent used is preferably one that dissolves, in addition to the polymer compound of the present invention, components to be mixed (such as electron transport materials, hole transport materials and polymer binders).

The above-described solvents used for the ink composition can be used as solvents, and examples thereof include unsaturated hydrocarbon solvents such as toluene, xylene, mesitylene, tetralin, decalin, bicyclohexyl, n-butylbenzene, sec-butylbenzene and tert-butylbenzene, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane, halogenated unsaturated hydrocarbon solvents such as chlorobenzene, dichlorobenzene and trichlorobenzene, and ether solvents such as tetrahydrofuran and tetrahydropyran. The polymer compound of the present invention can often be dissolved in these solvents at 0.1 wt % or more depending on its structure and molecular weight.

When the thin film is fabricated using a solution, the thin film is easily formed, because the glass transition temperature of the polymer compound of the present invention contained in this solution tends to be high, so that the solution can be baked at a temperature of 100° C. or higher in the film-forming process, and even baking at a temperature of 130° C. or higher rarely causes deterioration of properties when the solution is used for device fabrication. Further, the solution may be baked at a temperature of 160° C. or higher depending on the type of the polymer compound.

When organic semiconductor thin films comprising the polymer compound of the present invention are produced, the production process may include a step of orienting the polymer compound. In organic semiconductor thin films in which the polymer compound is oriented by this step, charge mobility is still higher, because main chain molecules or side chain molecules are arranged in one direction.

Methods known as techniques for orienting liquid crystals can be used as methods for orienting the polymer compound. In particular, rubbing, photoorientation, shearing (shear stress application) and drawing-up coating are simple, useful and easily utilizable as orientation techniques, with rubbing and shearing being preferred.

[Organic Thin Film Device]

Thin films comprising the polymer compound of the present invention (e.g., organic semiconductor thin films) have charge transport properties, and therefore can control transport of electrons or holes injected from electrodes, or charges generated by light absorption, and can be used in various organic thin film devices such as organic transistors, solar cell modules and optical sensors. When the thin films of the present invention are used in these organic thin film devices, the thin films are preferably oriented by the above-described orientation treatment and used, because better charge transport properties or hole transport properties are provided. Preferred examples of the organic thin film devices will be described below.

(Organic Transistor)

First, preferred embodiments of the organic transistor comprising an organic semiconductor layer including the polymer compound of the present invention will be described.

The organic transistor comprises a source electrode and a drain electrode; an organic semiconductor layer forming a current path between them and including the above polymer compound; and a gate electrode controlling the amount of current passing through the current path, and examples thereof include field effect organic transistors and static induction organic transistors.

The field effect organic transistor preferably comprises a source electrode and a drain electrode; an organic semiconductor layer forming a current path between them; a gate electrode controlling the amount of current passing through the current path; and an insulating layer placed between the organic semiconductor layer and the gate electrode. It is particularly preferred that the source electrode and the drain electrode be provided in contact with the organic semiconductor layer and that the gate electrode be provided across the insulating layer further in contact with the organic semiconductor layer.

The static induction organic transistor preferably comprises a source electrode and a drain electrode; an organic semiconductor layer forming a current path between them; and a gate electrode controlling the amount of current passing through the current path, the gate electrode provided in the organic semiconductor layer. In particular, the source electrode, the drain electrode, and the gate electrode provided in the organic semiconductor layer are preferably provided in contact with the organic semiconductor layer. Here, the structure of the gate electrode is acceptable if the structure can form a path for current flowing from the source electrode to the drain electrode and can control the amount of current flowing in the current path by the voltage applied to the gate electrode; examples thereof include comb-shaped electrodes.

FIG. 1 is a schematic cross-sectional view of an organic transistor (field effect organic transistor) according to a first embodiment. An organic transistor 100 shown in FIG. 1 comprises a substrate 1; a source electrode 5 and a drain electrode 6 formed on the substrate 1 at a predetermined interval between them; an organic semiconductor layer 2 formed on the substrate 1 to cover the source electrode 5 and the drain electrode 6; an insulating layer 3 formed on the organic semiconductor layer 2; and a gate electrode 4 formed on the insulating layer 3 to cover a region of the insulating layer 3 between the source electrode 5 and the drain electrode 6.

Figure 2:
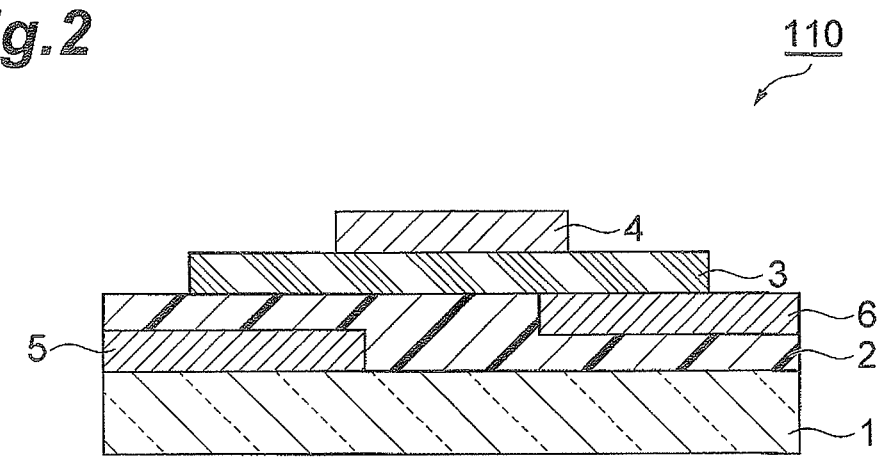
FIG. 2 is a schematic cross-sectional view of an organic transistor according to a second embodiment.

FIG. 2 is a schematic cross-sectional view of an organic transistor (field effect organic transistor) according to a second embodiment. An organic transistor 110 shown in FIG. 2 comprises a substrate 1; a source electrode 5 formed on the substrate 1; an organic semiconductor layer 2 formed on the substrate 1 to cover the source electrode 5; a drain electrode 6 formed on the organic semiconductor layer 2 at a predetermined interval from the source electrode 5; an insulating layer 3 formed on the organic semiconductor layer 2 and the drain electrode 6; and a gate electrode 4 formed on the insulating layer 3 to cover a region of the insulating layer 3 between the source electrode 5 and the drain electrode 6.

Figure 3:
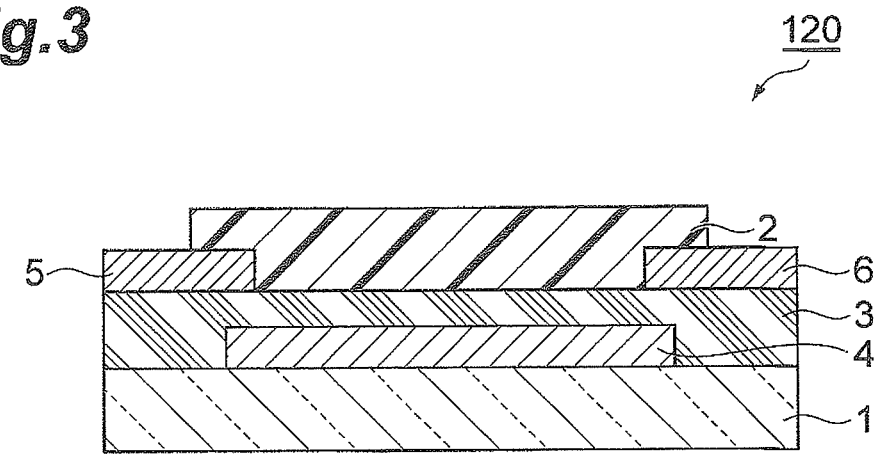
FIG. 3 is a schematic cross-sectional view of an organic transistor according to a third embodiment.

FIG. 3 is a schematic cross-sectional view of an organic transistor (field effect organic transistor) according to a third embodiment. An organic transistor 120 shown in FIG. 3 comprises a substrate 1; a gate electrode 4 formed on the substrate 1; an insulating layer 3 formed on the substrate 1 to cover the gate electrode 4; a source electrode 5 and a drain electrode 6 formed on the insulating layer 3 at a predetermined interval between them to partially cover a region of the insulating layer 3 having the gate electrode 4 formed in its lower part; and an organic semiconductor layer 2 formed on the insulating layer 3 to partially cover the source electrode 5 and the drain electrode 6.

Figure 4:
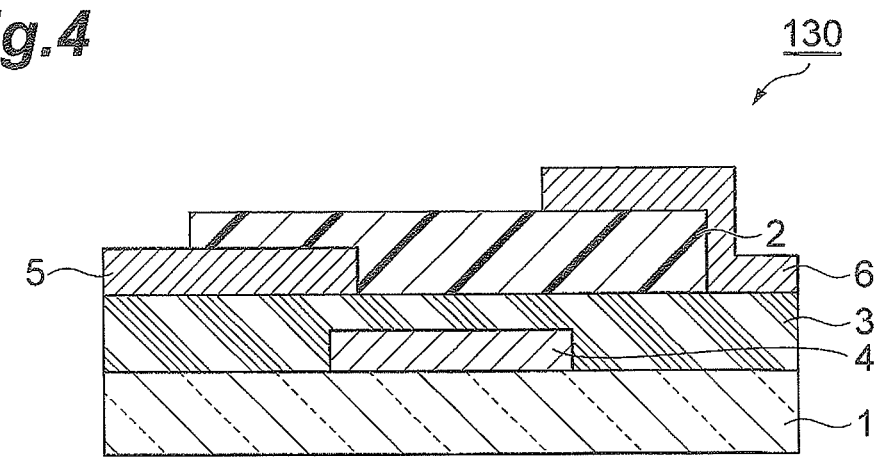
FIG. 4 is a schematic cross-sectional view of an organic transistor according to a fourth embodiment.

FIG. 4 is a schematic cross-sectional view of an organic transistor (field effect organic transistor) according to a fourth embodiment. An organic transistor 130 shown in FIG. 4 comprises a substrate 1; a gate electrode 4 formed on the substrate 1; an insulating layer 3 formed on the substrate 1 to cover the gate electrode 4; a source electrode 5 formed on the insulating layer 3 to partially cover a region of the insulating layer 3 having the gate electrode 4 formed in its lower part; an organic semiconductor layer 2 formed on the insulating layer 3 to partially cover the source electrode 5; and a drain electrode 6 formed on the insulating layer 3 at a predetermined interval from the source electrode 5 to partially cover a region of the organic semiconductor layer 2 under which the gate electrode 4 is formed.

Figure 5:
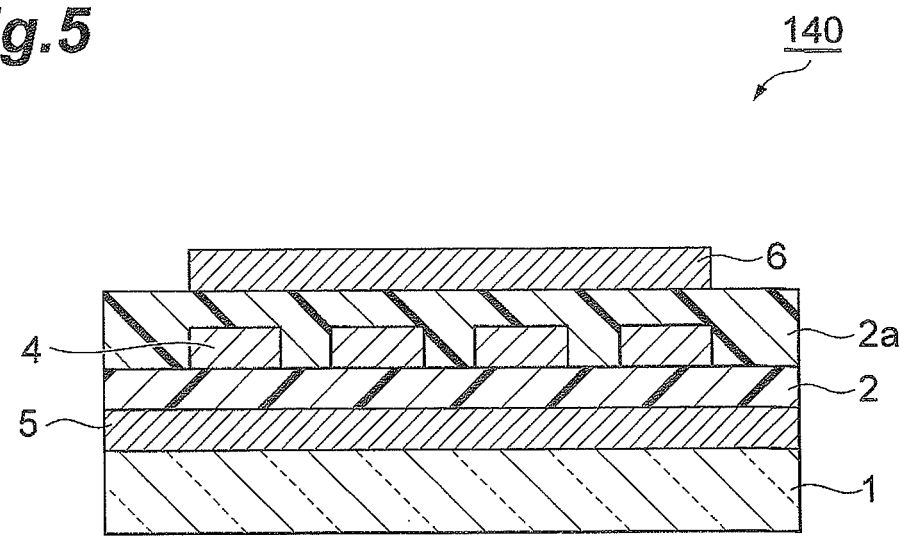
FIG. 5 is a schematic cross-sectional view of an organic transistor according to a fifth embodiment.

FIG. 5 is a schematic cross-sectional view of an organic transistor (static induction organic transistor) according to a fifth embodiment. An organic transistor 140 shown in FIG. 5 comprises a substrate 1; a source electrode 5 formed on the substrate 1; an organic semiconductor layer 2 formed on the source electrode 5; a plurality of gate electrodes 4 formed on the organic semiconductor layer 2 at predetermined intervals between them; an organic semiconductor layer 2a formed on the organic semiconductor layer 2 to cover all of the gate electrodes 4 (where the material forming the organic semiconductor layer 2a may be identical to or different from that of the organic semiconductor layer 2); and a drain electrode 6 formed on the organic semiconductor layer 2a.

Figure 6:
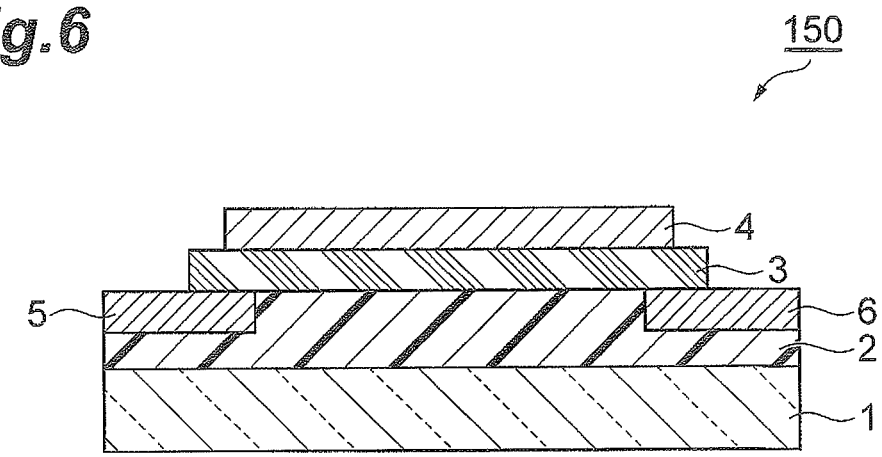
FIG. 6 is a schematic cross-sectional view of an organic transistor according to a sixth embodiment.

FIG. 6 is a schematic cross-sectional view of an organic transistor (field effect organic transistor) according to a sixth embodiment. An organic transistor 150 shown in FIG. 6 comprises a substrate 1; an organic semiconductor layer 2 formed on the substrate 1; a source electrode 5 and a drain electrode 6 formed on the organic semiconductor layer 2 at a predetermined interval between them; an insulating layer 3 formed on the organic semiconductor layer 2 to partially cover the source electrode 5 and the drain electrode 6; and a gate electrode 4 formed on the insulating layer 3 to partially cover a region of the insulating layer 3 under which the source electrode 5 is formed and a region of the insulating layer 3 under which the drain electrode 6 is formed, respectively.

Figure 7:
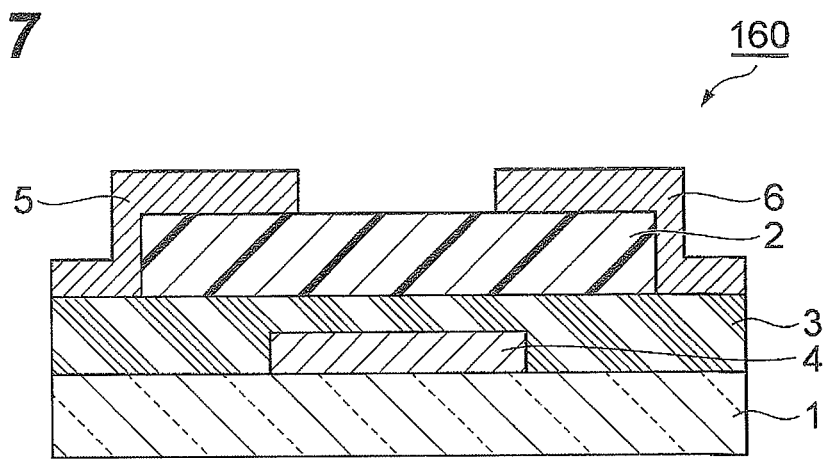
FIG. 7 is a schematic cross-sectional view of an organic transistor according to a seventh embodiment.

FIG. 7 is a schematic cross-sectional view of an organic transistor (field effect organic transistor) according to a seventh embodiment. An organic transistor 160 shown in FIG. 7 comprises a substrate 1; a gate electrode 4 formed on the substrate 1; an insulating layer 3 formed on the substrate 1 to cover the gate electrode 4; an organic semiconductor layer 2 formed to cover a region of the insulating layer 3 under which the gate electrode 4 is formed; a source electrode 5 formed on the organic semiconductor layer 2 to partially cover a region of the organic semiconductor layer 2 under which the gate electrode 4 is formed; and a drain electrode 6 formed on the organic semiconductor layer 2 at a predetermined interval from the source electrode 5 to partially cover a region of the organic semiconductor layer 2 under which the gate electrode 4 is formed.

In the above-described organic transistors according to the first to seventh embodiments, the organic semiconductor layer 2 and/or the organic semiconductor layer 2a form a current path (channel) between the source electrode 5 and the drain electrode 6. The gate electrode 4 controls the amount of current passing through the current path (channel) in the organic semiconductor layer 2 and/or the organic semiconductor layer 2a by applying voltage.

Among the above-described organic transistors, field effect organic transistors can be produced by known methods, for example, a method described in Japanese Patent Application Laid-Open No. 05-110069. Static induction organic transistors can be produced by known methods, for example, a method described in Japanese Patent Application Laid-Open No. 2004-006476.

The substrate 1 is acceptable if it does not interfere with characteristics as an organic transistor, and glass substrates, flexible film substrates and plastic substrates may be used.

The organic semiconductor layer 2 is composed of the above-described thin film (e.g., an organic semiconductor thin film) comprising the polymer compound of the present invention. The organic semiconductor layer 2 may be composed only of the polymer compound, or may include a material other than the polymer compound. It may include only one polymer compound of the present invention, or may include two or more such compounds.

The organic semiconductor layer 2 may further include an electron transport material and/or a hole transport material in addition to the polymer compound of the present invention in order to improve charge transport properties or hole transport properties. As hole transport materials and electron transport materials, those that can be contained in the above-described thin film may be used. The organic semiconductor layer 2 may include a polymer binder in order to provide good mechanical properties. As polymer binders, those that can be contained in the above-described thin film may be used.

The thickness of the organic semiconductor layer 2 is preferably 1 nm to 100 more preferably 2 nm to 1000 nm, still more preferably 3 nm to 500 nm, particularly preferably 5 nm to 200 nm.

The organic semiconductor layer 2 can be formed by applying the above-described method for forming the thin film. Specifically, in the production of an organic transistor, the thin film (organic semiconductor thin film) is formed on the surface on which the organic semiconductor layer 2 is to be formed (e.g., the substrate 1 or the insulating layer 3) by the above-described thin film forming method, thereby forming the organic semiconductor layer 2. When the organic semiconductor layer 2 is formed, a step of orienting the polymer compound contained in the thin film is preferably performed, because charge mobility is improved.

The insulating layer 3 in contact with the organic semiconductor layer 2 is acceptable if it is a material having good electrical insulation properties, and known materials can be used. Examples of the constituent materials for the insulating layer 3 include SiOx, SiNx, $Ta_2O_5$, polyimide, polyvinyl alcohol, polyvinyl phenol, organic glass and photoresists. Materials having a high dielectric constant are preferably used for the insulating layer 3, because this enables low voltage operation.

When the organic semiconductor layer 2 is formed on the insulating layer 3, it is also possible to treat the surface of the insulating layer 3 with a surface treating agent such as a silane coupling agent to improve interface characteristics between the insulating layer 3 and the organic semiconductor layer 2, thereby modifying the surface, and then form the organic semiconductor layer 2.

In the case of field effect organic transistors, charges generally pass through near the interface between the insulating layer 3 and the organic semiconductor layer 2. Accordingly, the condition of this interface greatly affects the mobility of the transistors. In this context, surface control by silane coupling agents is known as a method of improving this surface condition to improve characteristics (e.g., Journal of the Surface Science Society of Japan, Vol. 28. No. 5, pp. 242-248, 2007).

Silane coupling agents include alkylchlorosilanes (such as octyltrichlorosilane (OTS), octadecyltrichlorosilane (ODTS) and phenylethyltrichlorosilane), alkylalkoxysilanes, fluorinated alkylchlorosilanes, fluorinated alkylalkoxysilanes, and silylamine compounds such as hexamethyldisilazane (HMDS). It is also possible to treat the surface of the insulating layer 3 with ozone UV or $O_2$ plasma before treating with a surface treating agent.

Surface energy of a silicon oxide film or the like used as the insulating layer 3 can be controlled by such treatment. Orientation on the insulating layer 3 of the polymer compound forming the organic semiconductor layer 2 is improved by surface treatment, and this provides high charge mobility.

Materials such as metals such as gold, platinum, silver, copper, chromium, palladium, aluminum, indium, molybdenum, low resistance polysilicon and low resistance amorphous silicon; tin oxide, indium oxide and indium tin oxide (ITO) may be used as the gate electrode 4. These materials may be used singly or in a combination of two or more.

A heavily doped silicon substrate can also be used as the gate electrode 4. The heavily doped silicon substrate has properties as a gate electrode and properties as a substrate together. When such a gate electrode 4 also having properties as a substrate is used, the substrate 1 may be omitted in an organic transistor in which the substrate 1 is in contact with the gate electrode 4. For example, the above-described organic transistors of the third, fourth and seventh embodiments may have a configuration in which the gate electrode 4 also functions as the substrate 1.

The source electrode 5 and the drain electrode 6 are composed of a low resistance material, for example, gold, platinum, silver, copper, chromium, palladium, aluminum, indium or molybdenum. Among these, gold and platinum are preferable because charge injection properties are improved, and gold is still more preferable due to excellent processability in addition to the above reason. These materials may be used singly or in a combination of two or more.

Although several examples of the organic transistor of the present invention have been described, the organic transistor is not limited to the above embodiments. For example, a layer composed of a compound differing from the above-described polymer compound of the present invention may be interposed between the source electrode 5 and drain electrode 6 and the organic semiconductor layer 2. This might reduce contact resistance between the source electrode 5 and drain electrode 6 and the organic semiconductor layer 2 and further increase carrier mobility of the organic transistor.

Examples of such a layer include layers composed of the above-described low-molecular-weight compounds having electron or hole transport properties; alkali metals, alkaline earth metals and rare earth metals, and complexes of these metals with organic compounds; halogens such as iodine, bromine, chlorine and iodine chloride; sulfur oxide compounds such as sulfuric acid, anhydrous sulfuric acid, sulfur dioxide and sulfates; nitrogen oxide compounds such as nitric acid, nitrogen dioxide and nitrates; halogenated compounds such as perchloric acid and hypochlorous acid; and alkylthiol compounds and aromatic thiol compounds such as aromatic thiols and fluoroalkyl aromatic thiols.

After fabricating the organic transistor described above, a protective film is preferably formed on the organic transistor to protect the device. This blocks the organic transistor from the air and can suppress deterioration of characteristics of the organic transistor. When a display device driven on the organic transistor is formed, the protective film can also reduce the effect on the organic transistor in its formation process.

Examples of the method for forming the protecting film include methods of covering the organic transistor with an UV-curable resin, a thermosetting resin or an inorganic SiONx film. In order to effectively block from the air, the process after the organic transistor is fabricated and before the protective film is formed is preferably performed without exposure to the air (for example, in a dried nitrogen atmosphere or in vacuum).

(Planar Light Source and Display)

Next, the planar light source and the display using the organic transistor of the above-described embodiment will be described.

The planar light source and the display each comprise at least two organic transistors, i.e., a drive transistor and a switching transistor. The planar light source and the display of the present embodiment employs the above-described organic transistor of the present invention as at least one of these organic transistors.

Figure 8:
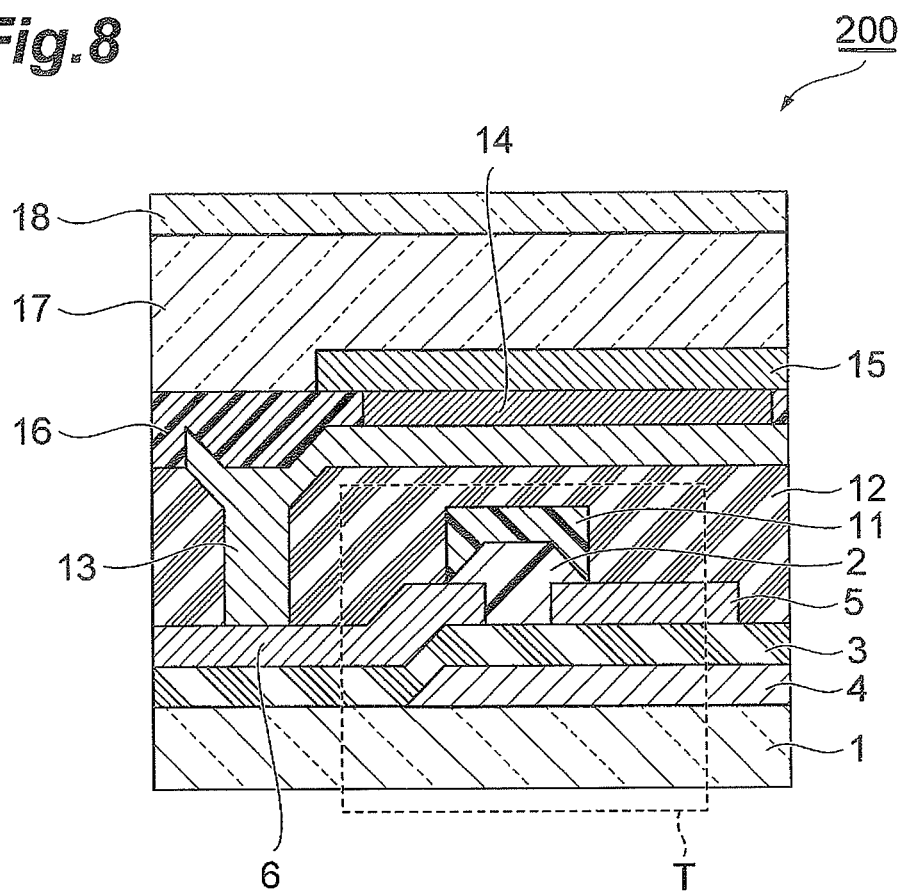
FIG. 8 is a schematic cross-sectional view of a planar light source according to an embodiment.

FIG. 8 is a schematic cross-sectional view of a planar light source according to a preferred embodiment. In a planar light source 200 shown in FIG. 8, an organic transistor T is formed by a substrate 1; a gate electrode 4 formed on the substrate 1; an insulating layer 3 formed on the substrate 1 to cover the gate electrode 4; a source electrode 5 and a drain electrode 6 formed on the insulating layer 3 at a predetermined interval between them to partially cover a region of the insulating layer 3 having the gate electrode 4 formed in its lower part; an organic semiconductor layer 2 formed on the insulating layer 3 to partially cover the source electrode 5 and the drain electrode 6; and a protective film 11 formed on the organic semiconductor layer 2 to cover the entire organic semiconductor layer 2.

In the planar light source 200, a lower electrode (anode) 13, a light-emitting device 14 and an upper electrode (cathode) 15 are sequentially stacked on the organic transistor T through an interlayer insulating film 12, and the lower electrode 13 and the drain electrode 6 are electrically connected to each other through a via hole provided in the interlayer insulating film 12. A bank 16 is provided around the lower electrode 13 and the light-emitting device 14. A substrate 18 is placed above the upper electrode 15, and the space between the upper electrode 15 and the substrate 18 is sealed with a sealing member 17.

In the planar light source 200 shown in FIG. 8, the organic transistor T functions as a drive transistor. In the planar light source 200 shown in FIG. 8, a switching transistor is omitted.

In the planar light source 200 according to the present embodiment, the above-described organic transistor of the present invention is used as the organic transistor T. Constituent members in known planar light sources can be used as constituent members other than the organic transistor T.

Transparent members are used as the upper electrode 15, sealing member 17 and substrate 18.

The planar light source 200 shown in FIG. 8 functions as a planar light source by using a white luminescent material for the light-emitting device 14, and can be provided as a color display by using a red luminescent material, a blue luminescent material and a green luminescent material for the light-emitting devices 14 and controlling driving of each light-emitting device.

Methods of achieving patterned light emission in the planar light source and the display include a method of locating a mask provided with a patterned window on the surface of a planar light-emitting device, a method of forming the part to be nonluminescent in the light-emitting layer forming a light-emitting device extremely thick to render this part substantially nonluminescent, and a method of forming an anode or a cathode or both electrodes in a patterned shape. A segment-type display device that can display numbers, characters, simple symbols and the like is realized by forming a pattern by any of these methods and placing several electrodes so that the electrodes can be independently turned on/off.

Further, to provide a dot matrix device, the anode and the cathode may both be formed in a stripe shape and placed perpendicular to each other. Partial color display or multi-color display is possible by a method of applying multiple types of luminescent materials emitting light with different colors to different areas or a method of using a color filter or a fluorescence conversion filter. The dot matrix device can be passively driven, or can also be actively driven in combination with TFT or the like. These display devices can be used as displays for computers, televisions, personal digital assistants, cellular phones, car navigation systems, video camera viewfinders and the like.

(Photoelectric Conversion Device)

The polymer compound of the present invention is also useful as an organic semiconductor layer for photoelectric conversion devices. Basic forms of photoelectric conversion devices include forms having a pair of electrodes at least one of which is transparent or semi-transparent; and a bulk heterojunction organic semiconductor layer or a p/n stacked organic semiconductor layer formed from an organic composition of an electron donating compound (p-type organic semiconductor) and an electron accepting compound (n-type organic semiconductor or the like). The above-described polymer compound of the present invention is contained in these organic semiconductor layers as at least one of the electron donating compound and the electron accepting compound.

In the photoelectric conversion device having such a configuration, light energy incident from the transparent or semi-transparent electrode is absorbed on the electron accepting compound and/or the electron donating compound to generate excitons by coulomb coupling between electrons and holes. Once the excitons generated in this manner are moved to reach the heterojunction interface at which the electron accepting compound and the electron donating compound are adjacent to each other, electrons and holes are separated from each other by the difference in HOMO energy level value and LUMO energy level value between the respective compounds at the interface, resulting in generation of charges that can be independently moved. The respective charges generated are then moved to the respective electrodes, so that the charges can be extracted as electric energy (current) to the outside. Photoelectric conversion devices having an organic semiconductor layer including the above-described polymer compound of the present invention provide excellent photocarrier generation efficiency, because mobility of the polymer compound is high.

Figure 10:
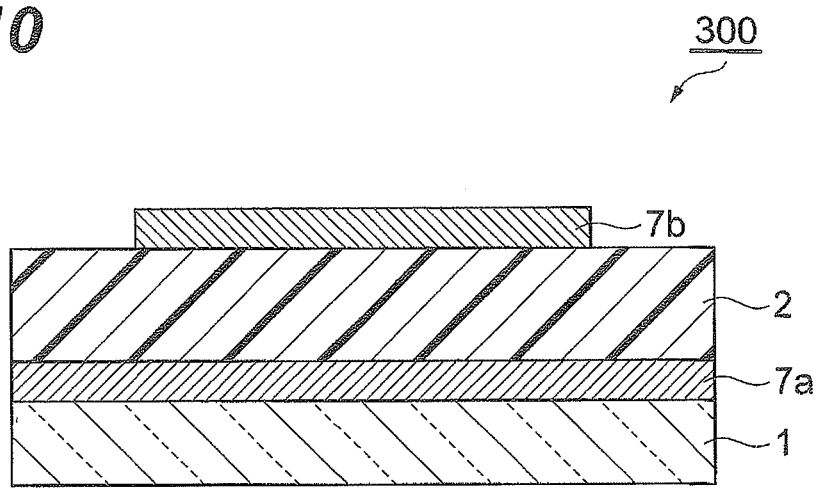
FIG. 10 is a schematic cross-sectional view of a photoelectric conversion device according to an embodiment.

FIG. 10 is a schematic cross-sectional view showing a photoelectric conversion device according to a preferred embodiment. A photoelectric conversion device 300 shown in FIG. 10 comprises a substrate 1; an anode 7a formed on the substrate 1; an organic semiconductor layer 2 composed of an organic thin film formed on the anode 7a; and a cathode 7b formed on the organic semiconductor layer 2. The organic semiconductor layer 2 includes an electron donating compound and an electron accepting compound, at least one of which is the above-described polymer compound of the present invention.

The anode 7a, the organic semiconductor layer 2 and the electron donating compound and the electron accepting compound forming it, the cathode 7b, and other components formed as necessary, which form the photoelectric conversion device 300, will be described below in detail.

<Substrate>

The photoelectric conversion device usually has a configuration in which each layer is formed on the substrate. The substrate 1 is acceptable if electrodes can be formed and it is not chemically changed when organic material layers are formed. Examples of the material for the substrate 1 include glass, plastics, polymer films and silicon. When the substrate 1 is non-transparent, the opposite electrode (i.e., the electrode distal from the substrate) is preferably transparent or semi-transparent.

<Electrodes (Anode and Cathode)>

At least one of the electrodes (anode 7a and cathode 7b) is composed of a transparent or semi-transparent electrode material. Transparent or semi-transparent electrode materials include conductive metal oxide films and semi-transparent metal thin films. Specifically, films fabricated using conductive materials such as indium oxide, zinc oxide and tin oxide and their composites, indium tin oxide (ITO) and indium zinc oxide (IZO) and NESA; gold, platinum, silver, copper, and the like are used. In particular, ITO, indium zinc oxide and tin oxide are preferred.

When any one of the electrodes (anode 7a and cathode 7b) is transparent or semi-transparent, the other does not have to be transparent. Metals, conductive polymers and the like can be used as materials for such electrodes. Specific examples of electrode materials include metals such as lithium, sodium, potassium, rubidium, cesium, magnesium, calcium, strontium, barium, aluminum, scandium, vanadium, zinc, yttrium, indium, cerium, samarium, europium, terbium and ytterbium, and alloys of two or more of them, or alloys of one or more of the above metals and one or more metals selected from the group consisting of gold, silver, platinum, copper, manganese, titanium, cobalt, nickel, tungsten and tin; graphite, intercalated graphite, polyaniline and derivatives thereof, and polythiophene and derivatives thereof. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

Methods for fabricating these electrodes include vacuum deposition, sputtering, ion plating and plating. Organic transparent conductive films of polyaniline and derivatives thereof, polythiophene and derivatives thereof, and the like may also be used as electrode materials. The transparent or semi-transparent electrode may be an anode or cathode.

<Organic Semiconductor Layer>

The organic semiconductor layer contained in the photoelectric conversion device includes the above-described polymer compound of the present invention as at least one of the electron donating compound and the electron accepting compound. The electron donating compound and the electron accepting compound are relatively determined from the HOMO energy level values or LUMO energy level values of these compounds.

The polymer compounds of the present invention and low-molecular-weight or polymer compounds other than them can be used as electron donating compounds. Examples of the electron donating compounds other than the polymer compounds of the present invention include pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having aromatic amines in the side chains or main chains, polyaniline and derivatives thereof, polythiophene and derivatives thereof, polymer compounds having thiophene as a partial backbone, polypyrrole and derivatives thereof, polyphenylenevinylene and derivatives thereof, and polythienylenevinylene and derivatives thereof. The above-described polymer compounds of the present invention are particularly preferred as electron donating compounds.

The electron donating compounds other than the polymer compounds of the present invention are preferably polythiophenes (including polythiophene and derivatives thereof) which may have a substituent; polymer compounds having a structure including a thiophene dimer to pentamer or a structure including a thiophene derivative dimer to pentamer; and polymer compounds having thiophene as a partial backbone. In particular, polythiophene and derivatives thereof are more preferred. Here, polythiophene derivatives refer to polymer compounds that have a thiophenediyl group having a substituent.

Polythiophene and derivatives thereof are preferably homopolymers. In this case, homopolymers refer to polymers formed by bonding to each other only a plurality of groups selected from the group consisting of thiophenediyl groups and thiophenediyl groups having a substituent. The thiophenediyl group is preferably a thiophene-2,5-diyl group, and the thiophenediyl group having a substituent is preferably an alkylthiophene-2,5-diyl group.

Specific examples of polythiophene and derivatives thereof that are homopolymers include poly(3-hexylthiophene-2,5-diyl) (P3HT), poly(3-octylthiophene-2,5-diyl), poly(3-dodecylthiophene-2,5-diyl) and poly(3-octadecylthiophene-2,5-diyl). Among polythiophene and derivatives thereof that are homopolymers, polythiophene homopolymers composed of thiophenediyl groups substituted with an alkyl group having 6 to 30 carbon atoms are preferred.

Examples of the polymer compound having thiophene as a partial backbone include a polymer compound represented by the formula (11). In the formula (11), n represents the number of repetitions.

[Chemical Formula 34]

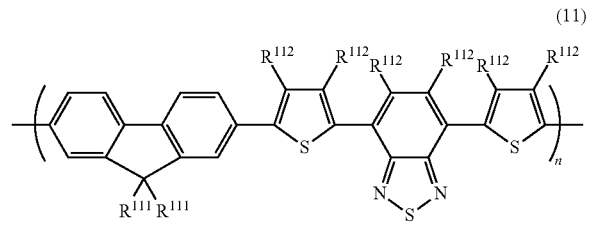

(11)

In the formula (11), $R^{111}$ and $R^{112}$ are identical or different and each represent a hydrogen atom or a substituent. A plurality of $R^{111}$s and $R^{112}$s present may be identical or different, respectively. The substituent represented by $R^{111}$ and $R^{112}$ is preferably an alkoxy group having 1 to 20 carbon atoms or an alkyl group having 1 to 20 carbon atoms.

In particular, the polymer compound represented by the formula (11) is preferably a polymer compound wherein $R^{111}$ is an alkyl group and $R^{112}$ is a hydrogen atom. Such a polymer compound is represented by the formula (11-1).

[Chemical Formula 35]

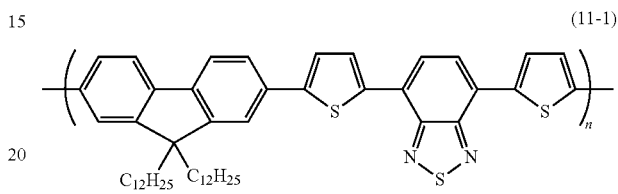

(11-1)

On the other hand, examples of the electron accepting compounds include, in addition to the above-described polymer compounds of the present invention, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ fullerene, and derivatives thereof, phenanthrene derivatives such as bathocuproine, metal oxides such as titanium oxide, and carbon nanotubes.

Preferred electron accepting compounds include, in addition to the polymer compounds of the present invention, compounds containing a benzothiadiazole structure, polymer compounds containing a benzothiadiazole structure in the repeating unit, compounds containing a quinoxaline structure, polymer compounds containing a quinoxaline structure in the repeating unit, titanium oxide, carbon nanotubes, fullerenes and fullerene derivatives. In particular, fullerenes, fullerene derivatives, compounds containing a benzothiadiazole structure, polymer compounds containing a benzothiadiazole structure in the repeating unit, compounds containing a quinoxaline structure, and polymer compounds containing a quinoxaline structure in the repeating unit are more preferred, compounds containing a benzothiadiazole structure, polymer compounds containing a benzothiadiazole structure in the repeating unit, compounds containing a quinoxaline structure, and polymer compounds containing a quinoxaline structure in the repeating unit are still more preferred, and polymer compounds containing a benzothiadiazole structure in the repeating unit and polymer compounds containing a quinoxaline structure in the repeating unit are especially preferred.

Examples of the polymer compound containing a benzothiadiazole structure in the repeating unit include a polymer compound represented by the formula (11) which is illustrated as the above electron donating compound, with a polymer compound represented by the formula (11-1) being preferred. Specifically, depending on the combination with the compound used as the electron donating compound, the polymer compound represented by the formula (11) can also be used as the electron accepting compound.

Preferred n-type semiconductors as electron accepting compounds include fullerenes and fullerene derivatives. Here, the fullerene derivative refers to a compound in which at least part of a fullerene is modified. Examples of fullerenes include $C_{60}$ fullerene, $C_{70}$ fullerene, $C_{76}$ fullerene, $C_{78}$ fullerene and $C_{84}$ fullerene, and fullerene derivatives include derivatives of those fullerenes.

Specific examples of $C_{60}$ fullerene derivatives include compounds represented by the following formulas.

[Chemical Formula 36]

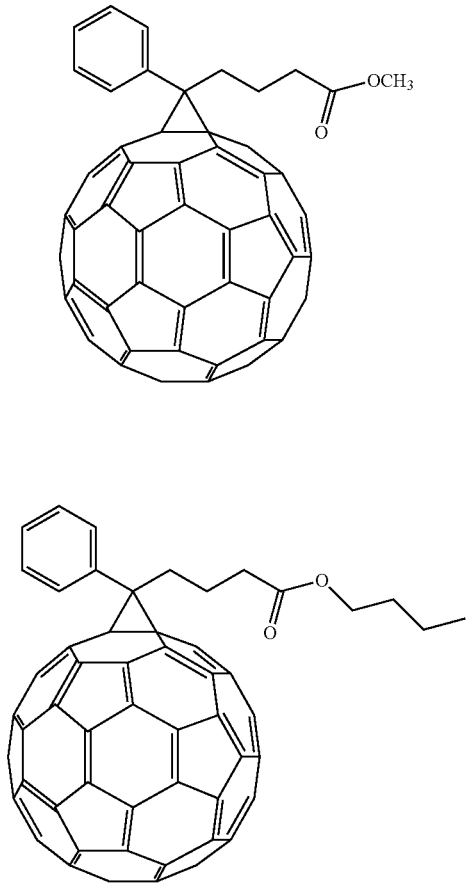

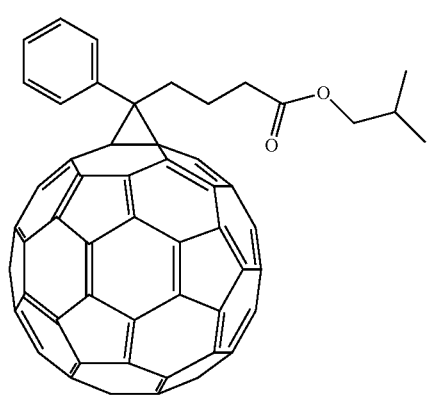

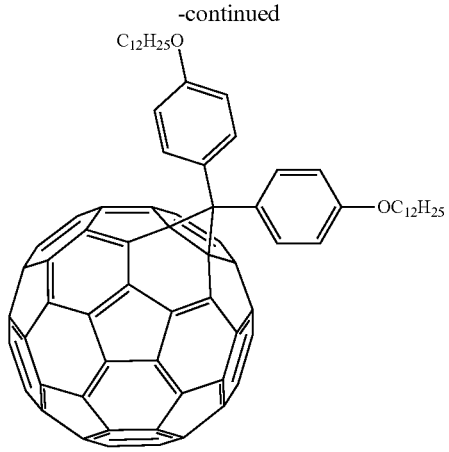

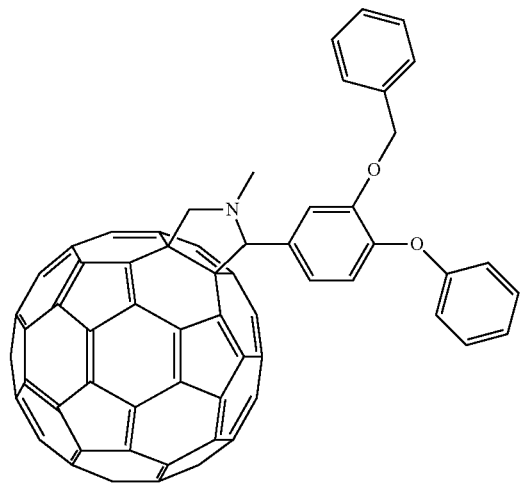

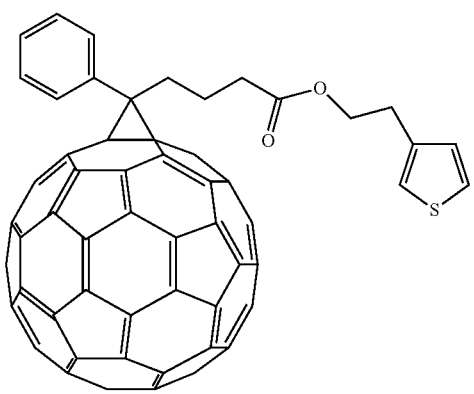

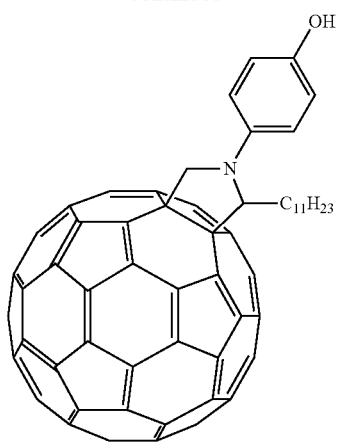

Specific examples of C<sub>70</sub> fullerene derivatives include compounds represented by the following formulas.

[Chemical Formula 37]

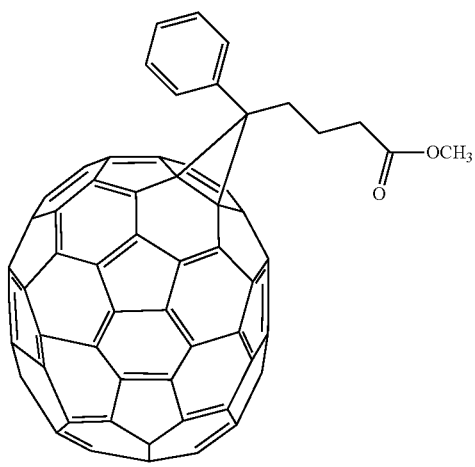

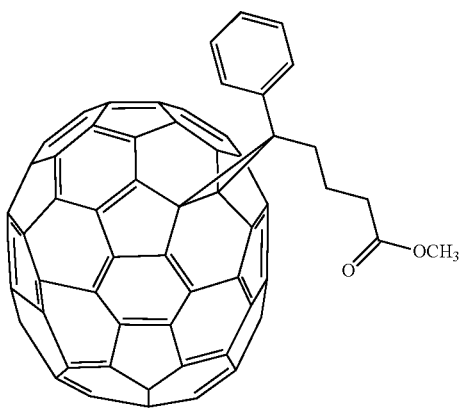

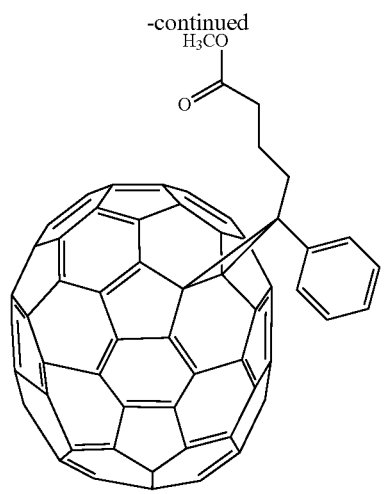

Examples of other fullerene derivatives include [6,6]-phenyl C61 butyric acid methyl ester (C60PCBM), [6,6]-phenyl C71 butyric acid methyl ester (C70PCBM), [6,6]-phenyl C85 butyric acid methyl ester (C84PCBM) and [6,6]-thienyl C61 butyric acid methyl ester.

In the organic semiconductor layer 2, the content proportion of the electron accepting compound is preferably 10 to 1000 parts by weight, more preferably 20 to 500 parts by weight, based on 100 parts by weight of the electron donating compound. The thickness of the organic semiconductor layer 2 is preferably 1 nm to 100 μm, more preferably 2 nm to 1000 nm, still more preferably 5 nm to 500 nm, particularly preferably 20 nm to 200 nm.

Preferred combinations of the electron donating compound and the electron accepting compound included in the organic semiconductor layer 2 are a combination of the polymer compound of the present invention and a fullerene derivative and a combination of the polymer compounds of the present invention. In the latter case, the polymer compounds which are the electron donating compound and the electron accepting compound, respectively, are a combination of the polymer compound providing HOMO suitable for the electron donating compound and the polymer compound providing LUMO suitable for the electron accepting compound.

The organic semiconductor layer 2 may also contain components other than above as necessary in order to exhibit various functions. Examples of the components other than above include UV absorbers, antioxidants, sensitizers for sensitizing functions to generate charges by absorbed light, and light stabilizers for increasing stability against ultraviolet rays.

It is effective to add components forming the organic semiconductor layer 2 other than the electron donating compound and the electron accepting compound in a proportion of 5 parts by weight or less, particularly 0.01 to 3 parts by weight, respectively, based on 100 parts by weight of the total amount of the electron donating compound and the electron accepting compound, because high charge mobility is provided while ensuring the effects of the respective components.

The organic semiconductor layer 2 may include a polymer compound other than the electron donating compound and the electron accepting compound as a polymer binder to improve mechanical properties. As polymer binders, those that do not interfere with charge transport properties or hole transport properties and those that do not strongly absorb visible light are preferably used.

Polymer binders include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride and polysiloxane.

The organic semiconductor layer 2 having the above-described configuration can be formed by film formation using a solution containing the electron donating compound, the electron accepting compound and other components added as necessary, if it is a bulk heterojunction layer, for example. For example, the organic semiconductor layer 2 can be formed by applying this solution onto the anode 7a or the cathode 7b.

The solvent in film formation using a solution is acceptable if it can dissolve the above-described electron donating compound and electron accepting compound, and a plurality of solvents may be mixed. Examples of the solvent include unsaturated hydrocarbon solvents such as toluene, xylene, mesitylene, tetralin, decalin, bicyclohexyl, n-butylbenzene, sec-butylbenzene and tert-butylbenzene, halogenated saturated hydrocarbon solvents such as carbon tetrachloride, chloroform, dichloromethane, dichloroethane, dichloropropane, chlorobutane, bromobutane, chloropentane, bromopentane, chlorohexane, bromohexane, chlorocyclohexane and bromocyclohexane, halogenated unsaturated hydrocarbon solvents such as chlorobenzene, dichlorobenzene and trichlorobenzene, and ether solvents such as tetrahydrofuran and tetrahydropyran. The material forming the organic semiconductor layer 2 can be dissolved in the above solvent at 0.1 wt % or more, for example.

Coating such as spin coating, casting, microgravure coating, gravure coating, bar coating, roll coating, wire bar coating, dip coating, spray coating, screen printing, gravure printing, flexographic printing, offset printing, inkjet printing, dispenser printing, nozzle coating and capillary coating can be used for film formation of the organic semiconductor layer 2. In particular, spin coating, flexographic printing, gravure printing, inkjet printing and dispenser printing are preferred.

<Other Layers>

The photoelectric conversion device 300 may utilize, in addition to the above-described substrate 1, electrodes (anodes 7a and 7b) and organic semiconductor layer 2, additional intermediate layers other than the organic semiconductor layer 2 (such as a buffer layer and a charge transport layer) in order to improve photoelectric conversion efficiency. Such an intermediate layer can be formed between the anode 7a and the organic semiconductor layer 2 or between the cathode 7b and the organic semiconductor layer 2, for example.

Materials used for the intermediate layers include alkali metal or alkaline earth metal halides or oxides such as lithium fluoride. Fine particles of inorganic semiconductors such as titanium oxide; a mixture of PEDOT (poly(3,4-ethylenedioxythiophene)) and PSS (poly(4-styrenesulfonate)) (PEDOT:PSS); and the like can also be used for the intermediate layers.

(Devices Using the Photoelectric Conversion Device)

The above-described photoelectric conversion device 300 is irradiated with light such as sunlight from the side of the transparent or semi-transparent electrode (anode 7a or cathode 7b), so that it can generate photovoltaic power between these electrodes and can be operated as an organic thin film solar cell device. A solar cell module can be formed by integrating a plurality of such organic thin film solar cell devices.

The photoelectric conversion device 300 can also be operated as an organic light sensor, because photocurrent flows through the device by allowing light to be incident from the transparent or semi-transparent electrode with voltage applied between the electrodes (anode 7a and cathode 7b) or with voltage not applied. It is also possible to integrate a plurality of such organic light sensors to use them as an organic image sensor.

<Solar Cell Module>

Organic thin film solar cells using the photoelectric conversion devices of the present invention can have basically the same module structure as in conventional solar cell modules. Specifically, solar cell modules include those having a structure in which cells (e.g., the photoelectric conversion devices of the above embodiment) are formed on a support substrate such as a metal or ceramic substrate and the top is covered with a filled resin, cover glass or the like, and light is collected from the opposite side of the support substrate. A structure is also possible in which a transparent material such as tempered glass is used as a support substrate and cells are formed thereon, so that light is collected from the side of the transparent support substrate.

Module structures called superstraight-type, substraight-type and potting-type; substrate-integrated module structures used in amorphous silicon solar cells or the like; and the like are known as solar cell modules. These module structures can also be selected for organic thin film solar cells using the photoelectric conversion devices of the present invention depending on the purpose of use, the place of use, the use environment and the like.

Representative superstraight-type or substraight-type modules are structured to extract the generated power to the outside by having a configuration in which cells (photoelectric conversion devices) are placed at certain intervals between them on a support substrate whose one side or both sides are transparent and subjected to antireflection treatment, adjacent cells are connected to each other by a metal lead, a flexible wiring or the like, and collecting electrodes are placed on the outer periphery. Various types of plastic materials such as ethylene vinyl acetate (EVA) may be used as films or filled resins between the substrate and the cells depending on the purpose in order to protect the cells and improve collection efficiency. When the modules are used in a condition where it is not necessary to cover the surface with a hard material, for example, in a place where impacts from the outside rarely occur, the support substrate on one side can be omitted by forming the surface protective layer using a transparent plastic film or curing the filled resin to impart a protective function.

In such solar cell modules, the periphery of the support substrate is fixed by a frame made of a metal in a sandwich shape in order to ensure tight sealing of the inside and rigidity of the modules, and the space between the support substrate and the frame may be tightly sealed with a sealing material. Solar cells can also be formed on a curved surface if flexible materials are used for the cells themselves, support substrate, filling material and sealing material.

For example, in the case of solar cells using flexible supports such as polymer films, the body of the solar cells can be fabricated by forming cells sequentially while feeding a roll-shaped support; cutting the support to a desired size; and then sealing the periphery with a flexible, moisture-proof material. It is also possible to provide a module structure called "SCAF" described in Solar Energy Materials and Solar Cells, 48, p. 383-391. Solar cells using flexible supports can also be adhesively fixed to curved glass or the like and used.

EXAMPLES

The present invention will be described in more detail below with reference to examples; however, the present invention is not limited to these examples.

[Number Average Molecular Weight and Weight Average Molecular Weight]

In the following examples, the polystyrene-reduced number average molecular weight of the polymer compound (polymer) was determined by GPC manufactured by Shimadzu Corporation (trade name: LC-10Avp) (hereinafter called "LC-10Avp") or GPC manufactured by GPC Laboratory (trade name: PL-GPC2000) (hereinafter called "PL-GPC2000").

When measured in LC-10Avp, the polymer was dissolved in tetrahydrofuran (THF) at a concentration of about 0.5 wt % and injected into GPC at 50 µL. Tetrahydrofuran was used as the mobile phase for GPC and allowed to flow at a flow rate of 0.6 mL/min. Two TSKgel SuperHM-H columns (manufactured by Tosoh) and one TSKgel SuperH2000 column (manufactured by Tosoh) were connected in series as columns. A differential refractometer (manufactured by Shimadzu, trade name: RID-10A) was used as the detector.

On the other hand, when measured in PL-GPC2000, the polymer was dissolved in o-dichlorobenzene at a concentration of about 1 wt %. o-Dichlorobenzene was used as the mobile phase for GPC and allowed to flow at a measurement temperature of 140° C. and a flow rate of 1 mL/min. Three PLGEL 10 µm MIXED-B columns (manufactured by PL Laboratory) were connected in series as columns.

Synthesis of Intermediate Compounds

Synthetic Example 1

In a nitrogen atmosphere, naphtho[1,2-b:5,6-b']dithiophene (0.50 g, 2.08 mmol) was dissolved in tetrahydrofuran (50 ml) and the solution was cooled to −78° C., after which a 1.59 M solution of n-BuLi in tetrahydrofuran (4 ml, 6.36 mmol) was added dropwise. This solution was warmed to room temperature, stirred for 30 minutes and then cooled to −78° C., and trimethyltin chloride (1.66 g, 8.34 mmol) was added. This solution was warmed to room temperature and stirred for 12 hours.

Water (50 ml) was added to the resulting reaction solution which was extracted with methylene chloride (30 ml×3), and the organic layer was washed with brine (30 ml×3). Thereafter, the organic layer was dried over anhydrous magnesium sulfate and filtered, and the solvent was then distilled off under reduced pressure. The resulting solid was recrystallized from acetone to provide a compound represented by the following formula (31) (compound (31)) (0.88 g) as white crystals. This reaction is as shown in the following reaction formula.

[Chemical Formula 38]

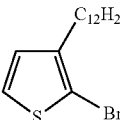

Synthetic Example 2

Chlorobenzene (20 ml) was degassed for 30 minutes in a nitrogen atmosphere. Pd$_2$(dba)$_3$.CHCl$_3$ (4 mg, 0.004 mmol, 2 mol %), P(o-tolyl)$_3$ (5 mg, 0.016 mmol, 8 mol %), 2-bromo-3-dodecylthiophene (188 mg, 0.5 mmol) and the above compound (31) (114 mg, 0.2 mmol) were added to the chlorobenzene, and the mixture was stirred with refluxing for three hours. "dba" represents dibenzylideneacetone (hereinafter the same).

Water (50 ml) was added to the resulting reaction solution which was extracted with methylene chloride (30 ml×3), and the organic layer was washed with brine (30 ml×3). Thereafter, the organic layer was dried over anhydrous magnesium sulfate and filtered, and the solvent was then distilled off under reduced pressure. The resulting solid was purified by silica gel column chromatography with hexane as the mobile phase to provide a compound represented by the following formula (32) (compound (32)) (148 mg) as a yellow solid. This reaction is as shown in the following reaction formula.

[Chemical Formula 39]

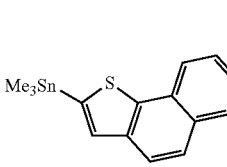

Subsequently, the resulting compound (32) (141 mg, 0.19 mmol) was dissolved in tetrahydrofuran (7 ml), and N-bromosuccinimide (NBS) (68 mg, 0.38 mmol) was added thereto. This solution was stirred at 40° C. for six hours, and water and dichloromethane were then added, and the organic layer was washed with brine (100 ml×3). Thereafter, the organic layer was dried over anhydrous magnesium sulfate and filtered, and the solvent was then distilled off under reduced pressure. The resulting solid was separated and purified by silica gel column chromatography with hexane as the mobile phase to provide a compound represented by the following formula (33) (compound (33)) (186 mg) as a yellow solid. This reaction is as shown in the following reaction formula.

[Chemical Formula 40]

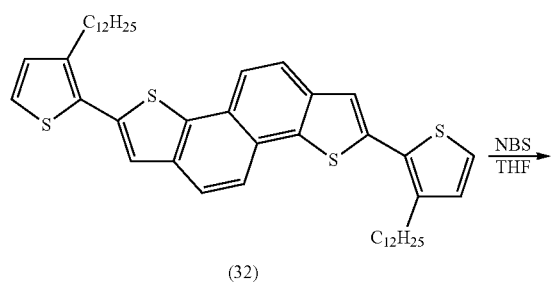

(32)

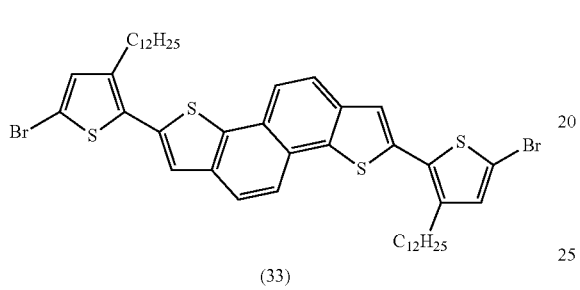

(33)

Synthetic Example 3

In a nitrogen atmosphere, naphtho[1,2-b:5,6-b']dithiophene (0.50 g, 2.08 mmol) was dissolved in tetrahydrofuran (50 ml) and the solution was cooled to −78° C., after which a 1.59 M solution of n-BuLi in tetrahydrofuran (4 ml, 6.36 mmol) was added dropwise. This solution was warmed to room temperature, stirred for 30 minutes and then cooled to −78° C., and 1,2-dibromotetrachloroethane (6.51 g, 20 mmol) was added. This solution was warmed to room temperature and stirred for 12 hours.

1 N hydrochloric acid (50 ml) was added to the resulting reaction solution which was extracted with methylene chloride (30 ml×3), and the organic layer was washed with brine (30 ml×3). Thereafter, the organic layer was dried over anhydrous magnesium sulfate and filtered, and the solvent was then distilled off under reduced pressure. The resulting solid was recrystallized from acetone to provide a compound represented by the following formula (34) (compound (34)) as brown crystals (0.58 g). This reaction is as shown in the following reaction formula.

[Chemcial Formula 41]

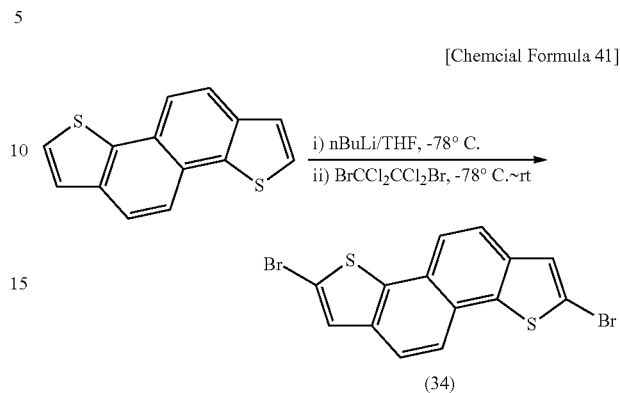

(34)

Example 1

Synthesis of Polymer Compound P1

Chlorobenzene (20 ml) was degassed for 30 minutes in a nitrogen atmosphere. $Pd_2(dba)_3 \cdot CHCl_3$ (4 mg, 0.004 mmol, 2 mol %), P(o-tolyl)$_3$ (5 mg, 0.016 mmol, 8 mol %), 5,5'-dibromo-4,4'-didodecyl-2,2'-bithiophene (132 mg, 0.2 mmol) and the compound (31) obtained in Synthetic Example 1 (114 mg, 0.2 mmol) were added to the chlorobenzene, and the mixture was stirred with refluxing for three days.

The resulting reaction solution was poured into a mixed solution of methanol (200 ml) and hydrochloric acid (5 ml) and stirred for three hours. The precipitate was collected by filtration and sequentially heated and washed with methanol and hexane, followed by extraction with chloroform. The resulting chloroform solution was concentrated, the solution was poured into methanol, and the precipitate was collected by filtration to provide a polymer compound represented by the following formula P1 (polymer compound P1) (106 mg) as a red solid. The polystyrene-reduced number average molecular weight of the polymer compound P1 was $7.1×10^3$, and the polystyrene-reduced weight average molecular weight of the polymer compound P1 was $1.3×10^4$. This reaction is as shown in the following reaction formula. In the formula, n represents the number of repeating units.

[Chemical Formula 42]

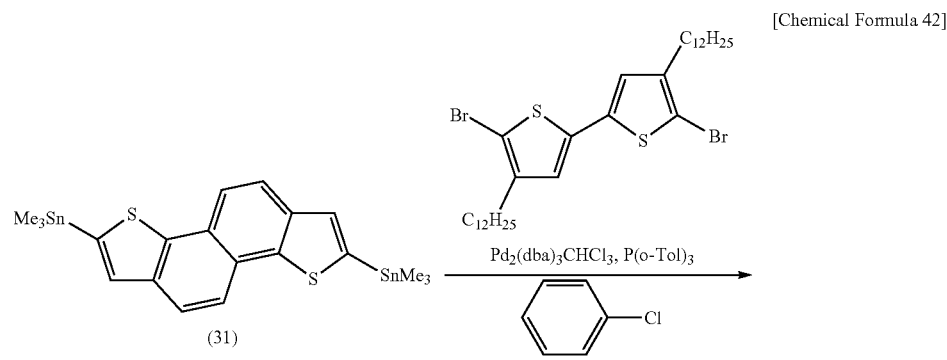

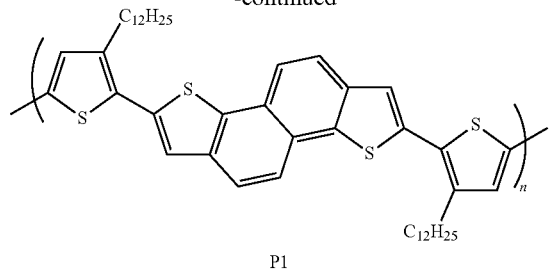

P1

(Evaluation of Polymer Compound P1: Organic Transistor)

Figure 9:
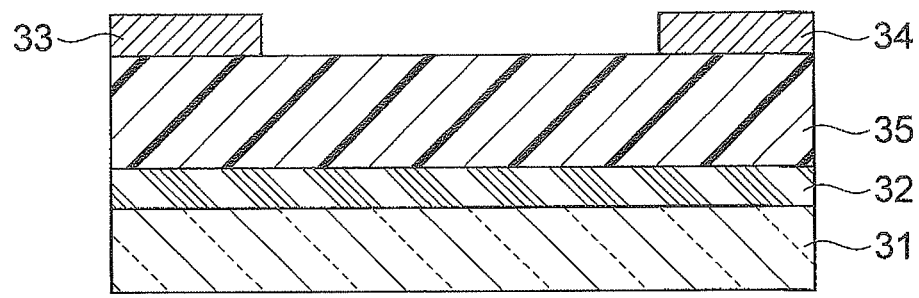
FIG. 9 is a schematic cross-sectional view of an organic transistor fabricated in Examples.

An organic transistor shown in FIG. 9 was fabricated using the polymer compound P1, and its transistor characteristics were measured. Specifically, first, the surface of a heavily doped n-type silicon substrate 31 to be a gate electrode was thermally oxidized to form a 200 nm silicon oxide film 32. This substrate was sufficiently washed, and the substrate surface was then silane-treated with hexamethylenedisilazane (HMDS).

The polymer compound P1 was then dissolved in o-dichlorobenzene to prepare a 3 g/L solution which was filtered through a membrane filter. Using the resulting solution, an about 30 nm thin film containing the polymer compound P1 (organic semiconductor layer 35) was formed on the above surface-treated substrate by spin coating. This thin film was heated at 150° C. for 30 minutes in a nitrogen atmosphere. A source electrode 33 and a drain electrode 34 having a channel length of 50 µm and a channel width of 1.5 mm were fabricated on the resulting thin film by vacuum deposition to provide an organic transistor.

The transistor characteristics of this organic transistor were measured by changing the gate voltage Vg between 40 and −80 V and the source-drain voltage Vsd between 0 and −80 V. As a result, a drain current of 0.011 mA was provided as a transfer characteristic at Vg=−60 V and Vsd=−80 V. The field effect mobility was calculated to be $1.2 \times 10^{-2}$ cm$^2$/Vs from this result.

Example 2

Synthesis of Polymer Compound P2

Chlorobenzene (20 ml) was degassed for 30 minutes in a nitrogen atmosphere. Pd$_2$(dba)$_3$.CHCl$_3$ (4 mg, 0.004 mmol, 2 mol %), P(o-tolyl)$_3$ (5 mg, 0.016 mmol, 8 mol %), 5,5'-dibromo-4,4'-dihexadecyl-2,2'-bithiophene (155 mg, 0.2 mmol) and the compound (31) obtained in Synthetic Example 1 (114 mg, 0.2 mmol) were added to the chlorobenzene, and the mixture was stirred with refluxing for three days.

The resulting reaction solution was poured into a mixed solution of methanol (200 ml) and hydrochloric acid (5 ml) and stirred for three hours. The precipitate was collected by filtration and sequentially heated and washed with methanol, hexane and chloroform, followed by extraction with chlorobenzene. The resulting chlorobenzene solution was concentrated, the solution was poured into methanol, and the precipitate was collected by filtration to provide a polymer compound represented by the following formula P2 (polymer compound P2) (83 mg) as a red solid. The polystyrene-reduced number average molecular weight of the polymer compound P2 was $2.9 \times 10^4$, and the polystyrene-reduced weight average molecular weight of the polymer compound P2 was $4.6 \times 10^4$. This reaction is as shown in the following reaction formula. In the formula, n represents the number of repeating units.

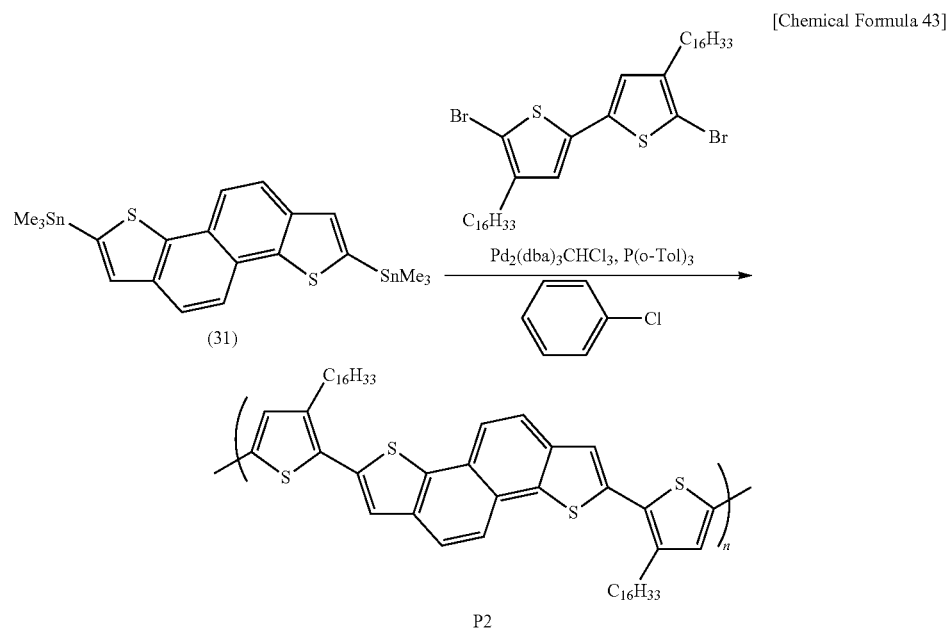

[Chemical Formula 43]

(Evaluation of Polymer Compound P2: Organic Transistor)

An organic transistor shown in FIG. 9 was fabricated using the polymer compound P2, and its transistor characteristics were measured. Specifically, first, the surface of a heavily doped n-type silicon substrate 31 to be a gate electrode was thermally oxidized to form a 200 nm silicon oxide film 32. This substrate was sufficiently washed, and the substrate surface was then silane-treated with hexamethylenedisilazane (HMDS).

The polymer compound P2 was then dissolved in o-dichlorobenzene to prepare a 3 g/L solution which was filtered through a membrane filter. Using the resulting solution, an about 30 nm thin film containing the polymer compound P2 (organic semiconductor layer 35) was formed on the above surface-treated substrate by spin coating. This thin film was heated at 150° C. for 30 minutes in a nitrogen atmosphere. A source electrode 33 and a drain electrode 34 having a channel length of 50 μm and a channel width of 1.5 mm were fabricated on the resulting thin film by vacuum deposition to provide an organic transistor.

The transistor characteristics of this organic transistor were measured by changing the gate voltage Vg between 40 and −80 V and the source-drain voltage Vsd between 0 and −80 V. As a result, a drain current of 0.5 mA was provided as a transfer characteristic at Vg=−60 V and Vsd=−80 V. The field effect mobility was calculated to be $5.4 \times 10^{-1}$ cm$^2$/Vs from this result.

Example 3

Synthesis of Polymer Compound P3

Chlorobenzene (20 ml) was degassed for 30 minutes in a nitrogen atmosphere. Pd$_2$(dba)$_3$.CHCl$_3$ (4 mg, 0.004 mmol, 2 mol %), P(o-tolyl)$_3$ (5 mg, 0.016 mmol, 8 mol %), 5,5'-dibromo-4,4'-diethylhexyl-2,2'-bithiophene (112 mg, 0.2 mmol) and the compound (31) obtained in Synthetic Example 1 (114 mg, 0.2 mmol) were added to the chlorobenzene, and the mixture was stirred with refluxing for three days.

The resulting reaction solution was poured into a mixed solution of methanol (200 ml) and hydrochloric acid (5 ml) and stirred for three hours. The precipitate was collected by filtration and sequentially heated and washed with methanol and hexane, followed by extraction with chloroform. The resulting chloroform solution was concentrated, the solution was poured into methanol, and the precipitate was collected by filtration to provide a polymer compound represented by the following formula P3 (polymer compound P3) (106 mg) as a red solid. The polystyrene-reduced number average molecular weight of the polymer compound P3 was $3.7 \times 10^3$, and the polystyrene-reduced weight average molecular weight of the polymer compound P3 was $5.1 \times 10^3$. This reaction is as shown in the following reaction formula. In the formula, n represents the number of repeating units.

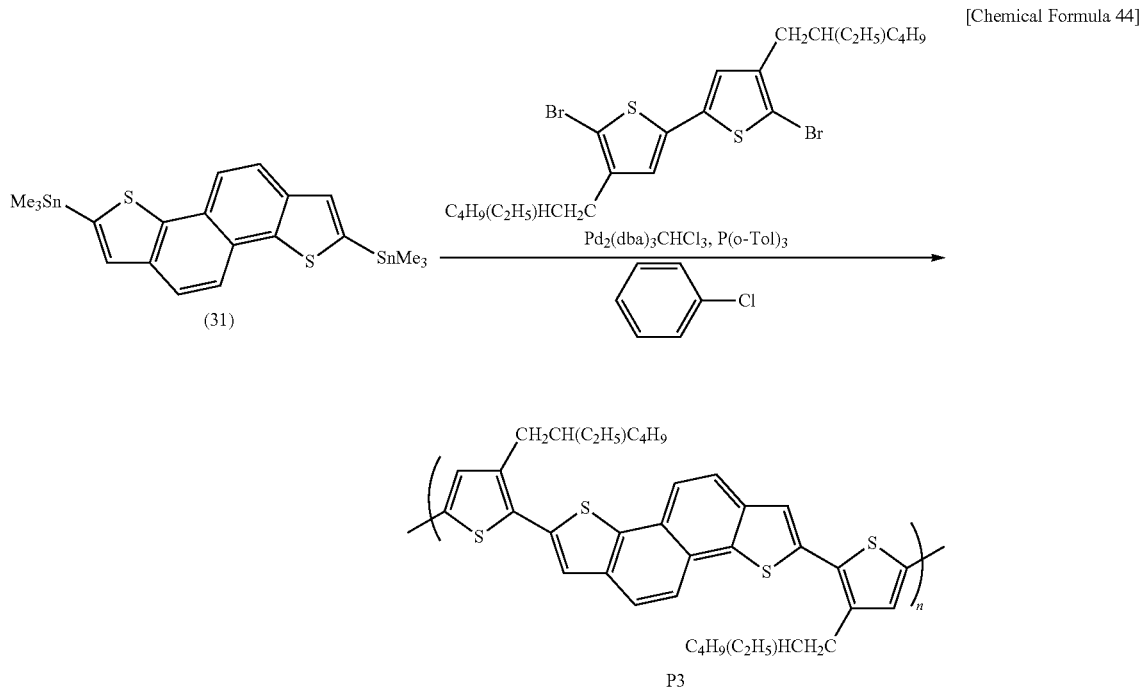

[Chemical Formula 44]

(Evaluation of Polymer Compound P3: Organic Transistor)

An organic transistor shown in FIG. 9 was fabricated using the polymer compound P3, and its transistor characteristics were measured. Specifically, first, the surface of a heavily doped n-type silicon substrate 31 to be a gate electrode was thermally oxidized to form a 200 nm silicon oxide film 32. This substrate was sufficiently washed, and the substrate surface was then silane-treated with hexamethylenedisilazane (HMDS).

The polymer compound P3 was then dissolved in chloroform to prepare a 1 g/L solution which was filtered through a membrane filter. Using the resulting solution, an about 30 nm thin film containing the polymer compound P3 (organic semiconductor layer 35) was formed on the above surface-treated substrate by drop casting. A source electrode 33 and a drain electrode 34 having a channel length of 50 μm and a channel width of 1.5 mm were fabricated on the resulting thin film by vacuum deposition to provide an organic transistor.

The transistor characteristics of this organic transistor were measured by changing the gate voltage Vg between 40 and −80 V and the source-drain voltage Vsd between 0 and −80 V. As a result, a drain current of 0.5 μA was provided as a transfer characteristic at Vg=−60 V and Vsd=−80 V. The field effect mobility was calculated to be $5.0 \times 10^{-5}$ cm$^2$/Vs from this result.

Example 4

Synthesis of Polymer Compound P4

Chlorobenzene (8 ml) was degassed for 30 minutes in a nitrogen atmosphere. Pd$_2$(dba)$_3$·CHCl$_3$ (2 mg, 0.002 mmol, 2 mol %), P(o-tolyl)$_3$ (3 mg, 0.008 mmol, 8 mol %), 5,5'-bis(trimethylstannyl)-4,4'-didodecylhexyl-2,2'-bithiophene (100 mg, 0.12 mmol) and the compound (33) obtained in Synthetic Example 2 (102 mg, 0.11 mmol) were added to the chlorobenzene, and the mixture was stirred with refluxing for three days.

The resulting reaction solution was poured into a mixed solution of methanol (200 ml) and hydrochloric acid (5 ml) and stirred for three hours. The precipitate was collected by filtration and sequentially heated and washed with methanol and hexane, followed by extraction with chloroform. The resulting chloroform solution was concentrated, the solution was poured into methanol, and the precipitate was collected by filtration to provide a polymer compound represented by the following formula P4 (polymer compound P4) (97 mg) as a red solid. The polystyrene-reduced number average molecular weight of the polymer compound P4 was $6.7 \times 10^3$, and the polystyrene-reduced weight average molecular weight of the polymer compound P4 was $9.5 \times 10^3$. This reaction is as shown in the following reaction formula. In the formula, n represents the number of repeating units.

(Evaluation of Polymer Compound P4: Organic Transistor)

An organic transistor shown in FIG. 9 was fabricated using the polymer compound P4, and its transistor characteristics were measured. Specifically, first, the surface of a heavily doped n-type silicon substrate 31 to be a gate electrode was thermally oxidized to form a 200 nm silicon oxide film 32. This substrate was sufficiently washed, and the substrate surface was then silane-treated with hexamethylenedisilazane (HMDS).

The polymer compound P4 was then dissolved in chloroform to prepare a 3 g/L solution which was filtered through a membrane filter. Using the resulting solution, an about 30 nm thin film containing the polymer compound P4 (organic semiconductor layer 35) was formed on the above surface-treated substrate by spin coating. This thin film was heated at 150° C. for 30 minutes in a nitrogen atmosphere. A source electrode 33 and a drain electrode 34 having a channel length of 50 μm and a channel width of 1.5 mm were fabricated on the resulting thin film by vacuum deposition to provide an organic transistor.

The transistor characteristics of this organic transistor were measured by changing the gate voltage Vg between 20 and −60 V and the source-drain voltage Vsd between 0 and −60 V. As a result, a drain current of 0.01 mA was provided as a transfer characteristic at Vg=−50 V and Vsd=−60 V. The field effect mobility was calculated to be $1.2 \times 10^{-2}$ cm$^2$/Vs from this result.

Comparative Example 1

Synthesis of Polymer Compound P5

4,4'-Didodecyl-5,5'-bis(4,4,5,5-tetramethyl-1,3,5-dioxaborolan-2-yl)-2,2'-bithiophene (341 mg, 0.452 mmol), 2,7-

[Chemical Formula 45]

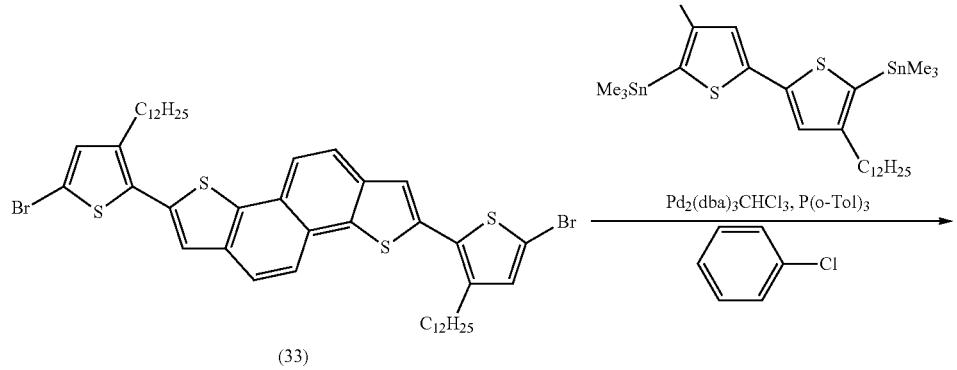

(33)

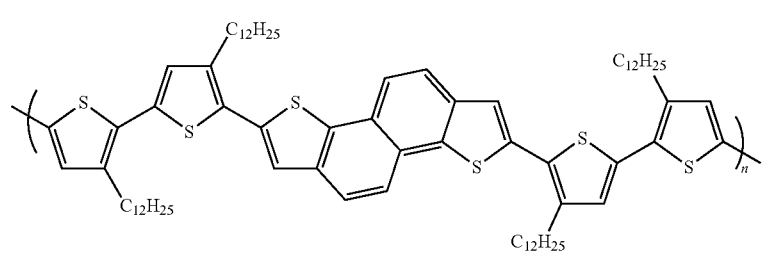

P4 dibromo-4,5-diheptylbenzo[2,1-b:3,4-b']dithiophene (246 mg, 0.452 mmol), tris(dibenzylideneacetone)dipalladium (0) (8.3 mg, 0.009 mmol), tri-tert-butylphosphonium tetrafluoroborate (10.5 mg, 0.036 mmol) and tetrahydrofuran (12 mL) were placed in a flask, and the solution in the flask was heated to 60° C.

An aqueous potassium carbonate solution (2 mol/L, 0.7 mL) was added to this solution which was stirred with refluxing for three hours. Phenylboronic acid (9 mg) and THF (3 mL) were then added, and the mixture was stirred with refluxing for 4.5 hours. Thereafter, sodium N,N-diethyldithiocarbamate trihydrate (0.25 g) and water (6 mL) were added, and the mixture was stirred with refluxing for 12 hours.

Toluene was added to this solution after the reaction, which was sequentially washed with warm water, an aqueous acetic acid solution and warm water. The resulting toluene solution was allowed to pass through a silica gel column and an alumina column. The toluene solution was then concentrated, the solution was poured into methanol, and the precipitate was collected by filtration to provide a polymer compound represented by the following formula P5 (polymer compound P5) (302 mg). In the formula P5, n represents the number of repeating units. The polystyrene-reduced number average molecular weight of the polymer compound P5 was $8.5 \times 10^3$, and the polystyrene-reduced weight average molecular weight of the polymer compound P5 was $4.3 \times 10^4$. In the formula, n represents the number of repeating units.

[Chemical Formula 46]

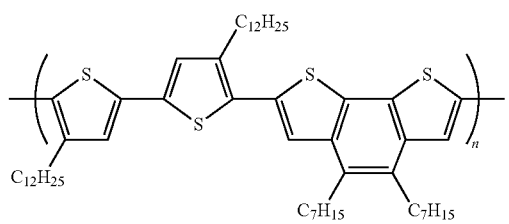

(P5)

(Evaluation of Polymer Compound P5)

An organic transistor shown in FIG. 9 was fabricated using the polymer compound P5, and its transistor characteristics were measured. Specifically, first, the surface of a heavily doped n-type silicon substrate 31 to be a gate electrode was thermally oxidized to form a 200 nm silicon oxide film 32. This substrate was ultrasonically washed with acetone for 10 minutes and then irradiated with ozone UV for 20 minutes. Thereafter, the substrate surface was silane-treated with β-phenyltrichlorosilane (β-PTS) by spin coating.

The polymer compound P5 was then dissolved in a toluene solvent to prepare a solution having a total concentration of 0.5 wt % which was filtered through a membrane filter. The resulting solution was applied onto the above surface-treated substrate by spin coating to form an about 60 nm thin film of the polymer compound P5 (organic semiconductor layer 35). A source electrode 33 and a drain electrode 34 having a channel length of 20 μm and a channel width of 2 mm (electrodes having a structure in which $MoO_3$ and gold were stacked sequentially from the thin film side) were fabricated on the resulting thin film by vacuum deposition using a metal mask to provide an organic transistor.

The transistor characteristics of this organic transistor were measured by changing the gate voltage Vg between 10 and −50 V and the source-drain voltage Vsd between 0 and −50 V. As a result, a drain current of 0.002 pA was provided as a transfer characteristic at Vg=−50 V and Vsd=−50 V. It was confirmed from this result that the field effect mobility was $1.0 \times 10^{-5}$ cm$^2$/Vs which was lower than those of the organic transistors fabricated using the polymer compounds P1 to P4.

Example 5

Synthesis of Polymer Compound P6

The compound (34) obtained in Synthetic Example 3 (119.4 mg, 0.300 mmol), the compound represented by the following formula (35) (compound (35)) (159.4 mg, 0.270 mmol), toluene (10 mL) and methyltrialkylammonium chloride (trade name: Aliquat 336(R), manufactured by Aldrich) (60.6 mg, 0.15 mmol) were added to a four neck flask, and the mixture was bubbled with argon at room temperature (25° C.) for 30 minutes.

The solution thus obtained was warmed to 90° C., followed by addition of palladium acetate (0.67 mg, 1 mol %) and tris(2-methoxyphenyl)phosphine (3.70 mg, 3.5 mol %). Thereafter, an aqueous sodium carbonate solution (16.7 wt %, 1.90 g, 3.00 mmol) was added dropwise with stirring at 100° C. over 30 minutes. After four hours, phenylboric acid (3.66 mg, 0.03 mmol), palladium acetate (0.67 mg, 1 mol %) and tris(2-methoxyphenyl)phosphine (3.70 mg, 3.5 mol %) were added, and the mixture was further stirred for one hour, after which the reaction was stopped. The reaction was performed in an argon atmosphere.

Thereafter, sodium diethyldithiocarbamate (1 g) and pure water (10 mL) were added to the solution after the reaction, and the mixture was stirred with refluxing for one hour. After removing the aqueous layer in the resulting reaction solution, the organic layer was washed twice with 10 ml of water, twice with 10 mL of an aqueous acetic acid solution (3 wt %) and further twice with 10 mL of water and poured into methanol to precipitate a polymer compound.

The resulting polymer compound was filtered and dried, and the polymer compound was then redissolved in toluene (15 mL) and allowed to pass through alumina/silica gel columns. The resulting solution was poured into methanol to precipitate the polymer compound which was filtered and then dried to provide 87 mg of a polymer compound represented by the following formula P6 (polymer compound P6). The polystyrene-reduced number average molecular weight (Mn) of the polymer compound P6 was $5.5 \times 10^3$, and the polystyrene-reduced weight average molecular weight (Mw) of the polymer compound P6 was $1.0 \times 10^4$. This reaction is as shown in the following reaction formula. In the formula, n represents the number of repeating units.

[Chemical Formula 47]

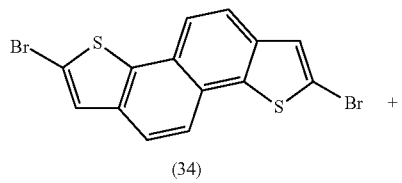

(34)

-continued

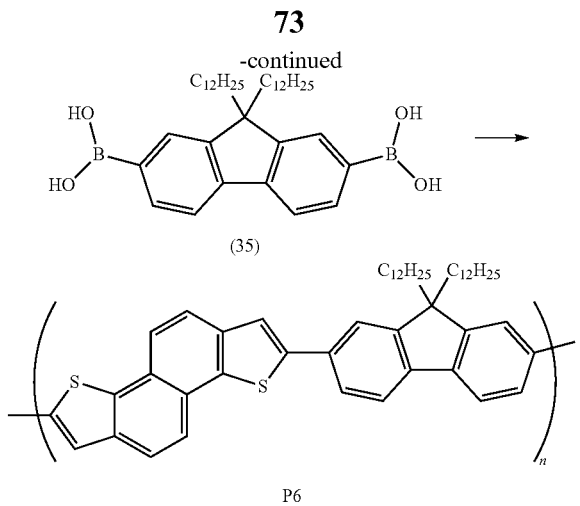

(35)

P6

(Evaluation of Polymer Compound P6: Organic Transistor)

An organic transistor shown in FIG. 9 was fabricated using the polymer compound P6, and its transistor characteristics were measured. Specifically, first, the surface of a heavily doped n-type silicon substrate 31 to be a gate electrode was thermally oxidized to form a 200 nm silicon oxide film 32. This substrate was ultrasonically washed with acetone for 10 minutes and then irradiated with ozone UV for 20 minutes. Thereafter, the substrate surface was silane-treated with β-phenyltrichlorosilane (β-PTS) by spin coating.

The polymer compound P6 was then dissolved in a chloroform solvent to prepare a solution having a total concentration of 0.5 wt % which was filtered through a membrane filter. The resulting solution was applied onto the above surface-treated substrate by spin coating to form an about 60 nm thin film of the polymer compound P6 (organic semiconductor layer 35). A source electrode 33 and a drain electrode 34 having a channel length of 20 μm and a channel width of 2 mm (electrodes having a structure in which $MoO_3$ and gold were stacked sequentially from the thin film side) were fabricated on the resulting thin film by vacuum deposition using a metal mask to provide an organic transistor.

The transistor characteristics of this organic transistor were measured by changing the gate voltage Vg between 10 and −50 V and the source-drain voltage Vsd between 0 and −50 V. As a result, a drain current of 0.54 μA was provided as a transfer characteristic at Vg=−50 V and Vsd=−50 V. The field effect mobility was calculated to be $1.5 \times 10^{-3}$ cm$^2$/Vs from this result.

Comparative Example 2

Synthesis of Polymer Compound P7

The compound represented by the following formula (36) (compound (36)) (97.2 mg, 0.300 mmol), the compound (35) (159.4 mg, 0.270 mmol), toluene (10 mL) and methyltrialkylammonium chloride (trade name: Aliquat 336(R), manufactured by Aldrich) (60.6 mg, 0.15 mmol) were added to a four neck flask, and the mixture was bubbled with argon at room temperature (25° C.) for 30 minutes.

The solution thus obtained was warmed to 90° C., followed by addition of palladium acetate (0.67 mg, 1 mol %) and tris(2-methoxyphenyl)phosphine (3.70 mg, 3.5 mol %). Thereafter, an aqueous sodium carbonate solution (16.7 wt %, 1.90 g, 3.00 mmol) was added dropwise with stirring at 100° C. over 30 minutes. After four hours, phenylboric acid (3.66 mg, 0.03 mmol), palladium acetate (0.67 mg, 1 mol %) and tris(2-methoxyphenyl)phosphine (3.70 mg, 3.5 mol %) were added, and the mixture was further stirred for one hour, after which the reaction was stopped. The reaction was performed in an argon atmosphere.

Thereafter, sodium diethyldithiocarbamate (1 g) and pure water (10 mL) were added to the solution after the reaction, and the mixture was stirred with refluxing for one hour. After removing the aqueous layer in the resulting reaction solution, the organic layer was washed twice with 10 ml of water, twice with 10 mL of an aqueous acetic acid solution (3 wt %) and further twice with 10 mL of water and poured into methanol to precipitate a polymer compound.

The resulting polymer compound was filtered and dried, and the polymer compound was then redissolved in toluene (15 mL) and allowed to pass through alumina/silica gel columns. The resulting solution was poured into methanol to precipitate the polymer compound which was filtered and then dried to provide 69 mg of a polymer compound represented by the following formula P7 (polymer compound P7). The polystyrene-reduced number average molecular weight of the polymer compound P7 was $1.2 \times 10^4$, and the polystyrene-reduced weight average molecular weight of the polymer compound P7 was $2.5 \times 10^4$. This reaction is as shown in the following reaction formula. In the formula, n represents the number of repeating units.

[Chemical Formula 48]

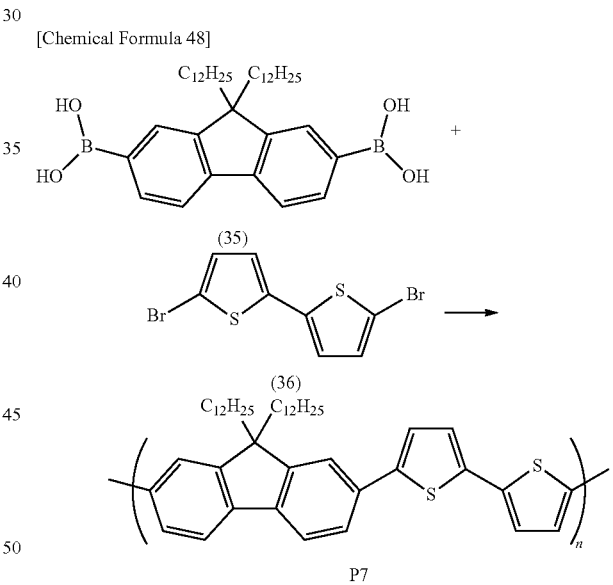

(Evaluation of Polymer Compound P7: Organic Transistor)

An organic transistor was fabricated in the same manner as in Example 5 except for using the polymer compound P7 in place of the polymer compound P6.

The transistor characteristics of this organic transistor were measured by changing the gate voltage Vg between 10 and −50 V and the source-drain voltage Vsd between 0 and −50 V. As a result, the drain current value as a transfer characteristic at Vg=−50 V and Vsd=−50 V was 0.42 μA, which was lower than in Example 5. The field effect mobility was calculated from this result to be $1.3 \times 10^{-3}$ cm$^2$/Vs, which was lower than in Example 5.

Example 6

Synthesis of Polymer Compound P8

Chlorobenzene (20 ml) was degassed for 30 minutes in a nitrogen atmosphere. $Pd_2(dba)_3 \cdot CHCl_3$ (4 mg, 0.004 mmol, 2 mol %), $P(o\text{-tolyl})_3$ (6 mg, 0.016 mmol, 8 mol %), the compound represented by the following formula (37) (compound (37)) (100 mg, 0.12 mmol) and the compound (31) obtained in Synthetic Example 1 (113 mg, 0.2 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol, hexane and chloroform, followed by extraction with chlorobenzene. The chlorobenzene solution was concentrated, the solution was poured into methanol, and the precipitate was collected by filtration to provide a polymer compound represented by the following formula P8 (polymer compound P8) (38 mg) as a blackish brown solid. The polystyrene-reduced number average molecular weight of the polymer compound P8 was $1.7 \times 10^4$, and the polystyrene-reduced weight average molecular weight of the polymer compound P8 was $2.1 \times 10^4$. This reaction is as shown in the following reaction formula. In the formula, n represents the number of repeating units.

The transistor characteristics of this organic transistor were measured by changing the gate voltage Vg between 20 and −60 V and the source-drain voltage Vsd between 0 and −60 V. As a result, a drain current of −0.011 mA was provided as a transfer characteristic at Vg=−60 V and Vsd=−60 V. The field effect mobility was calculated to be $1.8 \times 10^{-2}$ cm$^2$/Vs from this result.

(Evaluation of Polymer Compound P8: Organic Thin Film Solar Cell)

A glass substrate to which an ITO film was adhered with a thickness of 115 nm by sputtering was surface-treated by ozone UV treatment. Next, an o-dichlorobenzene solution containing the polymer compound P8 and a fullerene derivative C60PCBM (manufactured by Frontier Carbon Corporation) (weight ratio of polymer compound P8/C60PCBM=½) was applied by spin coating to fabricate an organic semiconductor layer (thickness: about 100 nm). Thereafter, lithium fluoride was deposited with a thickness of 0.8 nm and Al was then deposited with a thickness of 100 nm by a vacuum deposition system to fabricate an organic thin film solar cell. The shape of this organic thin film solar cell was a circle having a diameter of 2 mm.

The resulting organic thin film solar cell was irradiated with certain light using a solar simulator (manufactured by Asahi Spectra Co., Ltd., trade name: HAL-302; AM 1.5 G

[Chemical Formula 49]

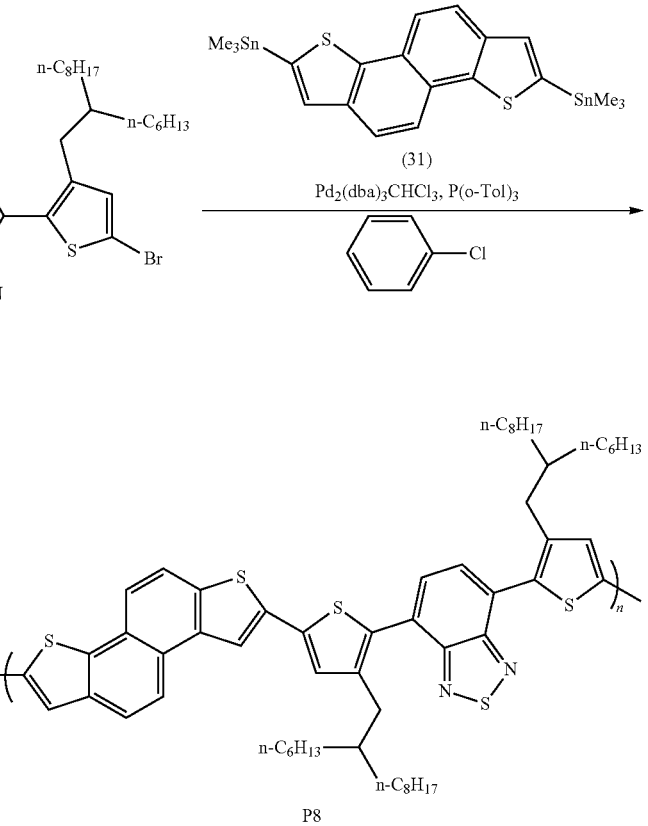

(Evaluation of Polymer Compound P8: Organic Transistor)

An organic transistor was fabricated in the same manner as in Example 5 except for using the polymer compound P8 in place of the polymer compound P6.

filter, irradiance: 100 mW/cm$^2$), and the generated current and voltage were measured to determine the photoelectric conversion efficiency, short-circuit current density (Jsc), open-circuit voltage (Voc) and fill factor (ff). As a result, Jsc (short-circuit current density)=5.36 mA/cm$^2$, Voc (open-circuit voltage)=0.61 V, ff (fill factor)=0.38 and photoelectric conversion efficiency (η)=1.4% were provided.

Example 7

Synthesis of Polymer Compound P9

Chlorobenzene (20 ml) was degassed for 30 minutes in a nitrogen atmosphere. $Pd_2(dba)_3 \cdot CHCl_3$ (4 mg, 0.004 mmol, 2 mol %), $P(o\text{-tolyl})_3$ (5 mg, 0.016 mmol, 8 mol %), 5,5'-dibromo-4,4'-dioctyldecyl-2,2'-bithiophene (166 mg, 0.2 mmol) and the compound (31) obtained in Synthetic Example 1 (114 mg, 0.2 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol and hexane, followed by extraction with heated chloroform. The chloroform solution was concentrated, the solution was poured into methanol, and the precipitate was collected by filtration to provide a polymer compound represented by the following formula P9 (polymer compound P9) (149 mg) as a red solid. The polystyrene-reduced number average molecular weight of the polymer compound P9 was $1.35 \times 10^4$, and the polystyrene-reduced weight average molecular weight of the polymer compound P9 was $2.6 \times 10^4$. This reaction is as shown in the following reaction formula. In the formula, n represents the number of repeating units.

(Evaluation of Polymer Compound P9: Organic Transistor)

An organic transistor was fabricated in the same manner as in Example 5 except for using the polymer compound P9 in place of the polymer compound P6.

The transistor characteristics of this organic transistor were measured by changing the gate voltage Vg between 20 and −60 V and the source-drain voltage Vsd between 0 and −60 V. As a result, a drain current of 0.17 mA was provided as a transfer characteristic at Vg=−60 V and Vsd=−60 V. The field effect mobility was calculated to be $1.2 \times 10^{-1}$ $cm^2/Vs$ from this result.

(Evaluation of Polymer Compound P9: Organic Thin Film Solar cell)

An organic thin film solar cell was fabricated in the same manner as in Example 6 except for using the polymer compound P9/C60PCBM=⅙ (weight ratio) in place of the polymer compound P8/C60PCBM weight ratio=½, and was evaluated to provide the results, Jsc (short-circuit current density)=1.82 $mA/cm^2$, Voc (open-circuit voltage)=0.62 V, ff (fill factor)=0.51 and photocarrier generation efficiency (η)=0.56%.

Comparative Example 3

Synthesis of Polymer Compound P10

The compound represented by the following formula (38) (compound (38)) (642.0 mg, 1.000 mmol), the compound represented by the following formula (39) (compound (39)) (336.4 mg, 0.950 mmol) and tetrahydrofuran (25 mL) were placed in a four neck flask, and the mixture was bubbled with argon at room temperature (25° C.) for 30 minutes. Tris (dibenzylideneacetone)palladium (9.15 mg, 0.01 mmol) and [tri(tert-butyl)phosphonium]tetrafluoroborate (11.60 mg, 0.04 mmol) were then added. A 27.6 wt % aqueous potassium carbonate solution (1.50 g, 3.00 mmol) was added dropwise with stirring at 80° C. over 30 minutes. After 15 minutes, phenylboric acid (36.6 mg, 0.30 mmol) was added and the

[Chemical Formula 50]

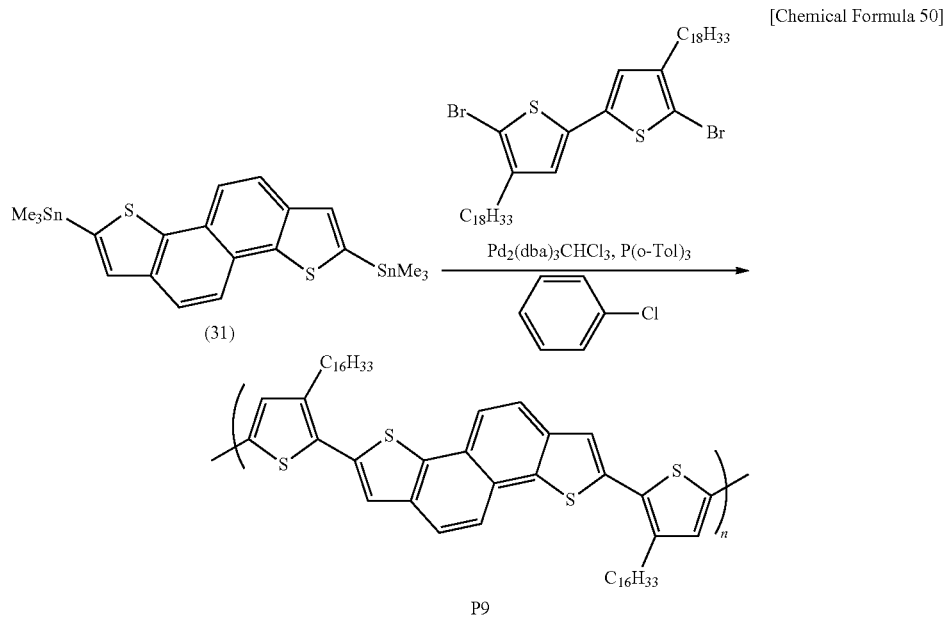

mixture was further stirred for one hour, after which the reaction was stopped. The reaction was performed in an argon atmosphere.

Thereafter, sodium diethyldithiocarbamate (2 g) and pure water (20 mL) were added, and the mixture was stirred with refluxing for one hour. After removing the aqueous layer in the reaction solution, the organic layer was washed twice with 20 ml of water, twice with 20 mL of a 3 wt % aqueous acetic acid solution and further twice with 20 mL of water and poured into methanol to precipitate a polymer. The polymer was filtered and then dried, and the resulting polymer was dissolved in toluene. The toluene solution was allowed to pass through alumina/silica gel columns, and the resulting solution was poured into methanol to precipitate the polymer. This polymer was filtered and then dried to provide 460 mg of a polymer compound represented by the following formula P10 (polymer compound P10). The polystyrene-reduced number average molecular weight of the polymer compound P10 measured by GPC was $1.2 \times 10^4$, and the polystyrene-reduced weight average molecular weight of the polymer compound P10 measured by GPC was $3.2 \times 10^4$. This reaction is as shown in the following reaction formula. In the formula, n represents the number of repeating units.

[Chemical Formula 51]

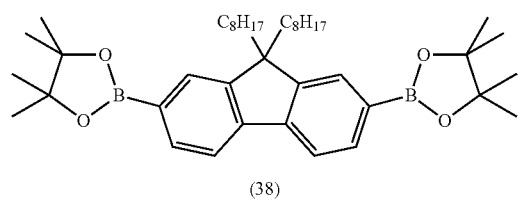

(38)

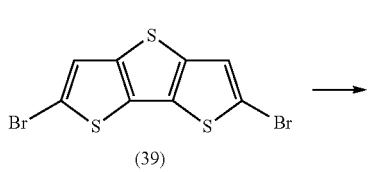

(39)

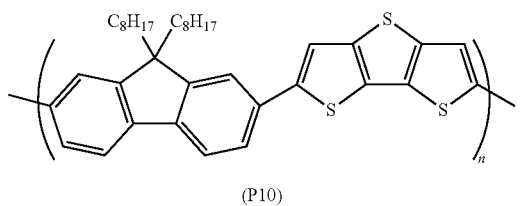

(P10)

(Evaluation of Polymer Compound P10: Organic Transistor)

An organic transistor was fabricated in the same manner as in Example 5 except for using the polymer compound P10 in place of the polymer compound P6.

The transistor characteristics of this organic transistor were measured by changing the gate voltage Vg between 10 and −60 V and the source-drain voltage Vsd between 0 and −60 V. As a result, the drain current value as a transfer characteristic at Vg=−50 V and Vsd=−60 V was 0.54 µA, which was lower than in Example 6. The field effect mobility was calculated to be $2.0 \times 10^{-4}$ cm²/Vs from this result.

(Evaluation of Polymer Compound P10: Organic Thin Film Solar Cell)

An organic thin film solar cell was fabricated in the same manner as in Example 6 except for using the polymer compound P10/C60PCBM=1/3 (weight ratio) in place of the polymer compound P8/C60PCBM weight ratio=½, and was evaluated. As a result, it was confirmed that the characteristics, Jsc (short-circuit current density)=1.62 mA/cm², Voc (open-circuit voltage)=0.04 V, ff (fill factor)=0.25 and photoelectric conversion efficiency (η)=0.02%, were inferior to those in Examples 6 and 7.

Example 8

Synthesis of Polymer Compound P11

Chlorobenzene (20 ml) was degassed for 30 minutes in a nitrogen atmosphere. Pd₂(dba)₃.CHCl₃ (3.7 mg, 0.0036 mmol, 2 mol %), P(o-tolyl)₃ (4.4 mg, 0.0144 mmol, 8 mol %), compound (40) (102 mg, 0.18 mmol) and the compound (31) obtained in Synthetic Example 1 (102 mg, 0.18 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol and hexane, followed by extraction with chloroform. The chloroform solution was concentrated, the solution was poured into methanol, and the precipitate was collected by filtration to provide a polymer compound represented by the following formula P11 (polymer compound P11) (199 mg) as a blackish brown solid. The polystyrene-reduced number average molecular weight of the polymer compound P11 was $1.6 \times 10^4$, and the polystyrene-reduced weight average molecular weight of the polymer compound P11 was $2.6 \times 10^4$. This reaction is as shown in the following reaction formula. In the formula, n represents the number of repeating units.

[Chemical Formula 52]

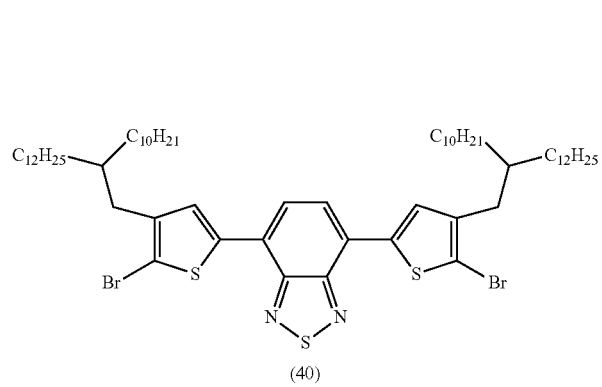

(40)

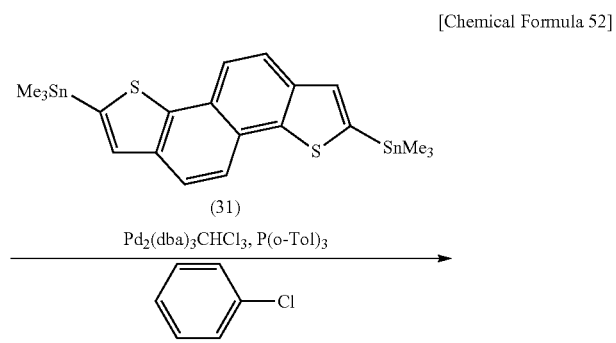

(31)

Pd₂(dba)₃CHCl₃, P(o-Tol)₃

-continued

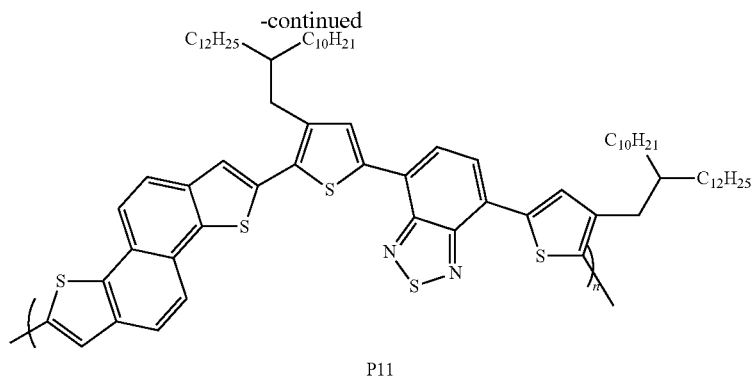

P11

(Evaluation of Polymer Compound P11: Organic Transistor)

An organic transistor was fabricated in the same manner as in Example 5 except for using the polymer compound P11 in place of the polymer compound P6.

The transistor characteristics of this organic transistor were measured by changing the gate voltage Vg between 20 and −60 V and the source-drain voltage Vsd between 0 and −60 V. As a result, a drain current of −0.018 mA was provided as a transfer characteristic at Vg=−50 V and Vsd=−60 V. The field effect mobility was calculated to be $1.9 \times 10^{-2}$ cm$^2$/Vs from this result.

(Evaluation of Polymer Compound P11: Organic Thin Film Solar Cell)

An organic thin film solar cell was fabricated in the same manner as in Example 6 except for using the polymer compound P11/C60PCBM=1/0.8 (weight ratio) in place of the polymer compound P8/C60PCBM weight ratio=½, and was evaluated. As a result, Jsc (short-circuit current density)=8.01 mA/cm$^2$, Voc (open-circuit voltage)=0.75 V, ff (fill factor)=0.63 and photoelectric conversion efficiency (η)=3.74%.

Example 9

Synthesis of Polymer Compound P12

Chlorobenzene (20 ml) was degassed for 30 minutes in a nitrogen atmosphere. Pd$_2$(dba)$_3$.CHCl$_3$ (4 mg, 0.004 mmol, 2 mol %), P(o-tolyl)$_3$ (5 mg, 0.016 mmol, 8 mol %), the compound represented by the following formula (41) (compound (41)) (226 mg, 0.2 mmol), and the compound (31) obtained in Synthetic Example 1 (113 mg, 0.2 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol and hexane, followed by extraction with chloroform. The chloroform solution was concentrated, the solution was poured into methanol, and the precipitate was collected by filtration to provide a polymer compound represented by the following formula P12 (polymer compound P12) (230 mg) as a black solid. The polystyrene-reduced number average molecular weight of the polymer compound P12 was $1.9 \times 10^4$, and the polystyrene-reduced weight average molecular weight of the polymer compound P12 was $5.0 \times 10^4$. This reaction is as shown in the following reaction formula. In the formula, n represents the number of repeating units.

[Chemical Formula 53]

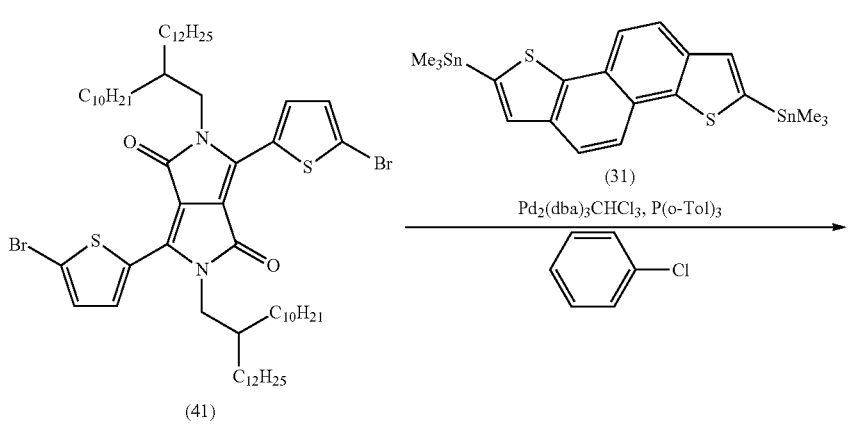

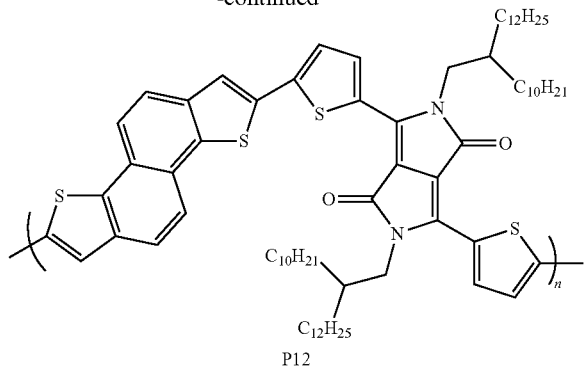

P12

(Evaluation of Polymer Compound P12: Organic Transistor)

An organic transistor was fabricated in the same manner as in Example 5 except for using the polymer compound P12 in place of the polymer compound P6.

The transistor characteristics of this organic transistor were measured by changing the gate voltage Vg between 20 and −60 V and the source-drain voltage Vsd between 0 and −60 V. As a result, a drain current of 0.022 mA was provided as a transfer characteristic at Vg=−50 V and Vsd=−60 V. The field effect mobility was calculated to be $5.0 \times 10^{-2}$ cm²/Vs from this result.

(Evaluation of Polymer Compound P12: Organic Thin Film Solar Cell)

An organic thin film solar cell was fabricated in the same manner as in Example 6 except for using the polymer compound P12/C60PCBM=1/1 (weight ratio) in place of the polymer compound P8/C60PCBM weight ratio=½, and was evaluated. As a result, Jsc (short-circuit current density)=4.08 mA/cm², Voc (open-circuit voltage)=0.72 V, ff (fill factor)=0.48 and photoelectric conversion efficiency (η)=1.30%.

Example 10

Synthesis of Polymer Compound P13

Chlorobenzene (20 ml) was degassed for 30 minutes in a nitrogen atmosphere. $Pd_2(dba)_3 \cdot CHCl_3$ (4.1 mg, 0.0038 mmol, 2 mol %), $P(o\text{-tolyl})_3$ (4.8 mg, 0.0152 mmol, 8 mol %), 5,5'-dibromo-4,4'-diicosyl-2,2'-bithiophene (170 mg, 0.19 mmol), and the compound (31) obtained in Synthetic Example 1 (109 mg, 0.19 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol, hexane and chloroform, followed by extraction with chlorobenzene. The chlorobenzene solution was concentrated, the solution was poured into methanol, and the precipitate was collected by filtration to provide a polymer compound represented by the following formula P13 (polymer compound P13) (150 mg) as a blackish brown solid. The polystyrene-reduced number average molecular weight of the polymer compound P13 was $3.3 \times 10^4$, and the polystyrene-reduced weight average molecular weight of the polymer compound P13 was $7.3 \times 10^4$. This reaction is as shown in the following reaction formula. In the formula, n represents the number of repeating units.

[Chemical Formula 54]

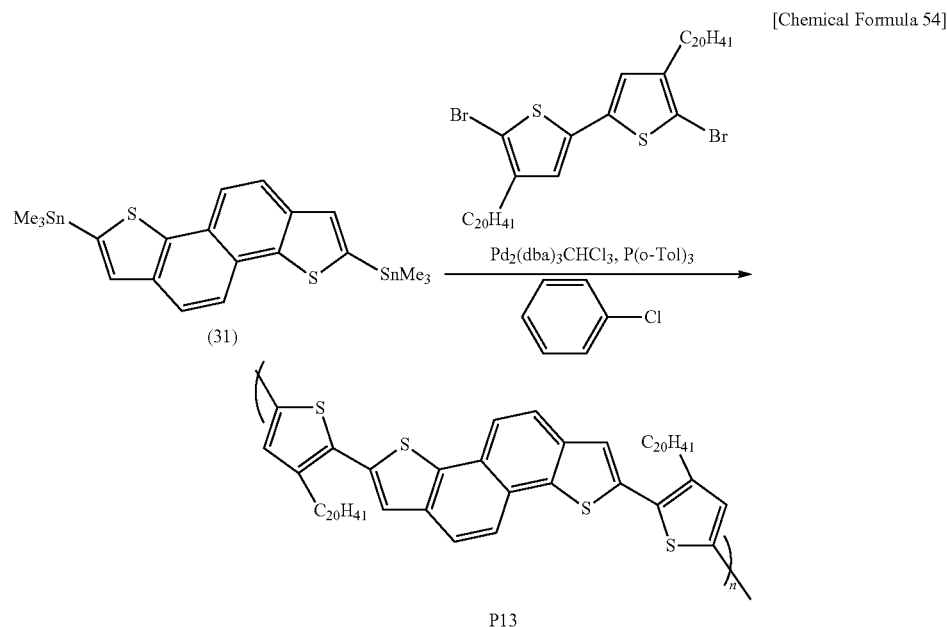

(Evaluation of Polymer Compound P13: Organic Transistor)

An organic transistor was fabricated in the same manner as in Example 5 except for using the polymer compound P13 in place of the polymer compound P6.

The transistor characteristics of this organic transistor were measured by changing the gate voltage Vg between 40 and −80 V and the source-drain voltage Vsd between 0 and −80 V. As a result, a drain current of 0.24 mA was provided as a transfer characteristic at Vg=−80 V and Vsd=−80 V. The field effect mobility was calculated to be $3.2 \times 10^{-1}$ cm$^2$/Vs from this result.

[Synthesis of Intermediate Compounds]

Synthetic Example 4

A compound represented by the following formula (42) (compound (42)) was synthesized in the same manner as in Synthetic Example 1 except for using naphtho[2,1-b:6,5-b'] dithiophene in place of naphtho[1,2-b:5,6-b']dithiophene.

[Chemical Formula 55]

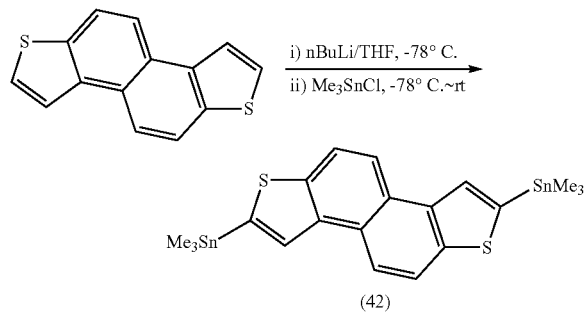

Example 11

Synthesis of Polymer Compound P14

Chlorobenzene (20 ml) was added and degassed for 30 minutes in a nitrogen atmosphere. Pd$_2$(dba)$_3$.CHCl$_3$ (4.1 mg, 0.0038 mmol, 2 mol %), P(o-tolyl)$_3$ (4.8 mg, 0.0152 mmol, 8 mol %), 5,5'-dibromo-4,4'-dihexadecyl-2,2'-bithiophene (149 mg, 0.2 mmol) and the compound (42) obtained in Synthetic Example 4 (114 mg, 0.2 mmol) were added, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol, hexane and chloroform, followed by extraction with chlorobenzene. The chlorobenzene solution was concentrated, the solution was poured into methanol, and the precipitate was collected by filtration to provide a polymer compound represented by the following formula P14 (polymer compound P14) (90 mg) as a blackish brown solid. The polystyrene-reduced number average molecular weight of the polymer compound P14 was $3.0 \times 10^4$, and the polystyrene-reduced weight average molecular weight of the polymer compound P14 was $6.3 \times 10^4$. This reaction is as shown in the following reaction formula. In the formula, n represents the number of repeating units.

[Chemical Formula 56]

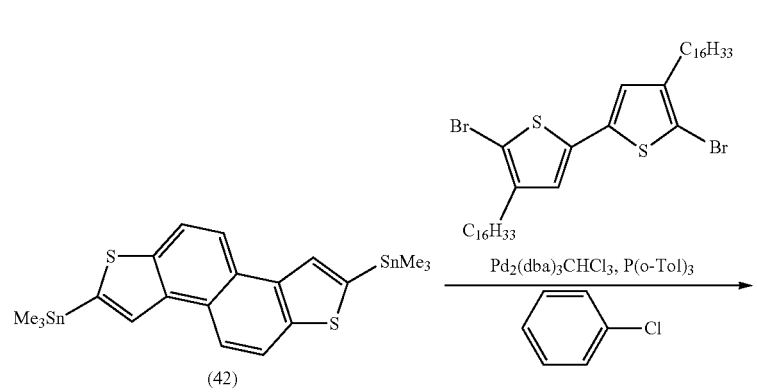

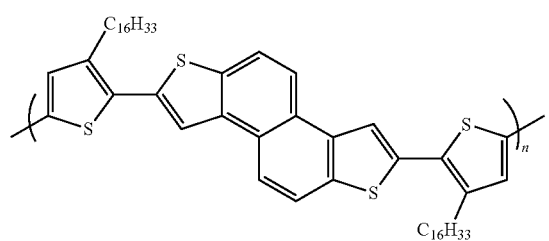

(Evaluation of Polymer Compound P14: Organic Transistor)

An organic transistor was fabricated in the same manner as in Example 5 except for using the polymer compound P14 in place of the polymer compound P6.

The transistor characteristics of this organic transistor were measured by changing the gate voltage Vg between 20 and −60 V and the source-drain voltage Vsd between 0 and −60 V. As a result, a drain current of 0.03 mA was provided as a transfer characteristic at Vg=−60 V and Vsd=−60 V. The field effect mobility was calculated to be $9.0 \times 10^{-2}$ cm$^2$/Vs from this result.

Example 12

Synthesis of Polymer Compound P15

Chlorobenzene (20 ml) was degassed for 30 minutes in a nitrogen atmosphere. Pd$_2$(dba)$_3$.CHCl$_3$ (4.1 mg, 0.004 mmol, 2 mol %), P(o-tolyl)$_3$ (4.8 mg, 0.016 mmol, 8 mol %), 5,5'-dibromo-4,4'-diicosyl-2,2'-bithiophene (177 mg, 0.2 mmol), and the compound (42) obtained in Synthetic Example 4 (114 mg, 0.2 mmol) were added to the chlorobenzene, and the mixture was stirred with refluxing for three days. The reaction solution was poured into a mixed solution of methanol (200 ml) and hydrochloric acid (5 ml) and stirred for three hours. The precipitate was collected by filtration and heated and washed with methanol, hexane and chloroform, followed by extraction with chlorobenzene. The chlorobenzene solution was concentrated, the solution was poured into methanol, and the precipitate was collected by filtration to provide a polymer compound represented by the following formula P15 (polymer compound P15) (102 mg) as a blackish brown solid. The polystyrene-reduced number average molecular weight of the polymer compound P15 was $2.6 \times 10^4$, and the polystyrene-reduced weight average molecular weight of the polymer compound P15 was $10.5 \times 10^4$. This reaction is as shown in the following reaction formula. In the formula, n represents the number of repeating units.

(Evaluation of Polymer Compound P15: Organic Transistor)

An organic transistor was fabricated in the same manner as in Example 5 except for using the polymer compound P15 in place of the polymer compound P6.

The transistor characteristics of this organic transistor were measured by changing the gate voltage Vg between 20 and −60 V and the source-drain voltage Vsd between 0 and −60 V. As a result, a drain current of 0.08 mA was provided as a transfer characteristic at Vg=−60 V and Vsd=−60 V. The field effect mobility was calculated to be $1.5 \times 10^{-1}$ cm$^2$/Vs from this result.

REFERENCE SIGNS LIST

1 . . . Substrate, 2 . . . Organic semiconductor layer, 2a . . . Organic semiconductor layer, 3 . . . Insulating layer, 4 . . . Gate electrode, 5 . . . Source electrode, 6 . . . Drain electrode, 7a . . . Anode, 7b . . . Cathode, 11 . . . Protective film, 12 . . . Interlayer insulating film, 13 . . . Lower electrode (anode), 14 . . . Light-emitting device, 15 . . . Upper electrode (cathode), 16 . . . Bank, 17 . . . Sealing member, 18 . . . Substrate, 31 . . . n-type silicon substrate, 32 . . . Silicon oxide film, 33 . . . Source electrode, 34 . . . Drain electrode, 35 . . . Organic semiconductor layer, 100 . . . Organic transistor according to a first embodiment, 110 . . . Organic transistor according to a second embodiment, 120 . . . Organic transistor according to a third embodiment, 130 . . . Organic transistor according to a fourth embodiment, 140 . . . Organic transistor according to a fifth embodiment, 150 . . . Organic transistor according to a sixth embodiment, 160 . . . Organic transistor according to a seventh embodiment, 200 . . . Planar light source according to an embodiment, 300 . . . Photoelectric conversion device.

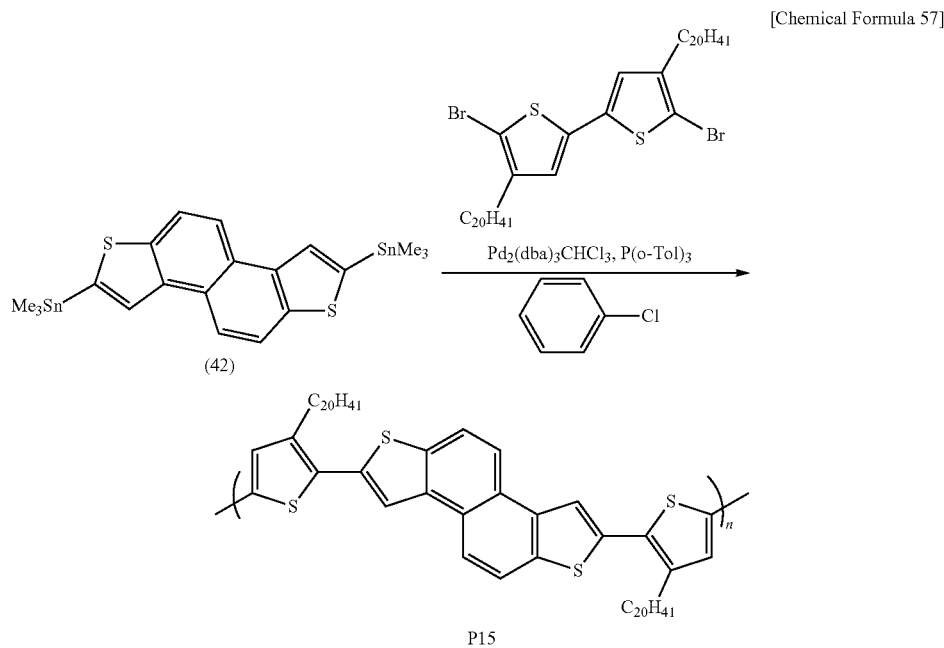

[Chemical Formula 57]

The invention claimed is:

1. A polymer compound having a repeating unit represented by the formula (1):

[Chemical Formula 1]

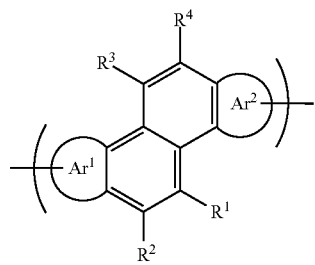

(1)

wherein $Ar^1$ and $Ar^2$ are identical or different and are each an aromatic hydrocarbon ring which may have a substituent, a heterocycle which may have a substituent, or a fused ring of an aromatic hydrocarbon ring which may have a substituent and a heterocycle which may have a substituent; and $R^1$, $R^2$, $R^3$ and $R^4$ are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

2. The polymer compound according to claim 1, wherein at least one of the $Ar^1$ and the $Ar^2$ is a five-membered heterocycle.

3. The polymer compound according to claim 1, wherein the repeating unit represented by the formula (1) is at least one repeating unit selected from the group represented by a repeating unit represented by the formula (2), a repeating unit represented by the formula (3) and a repeating unit represented by the formula (4):

[Chemical Formula 2]

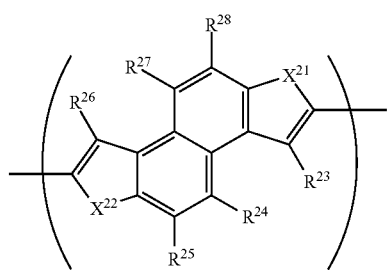

(2)

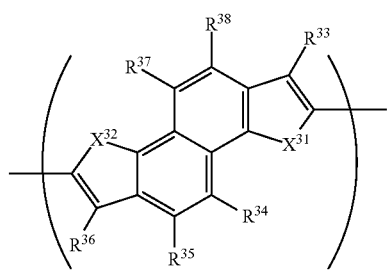

(3)

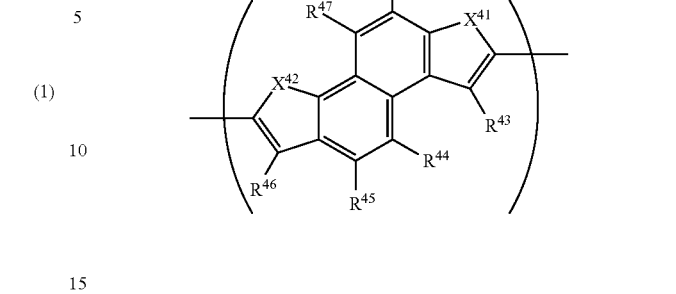

(4)

wherein $X^{21}$ and $X^{22}$ in the formula (2), $X^{31}$ and $X^{32}$ in the formula (3) and $X^{41}$ and $X^{42}$ in the formula (4) are identical or different and each represent a chalcogen atom; and $R^{23}$, $R^{24}$, $R^{25}$, $R^{26}$, $R^{27}$ and $R^{28}$ in the formula (2), $R^{33}$, $R^{34}$, $R^{35}$, $R^{36}$, $R^{37}$ and $R^{38}$ in the formula (3) and $R^{43}$, $R^{44}$, $R^{45}$, $R^{46}$, $R^{47}$ and $R^{48}$ in the formula (4) are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

4. The polymer compound according to claim 3, wherein the $X^{21}$ and the $X^{22}$ in the formula (2), the $X^{31}$ and the $X^{32}$ in the formula (3) and the $X^{41}$ and the $X^{42}$ in the formula (4) are each a sulfur atom, a selenium atom or an oxygen atom.

5. The polymer compound according to claim 1, further having a repeating unit represented by the formula (5):

[Chemical Formula 3]

(5)

wherein Y represents an arylene group, a divalent heterocyclic group, a divalent group having a metal complex structure, or an ethynylene group, each of which may have a substituent.

6. The polymer compound according to claim 5, wherein the Y is a five-membered divalent heterocyclic group having 4 to 12 carbon atoms, an aromatic hydrocarbon group having 6 to 18 carbon atoms, or a polycyclic divalent heterocyclic group.

7. The polymer compound according to claim 5, wherein the Y is a group represented by the formula (6):

[Chemical Formula 4]

(6)

wherein T represents a divalent heterocyclic group which may have a substituent, n represents an integer of 2 to 8, and a plurality of Ts present may be identical or different.

8. The polymer compound according to claim 5, wherein the Y is a group represented by the formula (7):

[Chemical Formula 5]

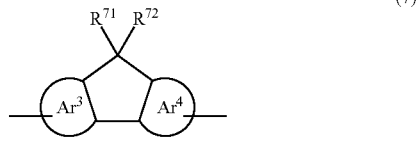

(7)

wherein $Ar^a$ and $Ar^4$ are identical or different and are each an aromatic hydrocarbon ring which may have a substituent, a heterocycle which may have a substituent, or a fused ring of an aromatic hydrocarbon ring which may have a substituent and a heterocycle which may have a substituent; and $R^{71}$ and $R^{72}$ are identical or different and each represent a hydrogen atom, an alkyl group, an alkoxy group, an alkylthio group, an aryl group, an aryloxy group, an arylthio group, an arylalkyl group, an arylalkoxy group, an arylalkylthio group, a substituted silyl group, an unsubstituted or substituted carboxyl group, a monovalent heterocyclic group which may have a substituent, a cyano group or a fluorine atom.

9. The polymer compound according to claim 5, wherein the repeating unit represented by the formula (5) contains at least one aromatic group having electron accepting properties.

10. The polymer compound according to claim 9, wherein a difference between a highest occupied molecular orbital energy level value that the repeating unit represented by the formula (1) has and a lowest unoccupied molecular orbital energy level value that the aromatic group having electron accepting properties has is 4.4 eV or less.

11. A thin film comprising:
the polymer compound according to claim 1.

12. An ink composition comprising:
the polymer compound according to claim 1; and
a solvent.

13. An organic transistor comprising:
an organic semiconductor layer composed of the thin film according to claim 11.

14. A planar light source comprising:
the organic transistor according to claim 13.

15. A display comprising:
the organic transistor according to claim 13.

16. A photoelectric conversion device comprising:
an anode;
a cathode; and
an organic semiconductor layer provided between the anode and the cathode, the organic semiconductor layer including an electron donating compound and an electron accepting compound, at least one of the electron donating compound and the electron accepting compound being the polymer compound according to claim 1.

17. A solar cell module comprising:
the photoelectric conversion device according to claim 16.

18. An image sensor comprising:
the photoelectric conversion device according to claim 16.

* * * * *